US012628487B2

(12) United States Patent
Akimoto

(10) Patent No.: US 12,628,487 B2
(45) Date of Patent: May 12, 2026

(54) IMAGE DISPLAY DEVICE AND METHOD FOR MANUFACTURING IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 448 days.

(21) Appl. No.: 18/461,019

(22) Filed: Sep. 5, 2023

(65) Prior Publication Data

US 2023/0411441 A1 Dec. 21, 2023

Related U.S. Application Data

(63) Continuation of application No. PCT/JP2022/010029, filed on Mar. 8, 2022.

(30) Foreign Application Priority Data

Mar. 17, 2021 (JP) ................................. 2021-043513

(51) Int. Cl.
*H10H 29/14* (2025.01)
*H01L 23/522* (2006.01)

(52) U.S. Cl.
CPC ....... *H10H 29/142* (2025.01); *H01L 23/5226* (2013.01)

(58) Field of Classification Search
CPC .......................... H10H 29/142; H01L 23/5226
(Continued)

(56) References Cited

U.S. PATENT DOCUMENTS 5,838,707 A 11/1998 Ramdani et al.
8,436,358 B2 * 5/2013 Toyota ............... H10D 30/0316
257/E29.294
(Continued)

FOREIGN PATENT DOCUMENTS

JP H10-215026 A 8/1998
JP 2001-035805 A 2/2001
(Continued)

OTHER PUBLICATIONS

International Search Report with English language translation and Written Opinion of the International Searching Authority issued in the corresponding International Patent Application No. PCT/JP2022/010029, dated May 10, 2022.
(Continued)

*Primary Examiner* — Tu-Tu V Ho
(74) *Attorney, Agent, or Firm* — Foley & Lardner LLP

(57) ABSTRACT

A method for manufacturing an image display device includes: preparing a substrate comprising a circuit and a first insulating film covering the circuit; forming a conductive layer on the first insulating film, the conductive layer comprising a single-crystal metal; forming a semiconductor layer on the conductive layer, the semiconductor layer comprising a light-emitting layer; forming a light-emitting element including a bottom surface on the conductive layer, and a light-emitting surface at a side opposite to the bottom surface; forming a second insulating film covering the conductive layer, light-emitting element, and first insulating film; forming a first via extending through the first and second insulating films; and forming a wiring layer on the second insulating film. The first via is located between the wiring layer and the circuit and electrically connects the wiring layer and the circuit. The light-emitting element is electrically connected to the circuit via the wiring layer.

24 Claims, 34 Drawing Sheets

(58) Field of Classification Search
USPC ........................................................ 257/76
See application file for complete search history.

(56) References Cited

U.S. PATENT DOCUMENTS

| | | |
|---|---|---|
| 2003/0039866 A1 | 2/2003 | Mitamura |
| 2011/0254135 A1 | 10/2011 | Toba et al. |
| 2011/0290378 A1 | 12/2011 | Okayama et al. |
| 2012/0222732 A1 | 9/2012 | Choi |
| 2018/0175268 A1 | 6/2018 | Moon et al. |
| 2018/0294311 A1 | 10/2018 | Hsiang et al. |
| 2019/0131343 A1 | 5/2019 | Templier et al. |
| 2019/0267357 A1 | 8/2019 | Iguchi et al. |
| 2019/0273179 A1 | 9/2019 | Iguchi et al. |
| 2019/0355766 A1 | 11/2019 | Zhang et al. |
| 2020/0258866 A1 | 8/2020 | Wang |
| 2020/0303471 A1 | 9/2020 | Akimoto |
| 2020/0328079 A1 | 10/2020 | Zhao et al. |
| 2022/0059518 A1 | 2/2022 | Akimoto |
| 2022/0069187 A1 | 3/2022 | Akimoto |
| 2022/0069188 A1 | 3/2022 | Akimoto |
| 2022/0149113 A1 | 5/2022 | Akimoto |
| 2022/0149228 A1 | 5/2022 | Akimoto |

FOREIGN PATENT DOCUMENTS

| | | |
|---|---|---|
| JP | 2002-141492 A1 | 5/2002 |
| JP | 2008-021745 A | 1/2008 |
| JP | 2008-078274 A | 4/2008 |
| JP | 2010-171420 A | 8/2010 |
| JP | 2014-135433 A | 7/2014 |
| JP | 2015-015321 A | 1/2015 |
| JP | 2018-101785 A | 6/2018 |
| JP | 2019-522894 A | 8/2019 |
| JP | 2019-152851 A | 9/2019 |
| JP | 2019-153783 A | 9/2019 |
| JP | 2020-507107 A | 3/2020 |
| WO | WO-2006/111804 A1 | 10/2006 |
| WO | WO-2010/055613 A1 | 5/2010 |
| WO | WO-2019/168187 A1 | 9/2019 |
| WO | WO-2020/196271 A1 | 10/2020 |
| WO | WO-2020/226044 A1 | 11/2020 |
| WO | WO-2020/230667 A1 | 11/2020 |
| WO | WO-2020/230668 A1 | 11/2020 |
| WO | WO-2021/014972 A1 | 1/2021 |
| WO | WO-2021/020393 A1 | 2/2021 |

OTHER PUBLICATIONS

Kim et al., "Fabrication of full-color GaN-based light-emitting diodes on nearly lattice-matched flexible metal foils", Scientific Report, 7:2112, May 18, 2017.

Shon et al., "Fabrication of full-color InGaN-based light-emitting diodes on amorphous substrates by pulsed sputtering", Scientific Reports, 4:5325, Jun. 23, 2014.

* cited by examiner

IMAGE DISPLAY DEVICE AND METHOD FOR MANUFACTURING IMAGE DISPLAY DEVICE

CROSS-REFERENCE TO RELATED APPLICATIONS

The present application is a bypass continuation of PCT Application No. PCT/JP2022/010029, filed Mar. 8, 2022, which claims priority to Japanese Application No. 2021-043513, filed Mar. 17, 2021. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full high definition, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (e.g., see Japanese Patent Publication No. 2002-141492).

SUMMARY

An embodiment of the invention provides a method for manufacturing an image display device in which a transfer process of a light-emitting element is shortened, and the yield is increased.

A method for manufacturing an image display device according to an embodiment of the invention includes a process of preparing a substrate that includes a circuit and a first insulating film covering the circuit, a process of forming a conductive layer including a single-crystal metal on the first insulating film, a process of forming a semiconductor layer including a light-emitting layer on the conductive layer, a process of forming a light-emitting element by etching the semiconductor layer so that the light-emitting element includes a bottom surface on the conductive layer and includes a light-emitting surface that is a surface at a side opposite to the bottom surface, a process of forming a second insulating film covering the conductive layer, the light-emitting element, and the first insulating film, a process of forming a first via extending through the first and second insulating films, and a process of forming a wiring layer on the second insulating film. The first via is located between the wiring layer and the circuit and electrically connects the wiring layer and the circuit. The light-emitting element is electrically connected to the circuit via the wiring layer.

An image display device according to an embodiment of the invention includes a circuit element, a first wiring layer electrically connected to the circuit element, a first insulating film covering the circuit element and the first wiring layer, a conductive layer that is located on the first insulating film and includes a single-crystal metal, a light-emitting element that is located on the conductive layer, is electrically connected to the conductive layer, includes a bottom surface on the conductive layer, and includes a light-emitting surface that is a surface at a side opposite to the bottom surface, a second insulating film covering the conductive layer, the first insulating film, and a side surface of the light-emitting element, a second wiring layer located on the second insulating film, and a first via provided to extend through the first and second insulating films. The first via is located between the first wiring layer and the second wiring layer and electrically connects the first wiring layer and the second wiring layer. The light-emitting element is electrically connected to the circuit element via the first and second wiring layers.

An image display device according to an embodiment of the invention includes multiple transistors, a first wiring layer electrically connected to the multiple transistors, a first insulating film covering the multiple transistors and the first wiring layer, a conductive layer that is located on the first insulating film and includes a single-crystal metal, a semiconductor layer that is located on the conductive layer, is electrically connected to the conductive layer, includes a bottom surface on the conductive layer, and includes multiple light-emitting surfaces that are surfaces at a side opposite to the bottom surface, a second insulating film covering the first insulating film, the conductive layer, and a side surface of the semiconductor layer, a second wiring layer located on the second insulating film, and a via provided to extend through the first and second insulating films. The via is located between the first wiring layer and the second wiring layer and electrically connects the first wiring layer and the second wiring layer. The semiconductor layer is electrically connected to the multiple transistors via the first and second wiring layers.

An image display device according to an embodiment of the invention includes multiple circuit elements, a first wiring layer electrically connected to the multiple circuit elements, a first insulating film covering the multiple circuit elements and the first wiring layer, a conductive layer that is located on the first insulating film and includes a single-crystal metal, multiple light-emitting elements that are located on the conductive layer, are electrically connected to the conductive layer wherein each of the multiple light-emitting elements includes a bottom surface on the conductive layer and a light-emitting surface that is a surface at a side opposite to the bottom surface, a second insulating film covering the conductive layer, the first insulating film, and side surfaces of the multiple light-emitting elements, a second wiring layer located on the second insulating film, and a first via provided to extend through the first and second insulating films. The first via is located between the first wiring layer and the second wiring layer and electrically connects the first wiring layer and the second wiring layer. The multiple light-emitting elements are electrically connected respectively to the multiple circuit elements via the first and second wiring layers.

According to certain embodiments of the invention, a method for manufacturing an image display device is realized in which a transfer process of a light-emitting element is shortened, and the yield is increased.

According to certain embodiments of the invention, an image display device with higher definition is realized in which it is easier to reduce the size of the light-emitting element.

DETAILED DESCRIPTION

Figure 1:
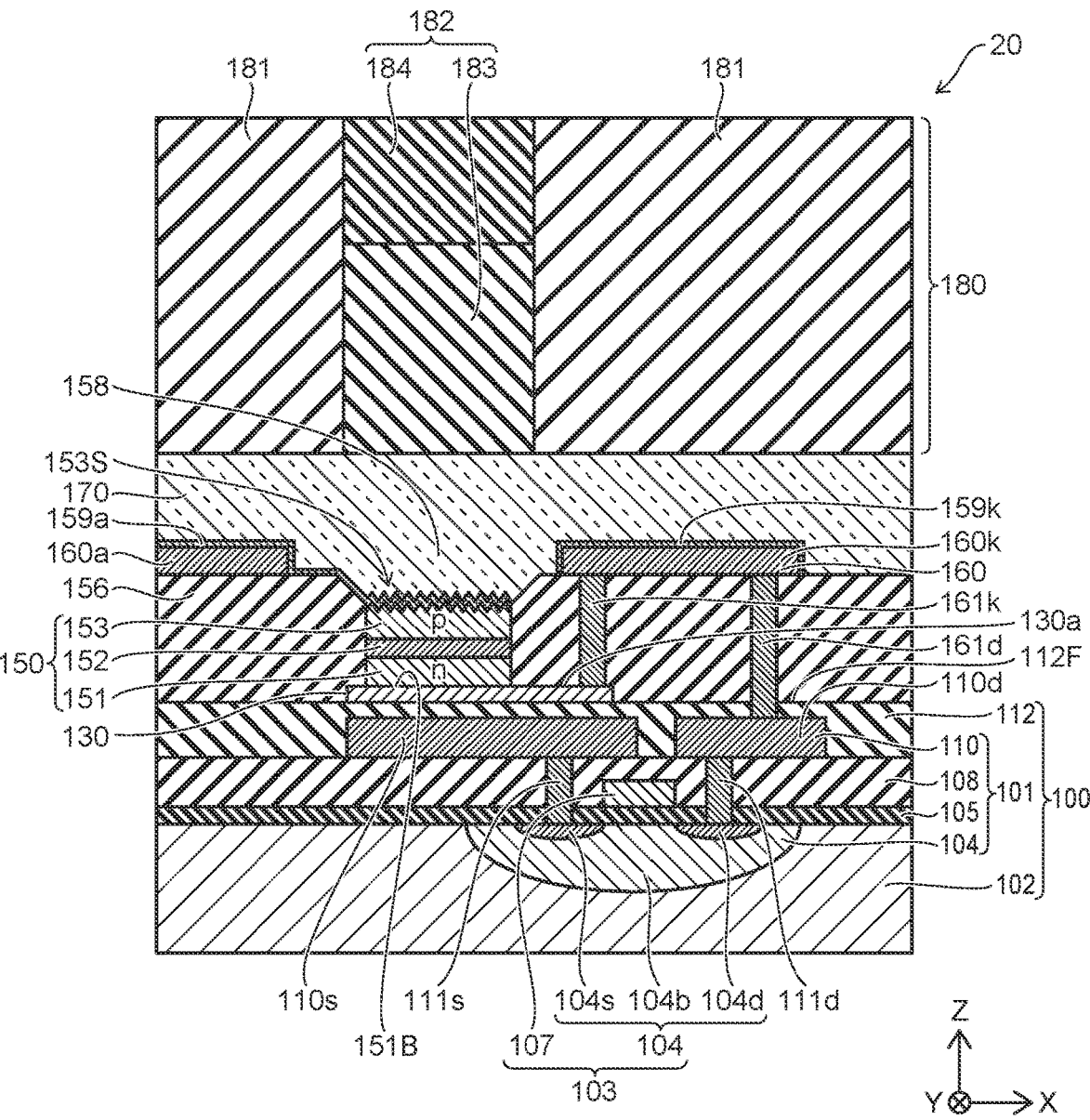
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to the embodiment.

FIG. 1 schematically shows the configuration of a subpixel 20 of the image display device of the embodiment. A pixel that is included in an image displayed in the image display device includes multiple subpixels 20.

A right-handed XYZ three-dimensional coordinate system may be used in the following description. The subpixels 20 are arranged in a two-dimensional planar configuration. The two-dimensional plane in which the subpixel 20 are arranged is taken as an XY plane. The subpixels 20 are arranged along an X-axis direction and a Y-axis direction. FIG. 1 is an auxiliary cross section along line A-A' of FIG. 5 below. Although the positive direction of the Z-axis may be called "up" or "above" and the negative direction of the Z-axis may be called "down" or "below" for convenience, directions along the Z-axis are not necessarily directions in which gravity acts. A length in a direction along the Z-axis may be called a height.

The subpixel 20 includes a light-emitting surface 153S that is substantially parallel to the XY plane. The light-emitting surface 153S is a surface that radiates light mainly toward the positive direction of the Z-axis orthogonal to the XY plane.

As shown in FIG. 1, the subpixel 20 of the image display device includes a transistor 103, a first wiring layer 110, a first inter-layer insulating film (a first insulating film) 112, a conductive layer 130, a light-emitting element 150, a second inter-layer insulating film (a second insulating film) 156, a second wiring layer 160, and a via (a first via) 161$d$.

The subpixel 20 further includes a color filter 180. The color filter (the wavelength conversion member) 180 is located on a surface resin layer 170. It is favorable for the color filter 180 to be directly formed on the surface resin layer 170 by inkjet printing as in the example. When a film in which the color filter 180 is formed is adhered instead of an inkjet technique, a transparent thin film adhesive layer is located between the surface resin layer and the color filter 180. The surface resin layer 170 is located on the second inter-layer insulating film 156 and light-transmitting electrodes 159$a$ and 159$k$.

The configuration of the subpixel 20 will now be described in detail.

The transistor 103 is formed in a substrate 102. In addition to the transistor 103 for driving the light-emitting element 150, other circuit elements such as transistors, capacitors, etc., are formed in the substrate 102, and a circuit 101 is configured using wiring parts, etc. For example, the transistor 103 corresponds to a drive transistor 26 shown in FIG. 4 below; a select transistor 24, a capacitor 28, etc., also are circuit elements.

In the following description, the circuit 101 includes an element formation region 104 in which circuit elements are formed, an insulating layer 105, the first wiring layer 110, vias 111$d$ and 111$s$, and an insulating film 108. The vias 111$d$ and 111$s$ electrically connect the first wiring layer 110 and circuit elements including the transistor 103. The insulating film 108 electrically isolates the first wiring layer 110 and the circuit element and electrically isolates between the circuit elements, etc. Other components such as the substrate 102, the circuit 101, the first inter-layer insulating film 112, etc., also may be included when referring to a circuit board 100.

The transistor 103 includes a p-type semiconductor region 104$b$, n-type semiconductor regions 104$s$ and 104$d$, and a gate 107. The gate 107 is located on the p-type semiconductor region 104$b$ with the insulating layer 105 interposed. The insulating layer 105 is provided to insulate the element formation region 104 and the gate 107 and to sufficiently insulate from the other adjacent circuit elements. A channel may be formed in the p-type semiconductor region 104$b$ when a voltage is applied to the gate 107. The transistor 103 is an n-channel transistor, e.g., an n-channel MOSFET.

The element formation region 104 is located in the substrate 102. The substrate 102 is a semiconductor substrate, e.g., a Si substrate. The element formation region 104 is formed from the surface of the substrate 102 in the depth direction of the substrate 102, i.e., the negative direction of the Z-axis. The element formation region 104 includes the p-type semiconductor region 104$b$ and the n-type semiconductor regions 104$s$ and 104$d$. The n-type semiconductor regions 104$s$ and 104$d$ are located at the surface vicinity of the element formation region 104 and are separated from each other. The p-type semiconductor region 104b is formed to surround the peripheries of the n-type semiconductor regions 104s and 104d and is located between the n-type semiconductor regions 104s and 104d when projected onto the XY plane. The p-type semiconductor region 104b also is formed below the n-type semiconductor regions 104s and 104d.

The insulating layer 105 is located on the substrate 102. The insulating layer 105 also covers the element formation region 104, and covers the p-type semiconductor region 104b and the n-type semiconductor regions 104s and 104d. The insulating layer 105 is, for example, $SiO_2$. The insulating layer 105 may be a multilevel insulating layer that includes $SiO_2$, $Si_3N_4$, etc., according to the region in which the insulating layer 105 is formed. The insulating layer 105 may further include a layer of an insulating material that has a high dielectric constant.

The gate 107 is located on the p-type semiconductor region 104b with the insulating layer 105 interposed. The gate 107 is located between the n-type semiconductor regions 104s and 104d. The gate 107 is, for example, polycrystalline Si. The gate 107 may include a refractory metal such as W, Mo, or the like, a silicide, etc., that has a lower resistance than polycrystalline Si.

In the example, the gate 107 and the insulating layer 105 are covered with the insulating film 108. The insulating film 108 is, for example, $SiO_2$, $Si_3N_4$, etc. To planarize the surface when forming the first wiring layer 110, an organic insulating film such as PSG (Phosphorus Silicon Glass), BPSG (Boron Phosphorus Silicon Glass), etc., also may be provided.

The via 111s is provided to extend through the insulating film 108 and reach the n-type semiconductor region 104s. The via 111d is provided to extend through the insulating film 108 and reach the n-type semiconductor region 104d. The first wiring layer 110 is formed on the insulating film 108. The first wiring layer 110 includes multiple wiring parts that can have different potentials and includes wiring parts 110s and 110d. In FIG. 1 and subsequent cross-sectional views, unless otherwise noted, the reference numeral of a wiring layer to be marked is displayed at a position beside one wiring part included in the wiring layer with the reference numeral.

The via 111s is located between the wiring part 110s and the n-type semiconductor region 104s and electrically connects the wiring part 110s and the n-type semiconductor region 104s. The via 111d is located between the wiring part 110d and the n-type semiconductor region 104d and electrically connects the wiring part 110d and the n-type semiconductor region 104d. For example, the first wiring layer 110 and the vias 111s and 111d are formed of a metal such as Al, Cu, etc. The first wiring layer 110 and the vias 111s and 111d may include a refractory metal, etc.

The first inter-layer insulating film 112 is located on the insulating film 108 and the first wiring layer 110. The first inter-layer insulating film 112 functions as a planarization film that includes a planarized surface 112F for the conductive layer 130 formed on the first inter-layer insulating film 112. The planarized surface 112F is flat enough to form the conductive layer 130 that includes a connection plate 130a, and to form the light-emitting element 150 on the connection plate 130a. The first inter-layer insulating film 112 also functions as a protective film that protects the surface of a wafer 1100 shown in FIG. 6A below in storage, transportation, etc. The first inter-layer insulating film 112 is, for example, an organic insulating film of PSG, BPSG, etc.

The conductive layer 130 is located on the planarized surface 112F. The conductive layer 130 includes the connection plate (a first part) 130a. The light-emitting element 150 is located on the connection plate 130a. The connection plate 130a is a conductive film-shaped, layer-shaped, or plate-shaped member that has a quadrangular shape or any polygonal, elliptical, circular, or other shape when projected onto the XY plane. The connection plate 130a is electrically connected with the light-emitting element 150 at a bottom surface 151B of the light-emitting element 150.

In the example, one connection plate 130a is provided for each subpixel 20. Different connection plates 130a may or may not be connected to each other inside the conductive layer 130. In the example, the different connection plates 130a are connected to a wiring part (a first wiring part) 160k by vias 161k provided for each of the connection plates 130a, and the wiring part 160k is connected to the wiring part 110d of the first wiring layer 110 by the via 161d.

The entirety or a portion of the conductive layer 130 is formed of a single-crystal metal. It is favorable for the entire conductive layer 130 to be formed of a single-crystal metal. The entirety or a portion of the connection plate 130a is formed of a single-crystal metal.

Figure 2A:
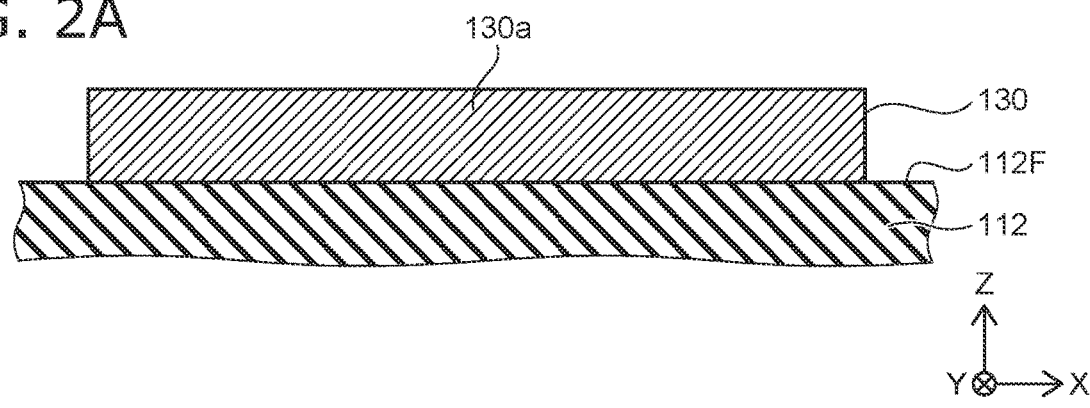
FIG. 2A is a schematic cross-sectional view illustrating a portion of the image display device according to the first embodiment.
Figure 2B:
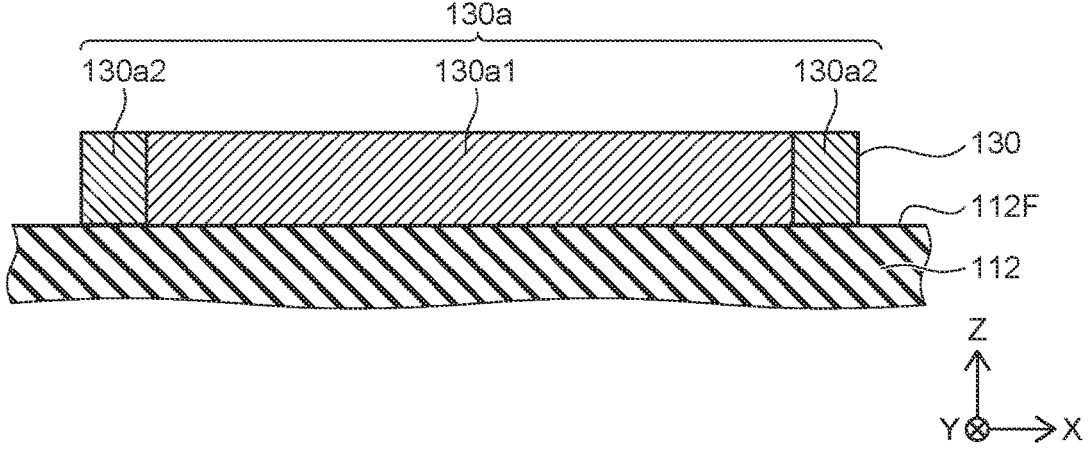
FIG. 2B is a schematic cross-sectional view illustrating a portion of the image display device according to the first embodiment.
Figure 2C:
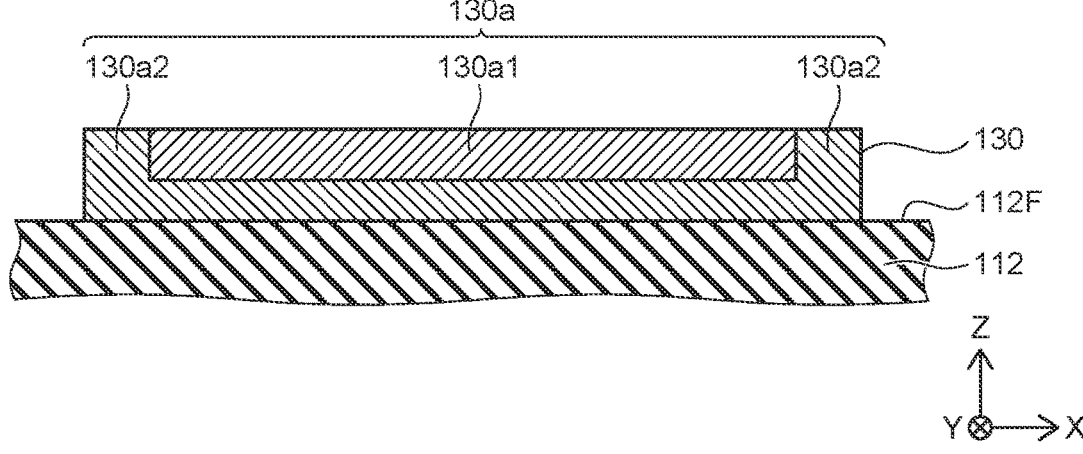
FIG. 2C is a schematic cross-sectional view illustrating a portion of the image display device according to the first embodiment.

FIGS. 2A to 2C are schematic cross-sectional views illustrating portions of the image display device of the embodiment.

FIGS. 2A to 2C schematically show cross-sectional views of three types of connection plates 130a.

FIG. 2A shows a state in which the greater part of the connection plate 130a is monocrystallized.

As shown in FIG. 2A, the entire connection plate 130a is monocrystallized. More specifically, the connection plate 130a is monocrystallized over the XY plane and is monocrystallized from the surface of the connection plate 130a to the planarized surface 112F in the Z-axis direction.

FIGS. 2B and 2C show states in which portions of the connection plates 130a are monocrystallized.

As shown in FIG. 2B, the connection plate 130a includes a monocrystallized part 130a1, and a portion 130a2 that is not monocrystallized. The monocrystallized portion 130a1 is formed from the surface of the connection plate 130a to the planarized surface 112F in the Z-axis direction. Although the non-monocrystallized portion 130a2 is formed to surround the periphery of the monocrystallized portion 130a1 in the example, the non-monocrystallized portion 130a2 is formed to contact at least a portion of the outer perimeter of the monocrystallized portion 130a1.

As shown in FIG. 2C, the connection plate 130a includes the monocrystallized portion 130a1, and the non-monocrystallized portion 130a2. The monocrystallized portion 130a1 is formed at the surface vicinity of the connection plate 130a in the Z-axis direction does not reach the planarized surface 112F. Similarly to FIG. 2B, the non-monocrystallized portion 130a2 is formed at the periphery of the monocrystallized portion 130a1.

The single-crystal metal is formed in the location of the connection plate 130a at which the light-emitting element 150 will be provided. In the example shown in FIG. 2A, the area of the connection plate 130a when projected onto the XY plane is greater than the area of the bottom surface 151B of the light-emitting element 150 when projected onto the XY plane. Also, when projected onto the XY plane, the outer perimeter of the connection plate 130a includes the outer perimeter of the bottom surface 151B of the light-emitting element 150 when the light-emitting element 150 is projected onto the connection plate 130a. That is, the outer perimeter of the light-emitting element 150 is located within the outer perimeter of the connection plate 130*a* when projected onto the XY plane. In the example shown in the examples shown in FIGS. 2B and 2C, the area of the monocrystallized portion 130*a*1 when projected onto the XY plane is greater than the area of the bottom surface 151B of the light-emitting element 150 when projected onto the XY plane. Also, when projected onto the XY plane, the outer perimeter of the monocrystallized portion 130*a*1 includes the outer perimeter of the bottom surface 151B of the light-emitting element 150 when the light-emitting element 150 is projected onto the connection plate 130*a*. That is, the outer perimeter of the light-emitting element 150 is located within the outer perimeter of the monocrystallized portion 130*a*1 when projected onto the XY plane.

In the following drawings and their descriptions, including the other embodiments, the entire conductive layer 130 and connection plate 130*a* is formed of a single-crystal metal as in the example shown in FIG. 2A. More generally, the light-emitting element is formed on the monocrystallized portion 130*a*1 in the examples shown in FIGS. 2B and 2C.

The metal material used to form the conductive layer 130 and the connection plate 130*a* is, for example, Cu, Hf, etc. The metal material that is included in the conductive layer 130 and the connection plate 130*a* is not limited to Cu or Hf as long as the metal material can be monocrystallized by annealing treatment. From the perspective of decreasing thermal stress on the circuit board 100, a metal material that can be monocrystallized by annealing treatment at a lower temperature is favorable. Because the connection plate 130*a* is formed of a metal material or the like, the connection plate 130*a* has high conductivity and can be electrically connected to the light-emitting element 150 with a low resistance.

The description continues now by returning to FIG. 1.

The light-emitting element 150 includes the bottom surface 151B and the light-emitting surface 153S. The light-emitting element 150 is a prismatic or cylindrical element including the bottom surface 151B on the connection plate 130*a*. The bottom surface 151B is located on the connection plate 130*a* and is electrically connected to the connection plate 130*a*. The light-emitting surface 153S is the surface at the side opposite to the bottom surface 151B.

When projected onto the XY plane, the outer perimeter of the connection plate 130*a* is set to include the outer perimeter of the light-emitting element 150 when the light-emitting element 150 is projected onto the connection plate 130*a*. That is, the outer perimeter of the light-emitting element 150 is located within the outer perimeter of the connection plate 130*a* when projected onto the XY plane. The conductive layer 130 and the connection plate 130*a* are formed of a metal material such as that described above and are light-reflective. Therefore, the connection plate 130*a* substantially improves the luminous efficiency of the light-emitting element 150 by reflecting downward-scattered light of the light-emitting element 150 toward the light-emitting surface 153S side. The connection plate 130*a* may be greatly extended to cover the circuit element. Accordingly, the connection plate 130*a* can reflect the downward-scattered light toward the light-emitting surface 153S side above the connection plate 130*a*, the light that reaches the circuit elements including the transistor 103 can be suppressed, and malfunction of the circuit elements can be prevented.

The light-emitting element 150 includes an n-type semiconductor layer 151, a light-emitting layer 152, and a p-type semiconductor layer 153. The n-type semiconductor layer 151, the light-emitting layer 152, and the p-type semiconductor layer 153 are stacked in this order from the bottom surface 151B toward the light-emitting surface 153S.

Accordingly, the n-type semiconductor layer 151 is electrically connected to the connection plate 130*a*.

When the light-emitting element 150 is prismatic, the shape of the light-emitting element 150 when projected onto the XY plane is, for example, substantially square or rectangular. When the shape of the light-emitting element 150 when projected onto the XY plane is polygonal including quadrangular, the corner portions may be rounded. When the shape of the light-emitting element 150 when projected onto the XY plane is cylindrical, the shape of the light-emitting element 150 when projected onto the XY plane is not limited to circular and may be, for example, elliptical. The degree of freedom of the layout is increased by appropriately selecting the shape, arrangement, etc., of the light-emitting element when projected onto the XY plane.

For example, the light-emitting element 150 favorably includes a gallium nitride compound semiconductor including a light-emitting layer of $In_XAl_YGa_{1-X-Y}N$ ($0{\le}X$, $0{\le}Y$, and $X{+}Y{<}1$), etc. Hereinbelow, the gallium nitride compound semiconductor may be called simply gallium nitride (GaN). According to an embodiment of the invention, the light-emitting element 150 is a so-called light-emitting diode. The wavelength of the light emitted by the light-emitting element 150 is, for example, about 467 nm±30 nm. The wavelength of the light emitted by the light-emitting element 150 may be a bluish-violet light emission of about 410 nm±30 nm. The wavelength of the light emitted by the light-emitting element 150 is not limited to these values and can be set as appropriate.

The areas of the light-emitting layers 152 when projected onto XY plane are set according to the light emission colors of the red, green, and blue subpixels. Hereinbelow, the area when projected onto the XY plane may be called simply the area. The area of the light-emitting layer 152 is appropriately set according to the luminous efficiency, the conversion efficiency of a color conversion part 182 of the color filter 180, etc. That is, the areas of the light-emitting layers 152 of the subpixels 20 of the light emission colors may be the same or may be different between the light emission colors. The area of the light-emitting layer 152 is the area of the region surrounded with the outer perimeter of the light-emitting layer 152 projected onto the XY plane.

The second inter-layer insulating film 156 covers the first inter-layer insulating film 112, the conductive layer 130 including the connection plate 130*a*, and the light-emitting element 150. The second inter-layer insulating film 156 is provided to cover the side surface of the light-emitting element 150 and to protect the side surface of the light-emitting element 150. A portion of the second inter-layer insulating film 156 on the light-emitting surface 153S is removed, and the light-emitting surface 153S is exposed from under the second inter-layer insulating film 156. The second inter-layer insulating film 156 is located between the adjacent light-emitting elements 150 to function as an insulating material separating the light-emitting elements 150 from each other. The second inter-layer insulating film 156 provides a planarized surface for forming the second wiring layer 160. It is sufficient for the second inter-layer insulating film 156 to be flat enough that the second wiring layer 160 can be formed.

The second inter-layer insulating film 156 is formed of an organic insulating material. The organic insulating material that is included in the second inter-layer insulating film 156 is favorably a white resin. A white resin reflects the light emitted by the light-emitting element 150 in the lateral direction and returning light caused by the interface with the color filter 180, etc.; therefore, the use of a white resin as the second inter-layer insulating film 156 contributes to the substantial improvement of the luminous efficiency of the light-emitting element 150.

The white resin is formed by dispersing fine scattering particles having a Mie scattering effect in a silicon resin such as SOG (Spin On Glass) or the like, a transparent resin such as a novolak phenolic resin, etc. The fine scattering particles are colorless or white and have a diameter of about $\frac{1}{10}$ to about several times the wavelength of the light emitted by the light-emitting element 150. The fine scattering particles that are favorably used have a diameter of about $\frac{1}{2}$ of the light wavelength. For example, $TiO_2$, $Al_2SO_3$, $ZnO$, etc., are examples of such a fine scattering particle.

The white resin also can be formed by utilizing many fine voids or the like dispersed in a transparent resin. When whitening the second inter-layer insulating film 156, for example, a $SiO_2$ film or the like that is formed by ALD (Atomic-Layer-Deposition) or CVD (Chemical Vapor Deposition) may be used instead of SOG, etc.

The second inter-layer insulating film 156 may be a black resin. By using a black resin as the second inter-layer insulating film 156, the scattering of the light inside the subpixel 20 is suppressed, and stray light is more effectively suppressed. An image display device in which stray light is suppressed can display a sharper image.

The second inter-layer insulating film 156 has an opening 158. The opening 158 is formed by removing a portion of the second inter-layer insulating film 156 above the light-emitting element 150. The opening 158 is formed to expose the light-emitting surface 153S from under the second inter-layer insulating film 156. The light-emitting surface 153S is the surface of the p-type semiconductor layer 153 at the side opposite to the surface contacting the light-emitting layer 152. It is favorable to perform surface roughening of the light-emitting surface 153S as in the example. The light extraction efficiency can be increased when the light-emitting surface 153S of the light-emitting element 150 is a rough surface.

The via (the first via) 161*d* is provided to extend through the second and first inter-layer insulating films 156 and 112 and reach the wiring part 110*d*. One end of the via 161*d* is connected to the wiring part 110*d*, and the via 161*d* is electrically connected to the wiring part 110*d*.

The via (the second via) 161*k* is provided to extend through the second inter-layer insulating film 156 and reach the connection plate 130*a*. One end of the via 161*k* is connected to the connection plate 130*a*, and the via 161*k* is electrically connected to the connection plate 130*a*.

The second wiring layer 160 is located on the second inter-layer insulating film 156. The second wiring layer 160 includes wiring parts 160*a* and 160*k*. The wiring parts 160*a* and 160*k* are located at positions separated from the light-emitting surface 153S when projected onto the XY plane. For example, the wiring part 160*a* is connected to a power supply line 3 shown in the circuit of FIG. 4 below.

The wiring part 160*k* is connected to the other ends of the vias 161*k* and 161*d*. That is, the via 161*d* is located between the wiring part 160*k* and the wiring part 110*d* and electrically connects the wiring part 160*k* and the wiring part 110*d*. The via 161*k* is located between the wiring part 160*k* and the connection plate 130*a* and electrically connects the wiring part 160*k* and the connection plate 130*a*. Accordingly, the n-type semiconductor layer 151 of the light-emitting element 150 is electrically connected to the wiring part 110*d* of the first wiring layer 110 via the connection plate 130*a*, the via 161*k*, the wiring part 160*k*, and the via 161*d*.

The light-transmitting electrode 159*a* is provided over the wiring part 160*a*. The light-transmitting electrode 159*a* is provided over the light-emitting surface 153S. The light-transmitting electrode 159*a* also is located between the wiring part 160*a* and the light-emitting surface 153S and electrically connects the wiring part 160*a* and the light-emitting surface 153S. For example, the light-transmitting electrode 159*a* is connected to the wiring part 160*a* and the power supply line 3 shown in the circuit of FIG. 4. The light-transmitting electrode 159*k* is provided over the wiring part 160*k*. The light-transmitting electrodes 159*a* and 159*k* are formed of light-transmitting conductive films of ITO, ZnO, etc.

Figure 4:
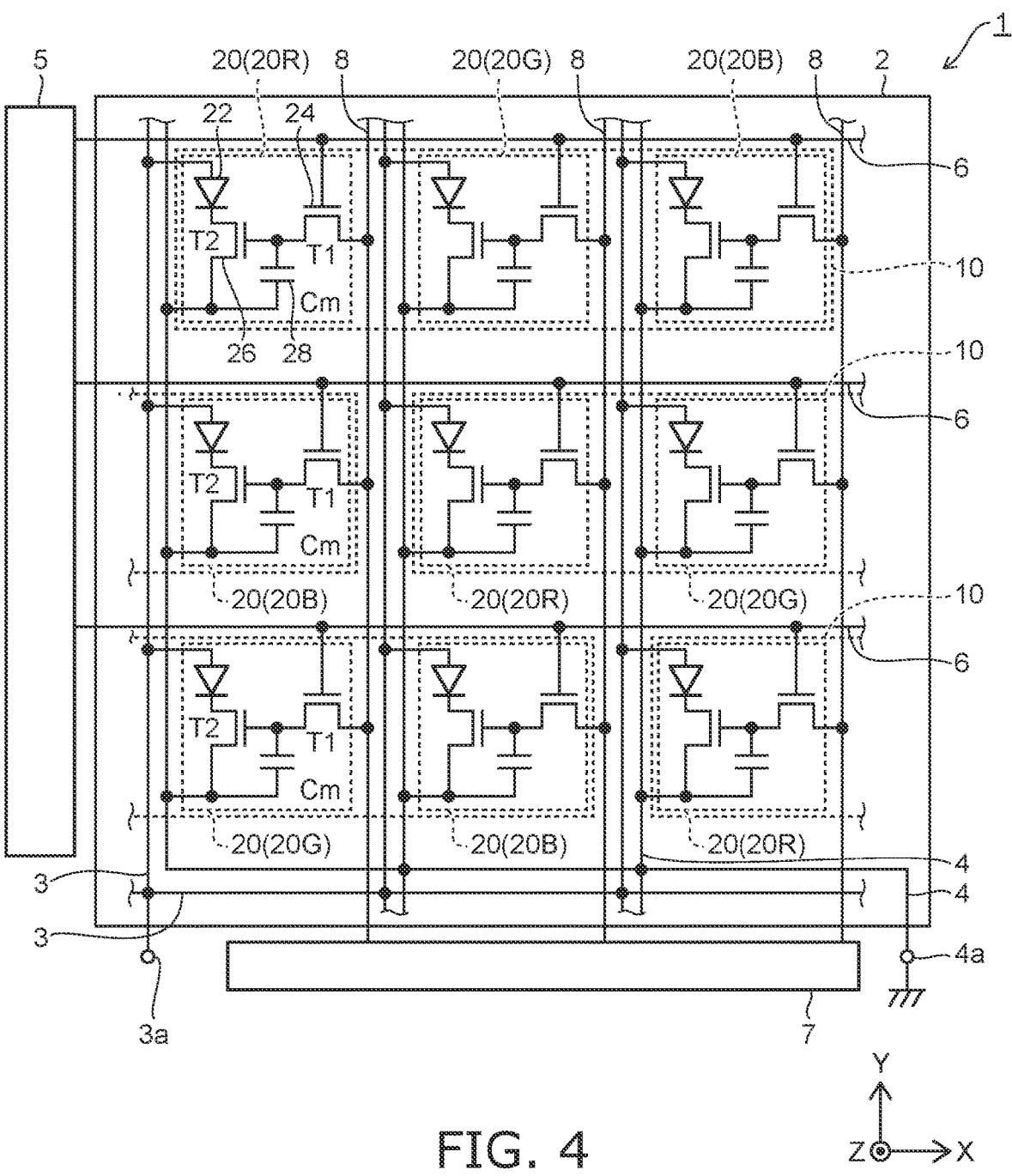
FIG. 4 is a schematic block diagram illustrating the image display device of the first embodiment.

Thus, for example, the p-type semiconductor layer 153 of the light-emitting element 150 are electrically connected to the power supply line 3 shown in the circuit of FIG. 4 via the wiring part 160*a* and the light-transmitting electrode 159*a*. The n-type semiconductor layer 151 of the light-emitting element 150 is electrically connected to the n-type semiconductor region 104*d*, i.e., the drain electrode of the transistor 103, by the via 161*k*, the wiring part 160*k*, the via 161*d*, the wiring part 110*d*, and the via 111*d*.

The surface resin layer 170 covers the second inter-layer insulating film 156 and the light-transmitting electrodes 159*a* and 159*k*. The surface resin layer 170 is a transparent resin, protects the second inter-layer insulating film 156 and the light-transmitting electrodes 159*a* and 159*k*, and includes a planarized surface for forming the color filter 180.

The color filter 180 includes a light-shielding part 181 and the color conversion part 182. The color conversion part 182 is located directly above the light-emitting surface 153S of the light-emitting element 150 to correspond to the shape of the light-emitting surface 153S. The portion of the color filter 180 other than the color conversion part 182 is used as the light-shielding part 181. The light-shielding part 181 is a so-called black matrix that reduces blur due to color mixing of the light emitted from the adjacent color conversion parts 182, etc., and makes it possible to display a sharp image.

The color conversion part 182 has one, two, or more layers. FIG. 1 shows a case where the color conversion part 182 has two layers. Whether the color conversion part 182 has one layer or two layers is determined by the color, i.e., the wavelength, of the light emitted by the subpixel 20. When the light emission color of the subpixel 20 is red, it is favorable for the color conversion part 182 to have the two layers of a color conversion layer 183 and a filter layer 184 that transmits red light. When the light emission color of the subpixel 20 is green, it is favorable for the color conversion part 182 to have the two layers of the color conversion layer 183 and the filter layer 184 that transmits green light. When the light emission color of the subpixel 20 is blue, it is favorable to use one layer.

When the color conversion part 182 has two layers, the first layer is the color conversion layer 183, and the second layer is the filter layer 184. The color conversion layer 183 of the first layer is located at a position more proximate to the light-emitting element 150. The filter layer 184 is stacked on the color conversion layer 183.

The color conversion layer 183 converts the wavelength of the light emitted by the light-emitting element 150 into the desired wavelength. When the subpixel 20 emits red, for example, the light of the wavelength of the light-emitting element 150, i.e., 467 nm±30 nm, is converted into light of a wavelength of about 630 nm±20 nm. When the subpixel 20 emits green, for example, the light of the wavelength of the light-emitting element 150, i.e., 467 nm±30 nm, is converted into light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the light-emitting element 150 may output the light via the color conversion layer 183, or may output the light as-is without the light passing through the color conversion layer 183. When the wavelength of the light emitted by the light-emitting element 150 is about 467 nm±30 nm, the light may be output without passing through the color conversion layer 183. When the wavelength of the light emitted by the light-emitting element 150 is 410 nm±30 nm, it is favorable to provide a one-layer color conversion layer 183 to convert the wavelength of the output light into about 467 nm±30 nm.

The subpixel 20 may include the filter layer 184 even when the subpixel 20 is blue. By providing the filter layer 184 through which blue light passes in the blue subpixel 20, the occurrence of a micro external light reflection other than blue light at the surface of the light-emitting element 150 is suppressed.

Figure 3A:
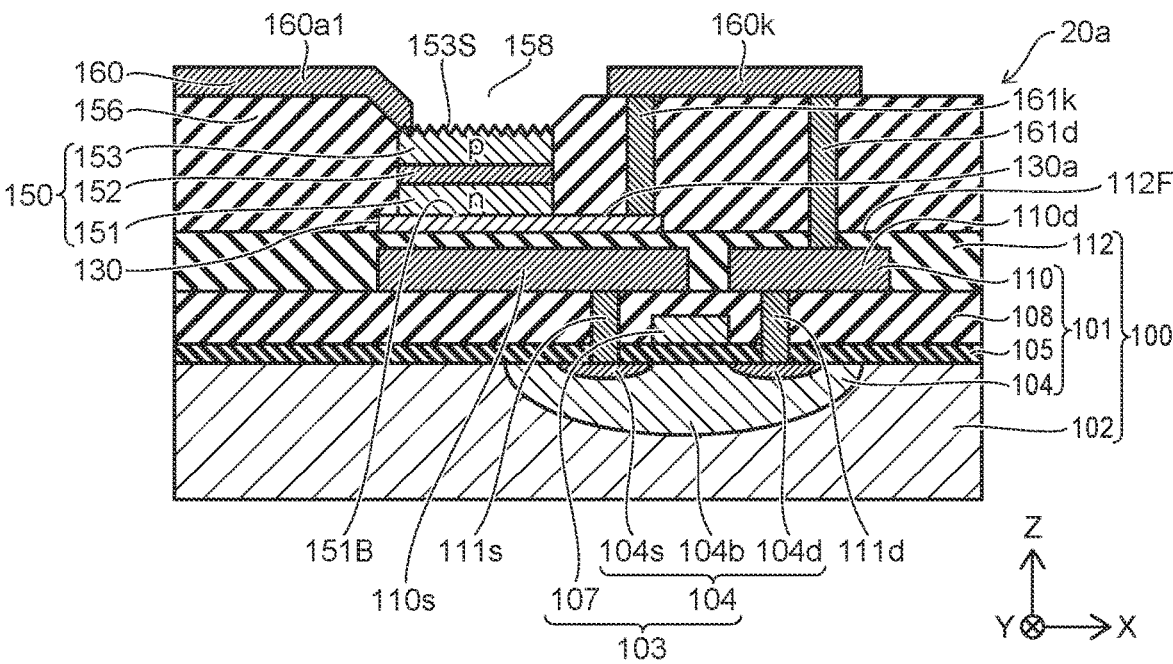
FIG. 3A is a cross-sectional view schematically showing a portion of an image display device according to a modification of the first embodiment.
Figure 3B:
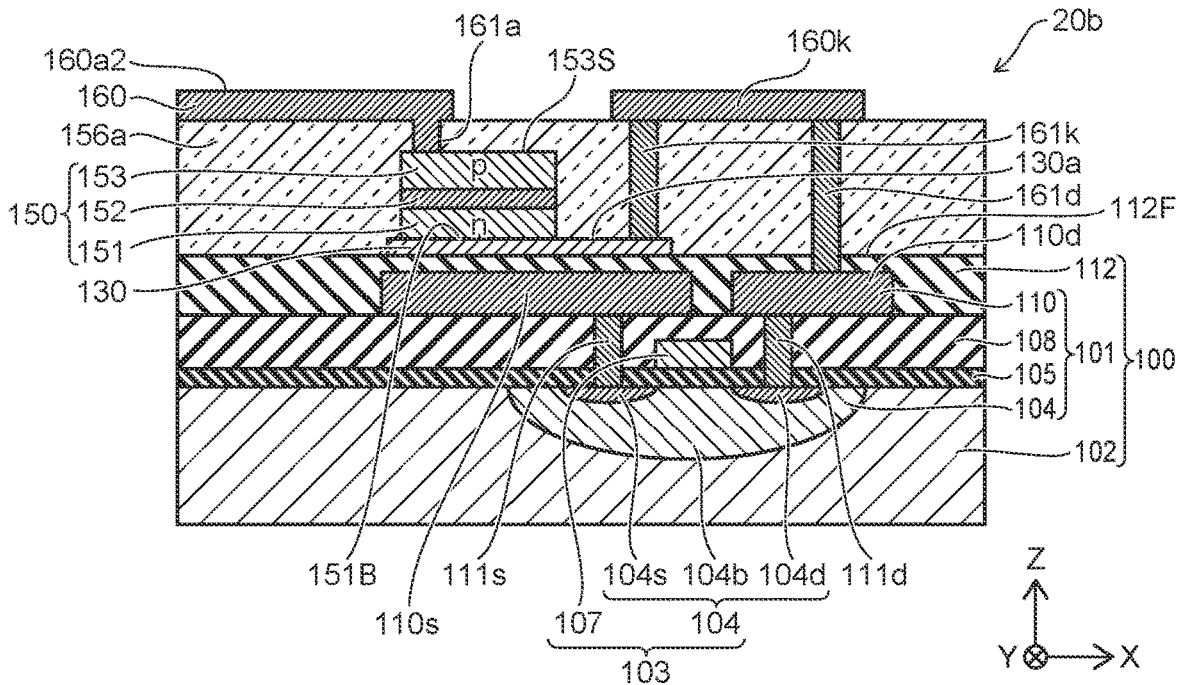
FIG. 3B is a cross-sectional view schematically showing a portion of an image display device according to a modification of the first embodiment.

FIGS. 3A and 3B are cross-sectional views schematically showing portions of image display devices according to modifications of the embodiment.

In a subpixel 20a in the example of FIG. 3A, the connection method between the light-emitting element 150 and a wiring part 160a1 is different from that of the first embodiment described above. The modification also differs from the first embodiment in that the light-transmitting electrode is not provided on the wiring parts 160a1 and 160k. Otherwise, the modification is the same as the first embodiment. The same components are marked with the same reference numerals, and a detailed description is omitted as appropriate. Although not illustrated in FIGS. 3A and 3B to avoid complexity of illustration, the structure of the surface resin layer 170 and higher shown in FIG. 1 is the same as that of the first embodiment.

As shown in FIG. 3A, the subpixel 20a includes a wiring part 160a1, and one end of the wiring part 160a1 reaches the light-emitting surface 153S. According to the modification, for example, the light-emitting surface 153S and the power supply line 3 shown in the circuit of FIG. 4 are electrically connected via the wiring part 160a1. Similarly to the first embodiment, the light-emitting surface 153S may or may not be roughened. When not roughened, the process for roughening can be omitted. According to the modification, the process for forming the light-transmitting electrodes can be omitted because the light-transmitting electrodes 159a and 159k shown in FIG. 1 are not provided.

In a subpixel 20b in the example of FIG. 3B, the configurations of a second inter-layer insulating film 156a and a wiring part 160a2 are different from those of the first embodiment described above. Otherwise, the modification is the same as the first embodiment. The same components are marked with the same reference numerals; and a detailed description is omitted as appropriate.

As shown in FIG. 3B, the subpixel 20b includes the second inter-layer insulating film 156a and the wiring part 160a2. The second inter-layer insulating film 156a is light-transmissive and is formed of, for example, a transparent resin. According to the modification, it is unnecessary to provide the opening 158 shown in FIG. 1 because the second inter-layer insulating film 156a covering the light-emitting element 150 is light-transmissive. On the other hand, because the opening 158 shown in FIG. 1 is not provided, the wiring part 160a2 is connected to the light-emitting surface 153S via a connection member 161a located in the second inter-layer insulating film 156a.

The embodiment can include any of the configurations of the subpixels 20, 20a, and 20b described above. Any of the subpixels 20, 20a, and 20b also is applicable to the other embodiments described below and their modifications. In other words, the connection with the light-emitting surface 153S may be performed by a light-transmitting electrode, or may be directly performed by the wiring part 160a1; and one of the second inter-layer insulating films 156 and 156a can be used.

FIG. 4 is a schematic block diagram illustrating the image display device according to the embodiment.

As shown in FIG. 4, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

A pixel 10 includes multiple subpixels 20 that emit light of different colors. A subpixel 20R emits red light. A subpixel 20G emits green light. A subpixel 20B emits blue light. The light emission color and luminance of one pixel 10 is determined by the three types of the subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as shown in FIG. 4. In each pixel 10, subpixels of the same color may be arranged in the same column, or subpixels of different colors may be arranged in each column as in the example.

The image display device 1 further includes the power supply line 3 and a ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a DC power supply connected between a power supply terminal 3a and a GND terminal 4a. The power supply terminal 3a and the GND terminal 4a are located respectively at end portions of the power supply line 3 and the ground line 4, and are connected to a DC power supply circuit located outside the display region 2. The power supply terminal 3a supplies a positive voltage when referenced to the GND terminal 4a.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the outer edge of the display region 2 in the Y-axis direction. The row selection circuit 5 is electrically connected to the subpixel 20 of each column via the scanning line 6, and supplies a select signal to each subpixel 20.

The signal voltage output circuit 7 is located along the outer edge of the display region 2 in the X-axis direction. The signal voltage output circuit 7 is electrically connected to the subpixel 20 of each row via the signal line 8, and supplies a signal voltage to each subpixel 20.

Figure 5:
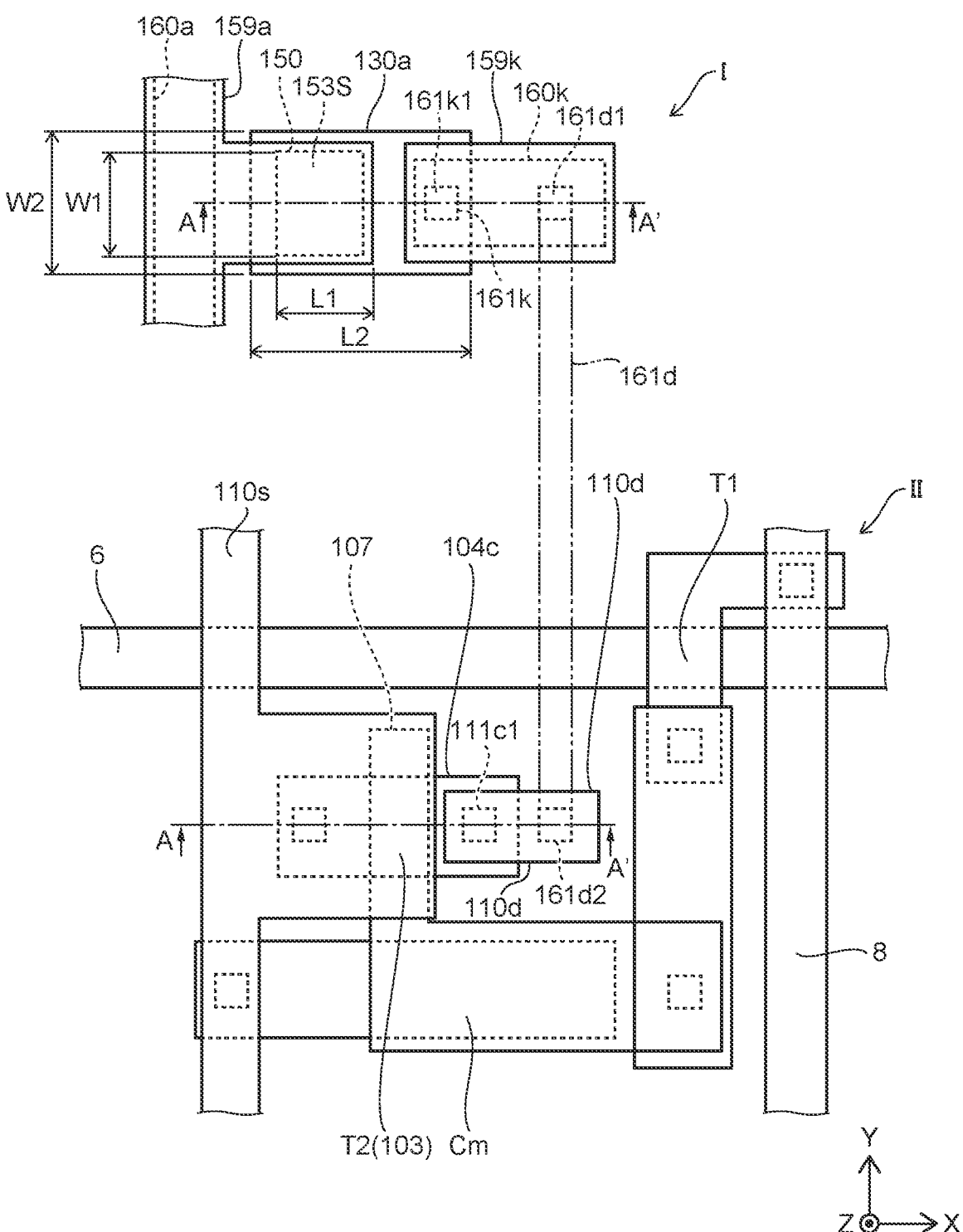
FIG. 5 is a schematic plan view illustrating a portion of the image display device of the first embodiment.

The subpixel 20 includes a light-emitting element 22, the select transistor 24, the drive transistor 26, and the capacitor 28. In FIGS. 4 and 5 below, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is an n-channel transistor, and the cathode electrode of the light-emitting element 22 is connected to the drain electrode of the drive transistor 26. Major electrodes of the drive transistor 26 and the select transistor 24 are drain electrodes and source electrodes. The anode electrode of the light-emitting element 22 is located at the p-type semiconductor layer. The cathode electrode of the light-emitting element is located at the n-type semiconductor layer. A series circuit of the light-emitting element 22 and the drive transistor 26 is connected between the power supply line 3 and the ground line 4. The drive transistor 26 corresponds to the transistor 103 of FIG. 1, and the light-emitting element 22 corresponds to the light-emitting element 150 of FIG. 1. The current that flows in the light-emitting element 22 is determined by the voltage applied between the gate and source of the drive transistor 26, and the light-emitting element 22 emits light of a luminance corresponding to the current that flows.

The select transistor 24 is connected between the signal line 8 and the gate electrode of the drive transistor 26 via a major electrode. The gate electrode of the select transistor 24 is connected to the scanning line 6. The capacitor 28 is connected between the power supply line 3 and the gate electrode of the drive transistor 26.

The row selection circuit 5 selects one row from the arrangement of m rows of the subpixels 20 and supplies a select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 allows a current corresponding to the signal voltage to flow in the light-emitting element 22. The light-emitting element 22 emits light of a luminance corresponding to the current flowing in the light-emitting element 22.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and the luminance emitted by the subpixels 20 of the colors of RGB.

FIG. 5 is a schematic plan view illustrating a portion of the image display device of the embodiment.

According to the embodiment as described in reference to FIG. 1, the light-emitting element 150 and the drive transistor 103 are stacked in the Z-axis direction, and the cathode electrode of the light-emitting element 150 and the drain electrode of the drive transistor 103 are electrically connected by the via 161*d*.

A plan view of an Ith layer is schematically displayed in the upper drawing of FIG. 5, and a plan view of an IIth layer is schematically displayed in the lower drawing of FIG. 5. In FIG. 5, the Ith layer is labeled "I", and the IIth layer is labeled "II". The Ith layer is a layer in which the light-emitting element 150 is formed. In other words, the Ith layer includes the layers from the conductive layer 130 to the second wiring layer 160 in the positive direction of the Z-axis in FIG. 1. The second inter-layer insulating film 156 is not shown in FIG. 5. The IIth layer includes the layers from the substrate 102 to the first inter-layer insulating film 112 in the positive direction of the Z-axis in FIG. 1. The substrate 102, the insulating layer 105, the insulating film 108, and the first inter-layer insulating film 112 are not shown in FIG. 5. A channel region 104*c* is shown as the element formation region 104 in these drawings.

The cross section of FIG. 1 is an auxiliary cross section along line A-A' in FIG. at the locations shown by the single dot-dash lines in each of the Ith layer and the IIth layer.

As shown in FIG. 5, the cathode electrode of the light-emitting element 150 is located on the connection plate 130*a* and electrically connected with the connection plate 130*a*. The cathode electrode is provided by the n-type semiconductor layer 151 shown in FIG. 1. The connection plate 130*a* is electrically connected to the wiring part 160*k* by the via 161*k* and a contact hole 161*k*1 of the via 161*k*. More specifically, one end of the via 161*k* is connected to the connection plate 130*a*, and the other end of the via 161*k* is connected to the wiring part 160*k* via the contact hole 161*k*1. The wiring part 160*k* is connected to one end of the via 161*d* by a contact hole 161*d*1 provided in the second inter-layer insulating film 156. The via 161*d* is schematically shown by a double dot-dash line in FIG. 5. The light-transmitting electrode 159*k* is provided over the wiring part 160*k*.

The anode electrode of the light-emitting element 150 is provided by the p-type semiconductor layer 153 shown in FIG. 1. The light-transmitting electrode 159*a* is provided over the entire surface of the light-emitting surface 153S. The light-transmitting electrode 159*a* also is located on the wiring part 160*a*. The light-transmitting electrode 159*a* also is located between the light-emitting surface 153S and the wiring part 160*a* and electrically connects the light-emitting surface 153S and the wiring part 160*a*.

The other end of the via 161*d* is connected to the wiring part 110*d* via a contact hole 161*d*2 provided in the first inter-layer insulating film 112. The wiring part 110*d* is connected to the via 111*d* shown in FIG. 1 via a contact hole 111*c*1 made in the insulating film 108 shown in FIG. 1. The via 111*d* is connected to the n-type semiconductor region 104*d* shown in FIG. 1 that is formed in the channel region 104*c*. The n-type semiconductor region 104*d* provides the drain electrode of the transistor 103. Thus, the light-emitting element 150 and the transistor 103 that are formed respectively in the Ith layer and the IIth layer, which are different layers, can be electrically connected by the via 161*d* extending through the second and first inter-layer insulating films 156 and 112.

The shape of the connection plate 130*a* when projected onto the XY plane will now be described using FIG. 5.

In the example, the light-emitting element 150 has a rectangular parallelepiped shape including the bottom surface 151B shown in FIG. 1. The bottom surface 151B has a length L1 in the X-axis direction and a length W1 in the Y-axis direction. In the example, the connection plate 130*a* is rectangular, and the rectangle has a length L2 in the X-axis direction and a length W2 in the Y-axis direction. The light-emitting element 150 is located on the connection plate 130*a*, and the bottom surface 151B is connected to the connection plate 130*a*.

The lengths of the portions described above are set so that L2>L1 and W2>W1. The light-emitting element 150 is located on the connection plate 130*a* and is located so that the outer perimeter of the connection plate 130*a* includes the outer perimeter of the light-emitting element 150 when projected onto the XY plane. That is, the outer perimeter of the light-emitting element 150 is set to be within the outer perimeter of the connection plate 130*a* when projected onto the XY plane. It is sufficient to set the outer perimeter of the light-emitting element 150 to be within the outer perimeter of the connection plate 130*a*; the shape of the connection plate 130*a* and the shape of the light-emitting element 150 are not limited to quadrangular and may be any appropriate shape.

In the light-emitting element 150, in addition to the upward light emission, there is also downward light emission, reflected light at the interface between the second inter-layer insulating film 156 and the surface resin layer 170, scattered light, etc. Accordingly, the outer perimeter of the light-emitting element 150 favorably is set to be within the outer perimeter of the connection plate 130*a* when projected onto the XY plane. Thus, by setting the connection plate 130*a*, the light that reaches the components below light-emitting element 150 can be suppressed, and malfunction of the circuit elements including the transistor 103 due to light, etc., can be suppressed.

A method for manufacturing the image display device 1 of the embodiment will now be described.

FIGS. 6A to 8B are schematic cross-sectional views illustrating the method for manufacturing the image display device of the embodiment.

Figure 6A:
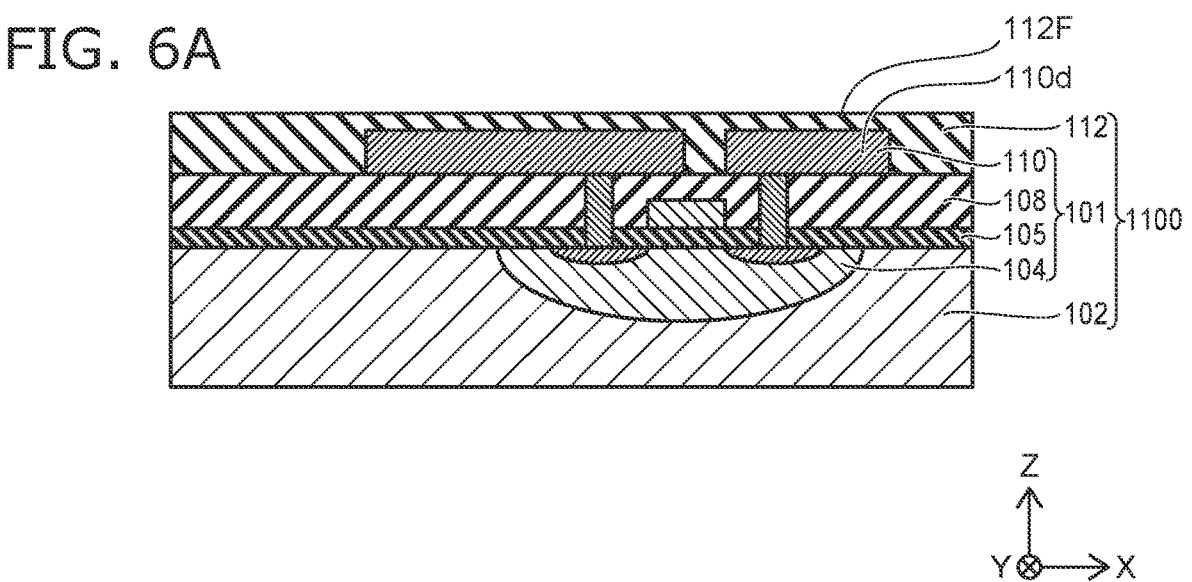
FIG. 6A is a schematic cross-sectional view illustrating a method for manufacturing the image display device of the first embodiment.

The wafer (the substrate) 1100 is prepared according to the method for manufacturing the image display device 1 of the embodiment as shown in FIG. 6A. In the wafer 1100, the circuit 101 is pre-formed in the substrate 102 of Si or the like, and the first inter-layer insulating film 112 that protects the circuit 101 and provides the planarized surface 112F is formed. The wafer 1100 is, for example, a disk-shaped member having a diameter of about 8 inches to 15 inches.

Figure 6B:
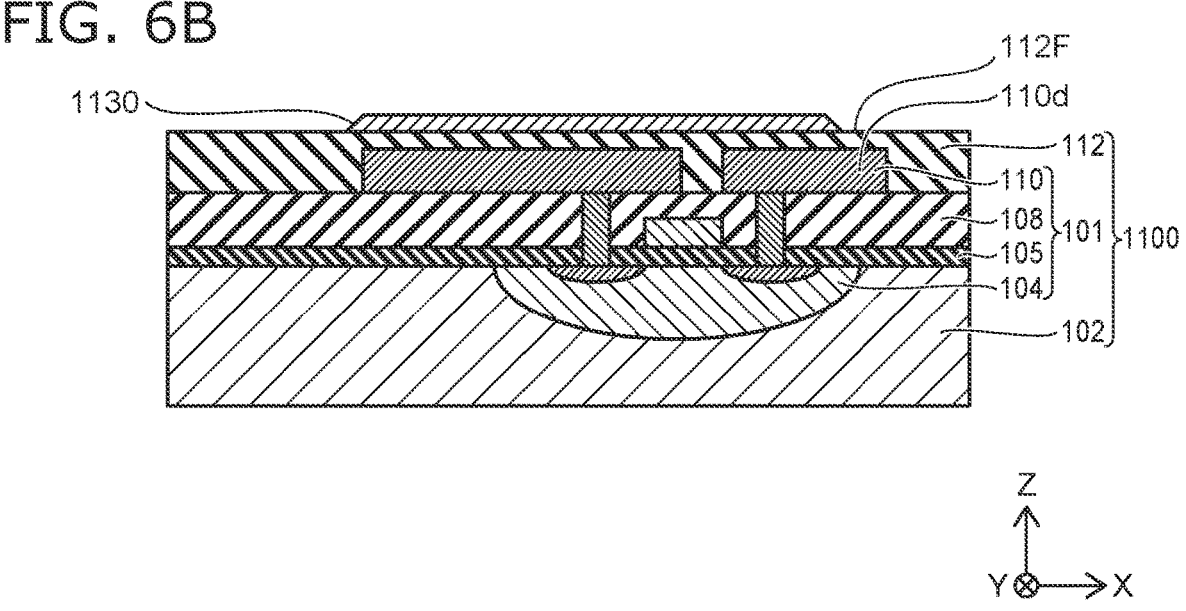
FIG. 6B is a schematic cross-sectional view illustrating the method for manufacturing the image display device of the first embodiment.

As shown in FIG. 6B, a conductive layer 1130 is formed on the planarized surface 112F. The conductive layer 1130 is formed by, for example, forming a layer of a metal material on the entire surface of the planarized surface 112F by sputtering, etc., and then patterning so that the location at which the light-emitting element is to be formed remains.

Or, the conductive layer 1130 may be formed by providing a mask including a pattern having an opening at the location at which the light-emitting element is to be formed on the planarized surface 112F to subsequently form a patterned conductive layer 1130.

For example, the conductive layer 1130 is formed using a metal material such as Cu, Hf, etc. To form at a low temperature, sputtering or the like is favorably used to form the conductive layer 1130.

Figure 7A:
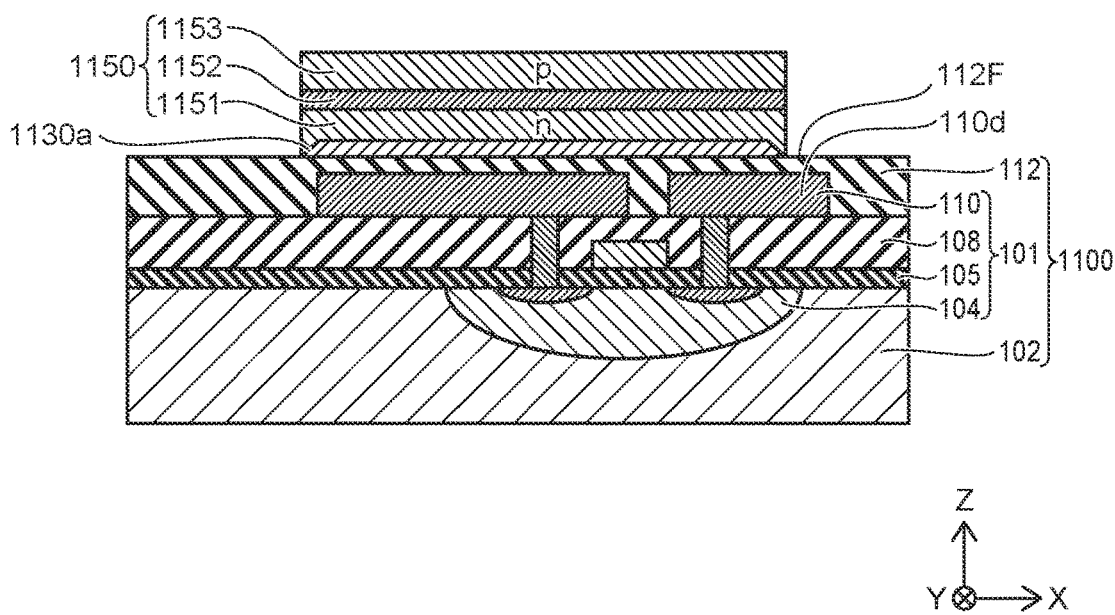
FIG. 7A is a schematic cross-sectional view illustrating the method for manufacturing the image display device of the first embodiment.

As shown in FIG. 7A, a monocrystallized conductive layer 1130*a* is formed by performing annealing treatment of the patterned conductive layer 1130 shown in FIG. 6B. Favorably, annealing treatment is performed to monocrystallize the entire patterned conductive layer 1130. For example, annealing treatment by laser irradiation is favorably used to monocrystallize the conductive layer 1130. Pulsed laser annealing can monocrystallize the conductive layer 1130 in a state in which the effects of the temperature on the layers lower than the conductive layer 1130 are suppressed to a low temperature of about 400° C. to 500° C.; therefore, the warp, etc., of the wafer 1100 can be suppressed, and the yield can be increased.

A semiconductor layer 1150 is formed over the monocrystallized conductive layer 1130*a*. The semiconductor layer

1150 includes an n-type semiconductor layer 1151, a light-emitting layer 1152, and a p-type semiconductor layer 1153 formed in this order from the conductive layer 1130*a* in the positive direction of the Z-axis.

To form the semiconductor layer 1150 including a GaN crystal, physical vapor deposition such as vapor deposition, ion beam deposition, molecular beam epitaxy (MBE), sputtering, or the like is used, and it is favorable to use low-temperature sputtering. Low-temperature sputtering is favorable because a lower temperature when forming is possible by assisting with light and/or plasma. There are cases where 1000° C. is exceeded in epitaxial growth by MOCVD. In contrast, it is known that a GaN crystal including a light-emitting layer can be epitaxially grown on the single-crystal metal layer in low-temperature sputtering at a low temperature of about 400° C. to about 700° C. (see Non-Patent Literature 1 and 2, etc.). Such low-temperature sputtering is effective for increasing the yield of wafer processing for larger diameters.

Thus, it is desirable for the planarized surface 112F to have sufficient flatness because the monocrystallized conductive layer 1130*a* is formed on the planarized surface 112F, and crystal growth of the semiconductor layer 1150 on the conductive layer 1130*a* is performed.

By using appropriate film formation technology, the semiconductor layer 1150 that is monocrystallized and includes the light-emitting layer 1152 is formed on the conductive layer 1130*a* monocrystallized over the entire surface by growing the GaN semiconductor layer 1150 on the conductive layer 1130*a*. Although not illustrated, there are also cases where amorphous deposits that include materials of the growth species such as Ga are deposited at locations at which the conductive layer 1130*a* does not exist in the growth process of the semiconductor layer 1150.

According to the embodiment, the crystal formation of GaN is promoted by using the conductive layer 1130*a* of the single-crystal metal as a seed. When forming the semiconductor layer 1150 on the monocrystallized conductive layer 1130*a*, a conductive buffer layer may be provided on the conductive layer 1130*a*, and the semiconductor layer may be grown by performing the low-temperature sputtering described above or the like on the buffer layer. The buffer layer can be any type of material that promotes GaN crystal formation. Graphene sheets of other embodiments described below may be used as the buffer layer.

According to the embodiment, the semiconductor layer 1150 is formed on the conductive layer 1130*a* from the n-type semiconductor layer 1151. In the initial growth of the semiconductor layer 1150, crystal defects caused by crystal lattice mismatch easily occur, and crystals having GaN as a major component generally have n-type semiconductor characteristics. Therefore, the yield can be increased by growing the semiconductor layer 1150 from the n-type semiconductor layer 1151 on the conductive layer 1130*a*.

Figure 7B:
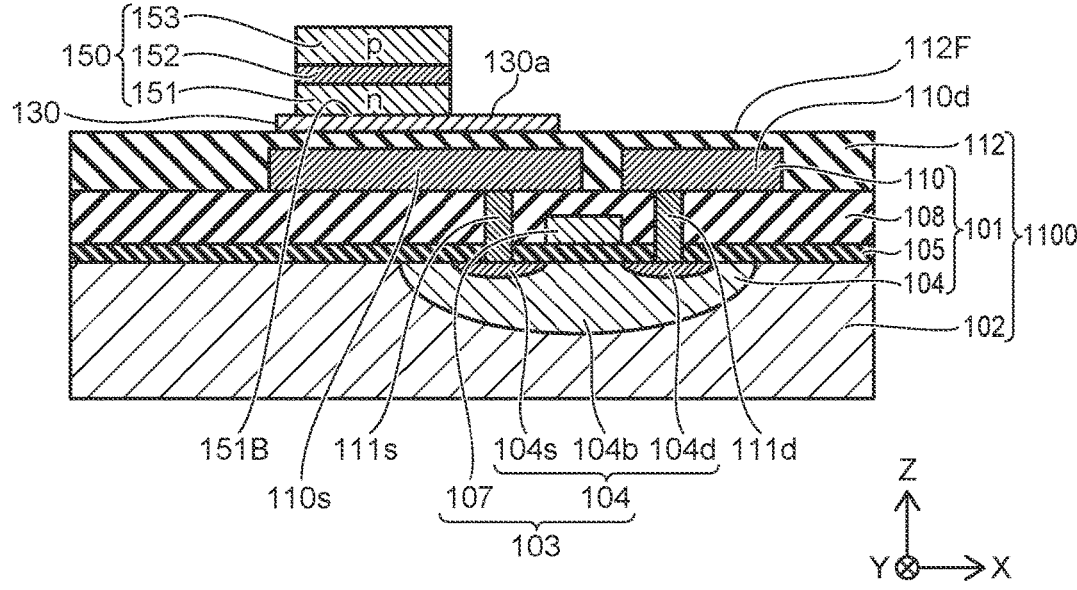
FIG. 7B is a schematic cross-sectional view illustrating the method for manufacturing the image display device of the first embodiment.

As shown in FIG. 7B, the light-emitting element 150 is formed by patterning the semiconductor layer 1150 shown in FIG. 7A into the desired shape by etching, etc. For example, a dry etching process is used to form the light-emitting element 150, and it is favorable to use anisotropic plasma etching (Reactive Ion Etching (RIE)). When deposits are formed at locations at which the conductive layer 1130*a* does not exist, the formed deposits are removed in the etching process of forming the light-emitting element 150.

After forming the light-emitting element 150, the conductive layer 130 is formed by etching the conductive layer 1130*a* shown in FIG. 7A. The connection plate (the first part) 130*a* is formed in the formation process of the conductive layer 130. Thus, the connection plate 130a is formed on the planarized surface 112F, and the light-emitting element 150 is formed on the connection plate 130a. When projected onto the XY plane, the outer perimeter of the connection plate 130a is set to include the outer perimeter of the light-emitting element 150 when the light-emitting element 150 is projected. That is, the outer perimeter of the light-emitting element 150 is located within the outer perimeter of the connection plate 130a when projected onto the XY plane.

Figure 8A:
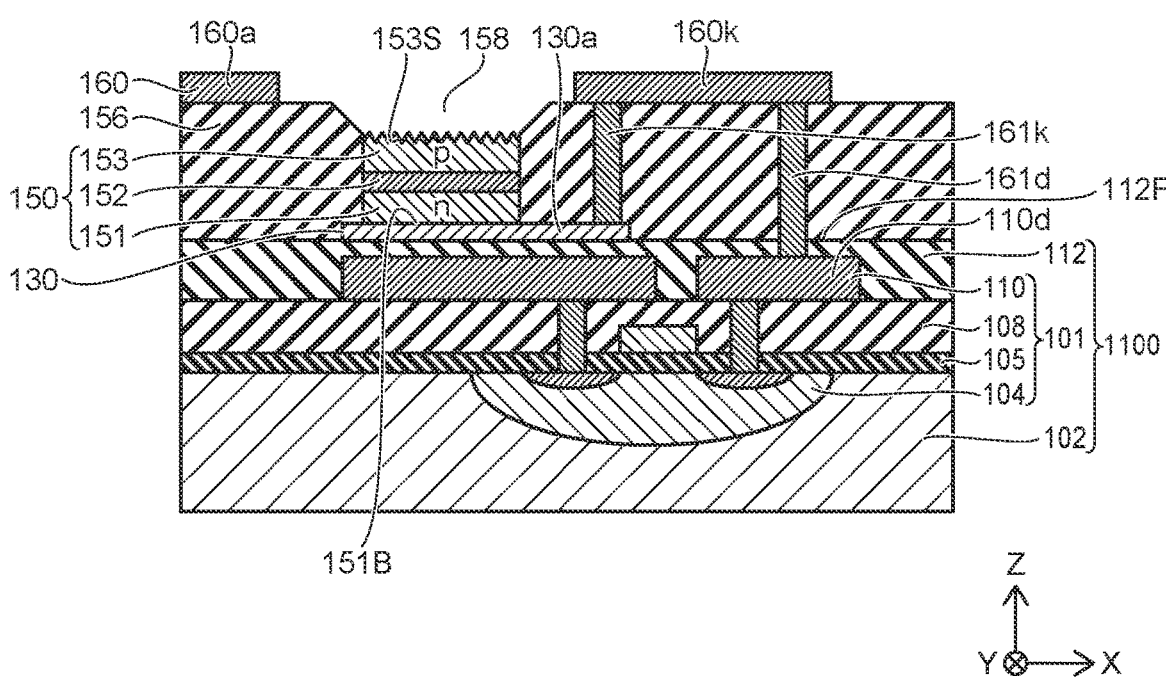
FIG. 8A is a schematic cross-sectional view illustrating the method for manufacturing the image display device of the first embodiment.

As shown in FIG. 8A, the second inter-layer insulating film (the second insulating film) 156 is formed to cover the planarized surface 112F, the conductive layer 130, the connection plate 130a, and the light-emitting element 150.

A via hole that is formed to extend through the second and first inter-layer insulating films 156 and 112 to reach the wiring part 110d is filled with a conductive material to form the via (the first via) 161d. A via hole that is formed to extend through the second inter-layer insulating film 156 to reach the connection plate 130a is filled with a conductive material to form the via (the second via) 161k.

The opening 158 is formed by removing a portion of the second inter-layer insulating film 156 on the light-emitting surface 153S. The light-emitting surface 153S is exposed from under the second inter-layer insulating film 156 via the opening 158.

The second wiring layer 160 that includes the wiring parts 160a and 160k is formed on the second inter-layer insulating film 156. The wiring part 160k is connected with the vias 161d and 161k. The formation process of the second wiring layer 160 may include the formation process of the vias 161k and 161d or may be performed after the formation of the vias 161k and 161d.

Figure 8B:
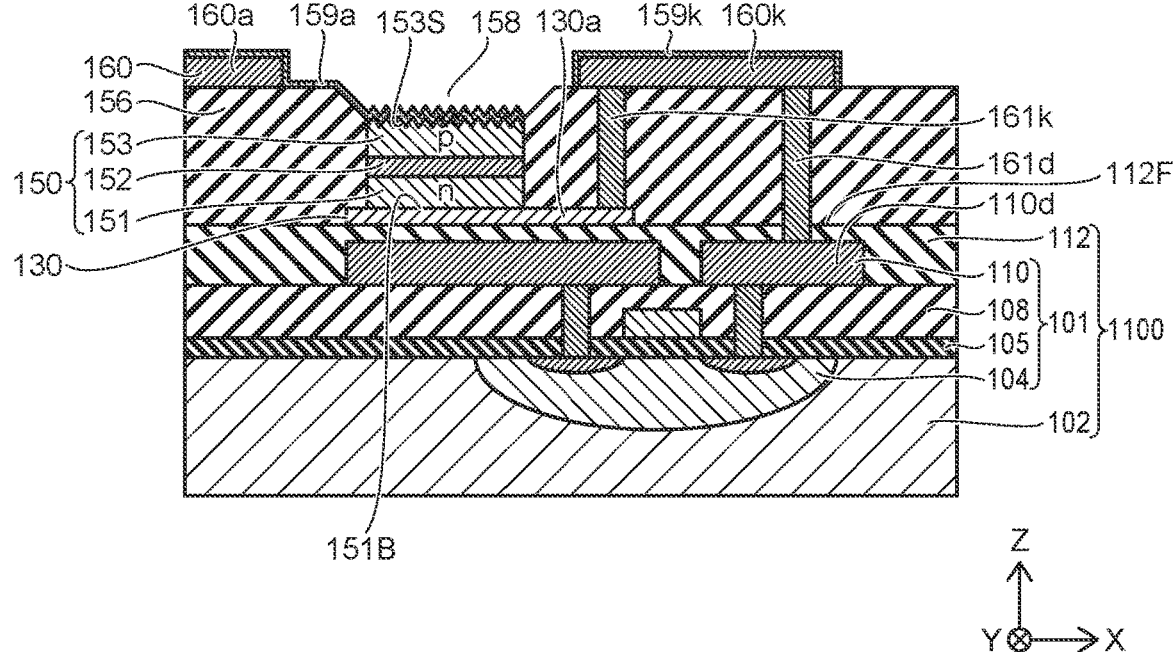
FIG. 8B is a schematic cross-sectional view illustrating the method for manufacturing the image display device of the first embodiment.

As shown in FIG. 8B, the light-transmitting electrodes 159a and 159k are formed by forming a light-transmitting conductive film on the second wiring layer 160 and on the second inter-layer insulating film 156.

Thereafter, the subpixel 20 of the image display device 1 of the embodiment is formed by providing a color filter, etc.

Figure 9A:
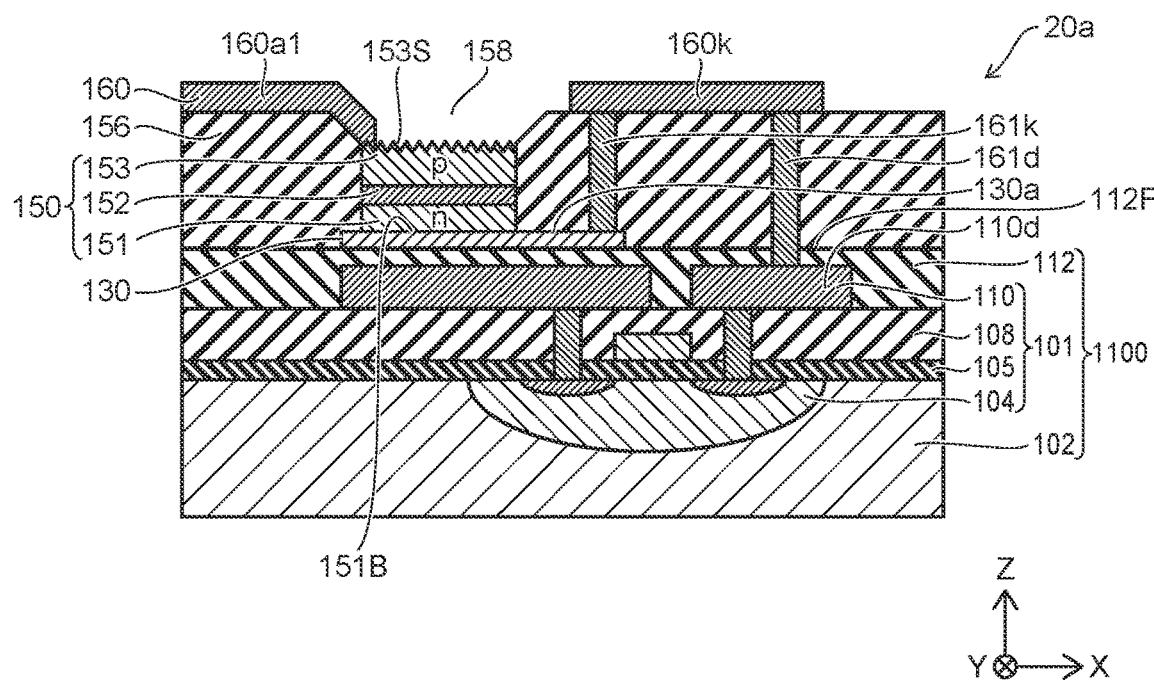
FIG. 9A is a schematic cross-sectional view illustrating a manufacturing method of a modification of the image display device of the first embodiment.
Figure 9B:
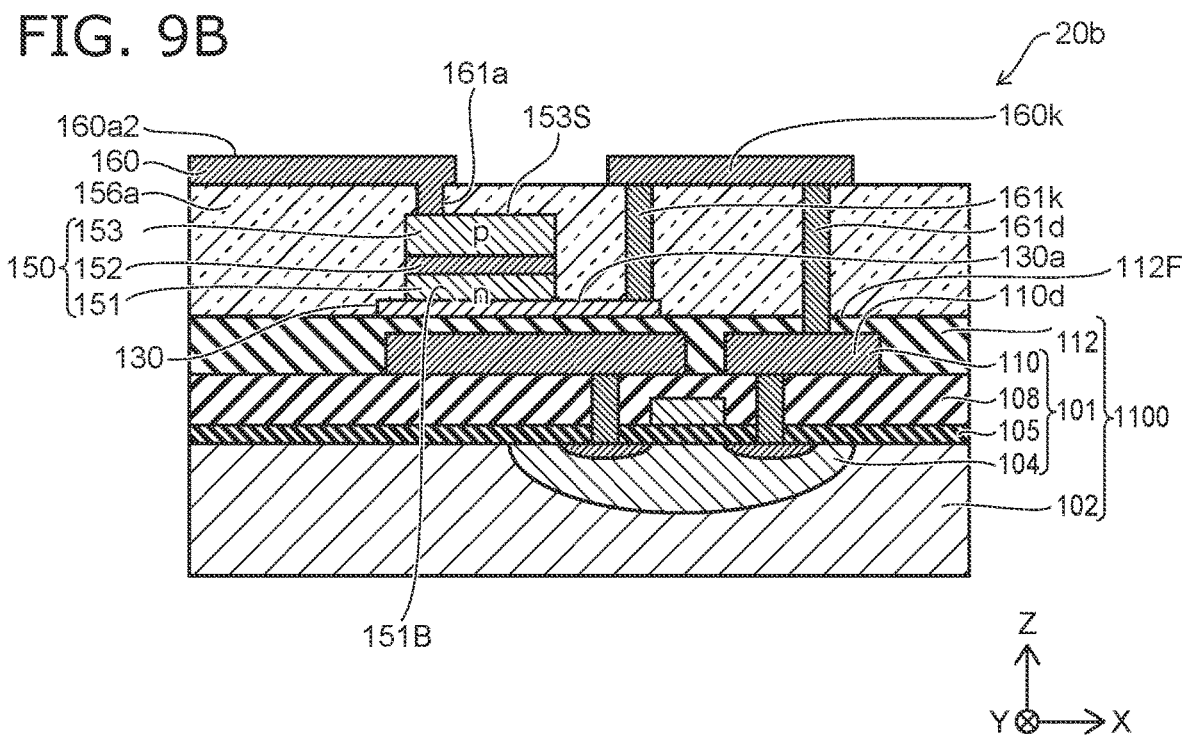
FIG. 9B is a schematic cross-sectional view illustrating a manufacturing method of a modification of the image display device of the first embodiment.

FIGS. 9A and 9B are schematic cross-sectional views illustrating manufacturing methods of modifications of the image display device of the embodiment.

FIG. 9A shows a portion of the processes of forming the subpixel 20a. According to the modification, the shape of the wiring part 160a1 is different from that of the first embodiment, and so the same processes as the first embodiment are applied up to the process described in reference to FIG. 7B. The process of FIG. 9A is performed after performing the process shown in FIG. 7B.

As shown in FIG. 9A, the second inter-layer insulating film 156 is formed to cover the planarized surface 112F, the conductive layer 130, the connection plate 130a, and the light-emitting element 150.

A via hole that is formed to extend through the second and first inter-layer insulating films 156 and 112 and reach the wiring part 110d is filled with a conductive material to form the via 161d. A via hole that is formed to extend through the second inter-layer insulating film 156 and reach the connection plate 130a is filled with a conductive material to form the via 161k.

In the second wiring layer 160 including the wiring parts 160a1 and 160k, the wiring part 160a1 is formed so that one end of the wiring part 160a1 is connected to the light-emitting surface 153S. The wiring part 160k is formed in the same shape as that of the first embodiment. Similarly to the first embodiment, the vias 161d and 161k may be simultaneously formed when forming the second wiring layer 160.

According to the modification, the formation process of the light-transmitting electrode is omitted.

Thereafter, the subpixel 20a is formed by providing a color filter, etc.

FIG. 9B shows a portion of the processes of forming the subpixel 20b shown in FIG. 3B. According to the modification, the configurations of the second inter-layer insulating film 156a and the wiring part 160a2 are different from those of the first embodiment, and the same processes as the first embodiment are applied up to the process described in reference to FIG. 7B. The process of FIG. 9B is performed after performing the process of FIG. 7B.

As shown in FIG. 9B, the second inter-layer insulating film 156a is formed to cover the planarized surface 112F, the conductive layer 130, the connection plate 130a, and the light-emitting element 150. Subsequently, the via 161d that extends through the second and first inter-layer insulating films 156a and 112 is formed, and the via 161d that extends through the second inter-layer insulating film 156a is formed. A connection member 161a is formed in the contact hole formed on the light-emitting surface 153S.

The second wiring layer 160 including the wiring parts 160k and 160a2 is formed on the second inter-layer insulating film 156a. The wiring part 160k is connected to the vias 161k and 161d, and the wiring part 160a2 is connected to the connection member 161a. The second wiring layer 160 and the vias 161k and 161d may be connected by being simultaneously formed. The second wiring layer 160 and the connection member 161a also may be connected by being simultaneously formed.

Thereafter, the subpixel 20b is formed by providing a color filter, etc.

The formation process of the color filter 180 will now be described.

Figure 11:
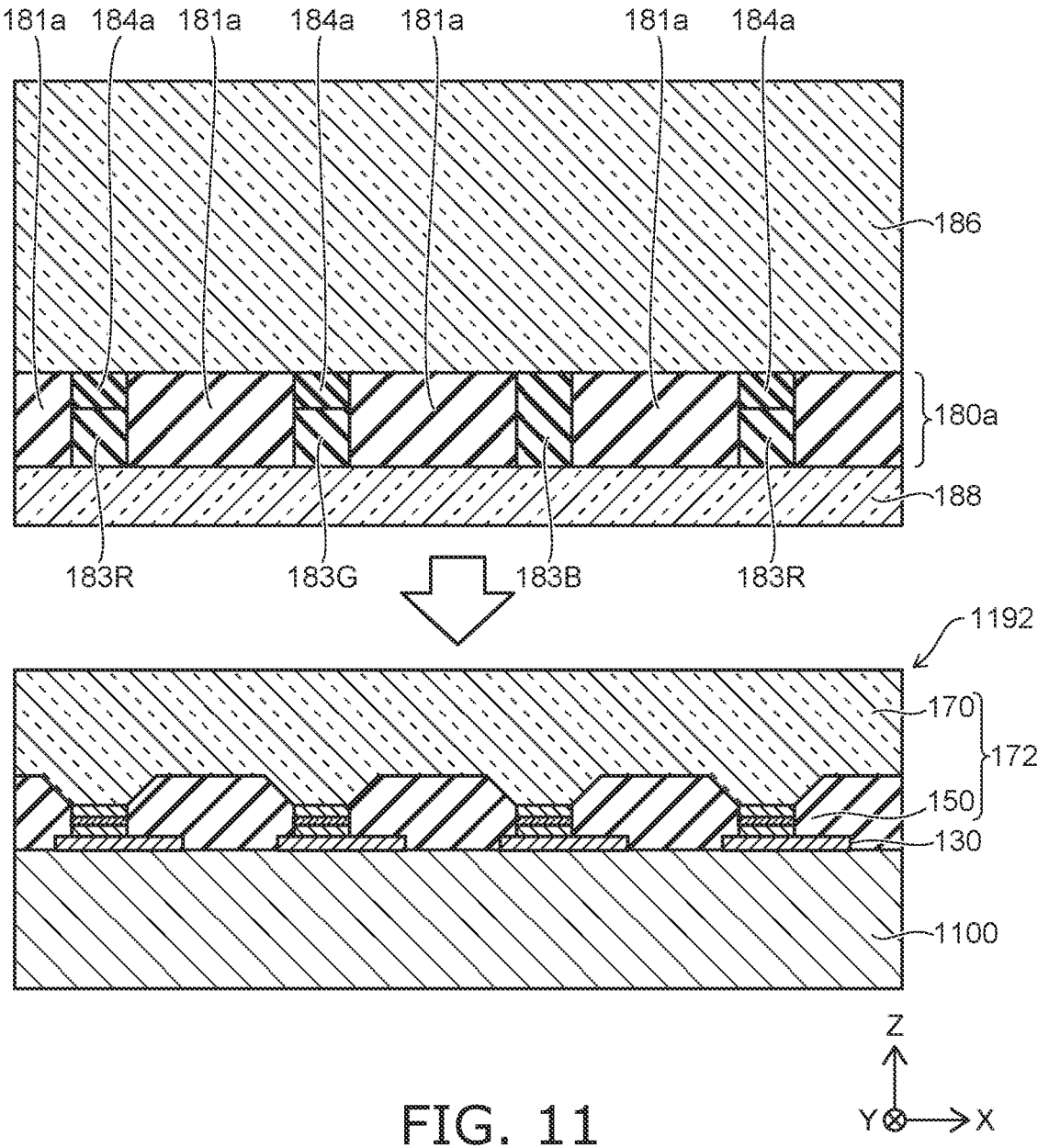
FIG. 11 is a schematic cross-sectional view illustrating a modification of the method for manufacturing the image display device of the first embodiment.

In the description related to the formation process of the color filter 180 and FIGS. to 10D and FIG. 11, the structural component that includes the light-emitting element 150, the second inter-layer insulating film 156, the vias 161d and 161k, the second wiring layer 160, the light-transmitting electrodes 159k and 159a, and the surface resin layer 170 is called a light-emitting circuit part 172. The structural component that includes the wafer 1100, the conductive layer 130, and the light-emitting circuit part 172 is called a structure body 1192.

FIGS. 10A to 10D are schematic cross-sectional views showing the method for manufacturing the image display device of the embodiment.

FIGS. 10A to 10D show processes when forming the color filter (the wavelength conversion member) 180 shown in FIG. 1 by inkjet printing.

Figure 10A:
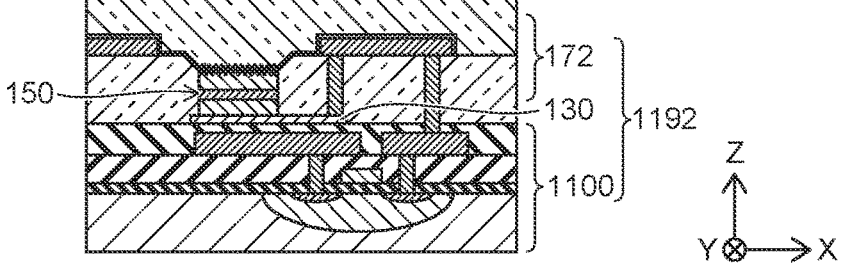
FIG. 10A is a schematic cross-sectional view illustrating a method for manufacturing the image display device of the first embodiment.

As shown in FIG. 10A, the structure body 1192 in which the conductive layer 130 and the light-emitting circuit part 172 are formed on the wafer 1100 is prepared.

Figure 10B:
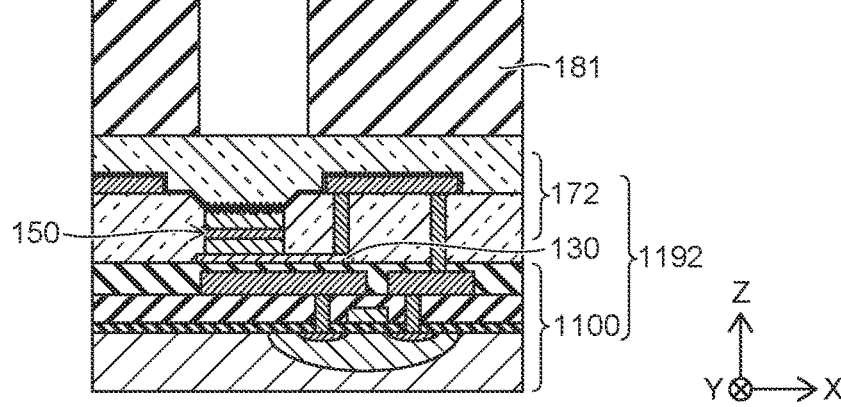
FIG. 10B is a schematic cross-sectional view illustrating the method for manufacturing the image display device of the first embodiment.

As shown in FIG. 10B, the light-shielding part 181 is formed on the structure body 1192. For example, the light-shielding part 181 is formed using screen printing, photolithography technology, etc.

Figure 10C:
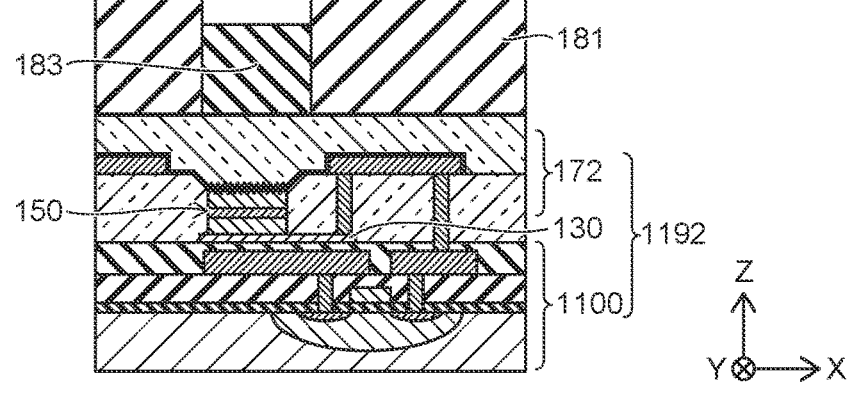
FIG. 10C is a schematic cross-sectional view illustrating the method for manufacturing the image display device of the first embodiment.

As shown in FIG. 10C, the color conversion layer 183 is formed by dispensing a fluorescer that corresponds to the light emission color from an inkjet nozzle. The fluorescer colors the region in which the light-shielding part 181 is not formed. The fluorescer includes, for example, a fluorescent coating that uses a general fluorescer material, a perovskite fluorescer material, or a quantum dot fluorescer material. It is favorable to use a perovskite fluorescer material or a quantum dot fluorescer material because the light emission colors can be realized with high monochromaticity and high color reproducibility. After printing with the inkjet nozzle, drying processing is performed using an appropriate temperature and time. The thickness of the coating when coloring is set to be less than the thickness of the light-shielding part 181.

The color conversion layer 183 is not formed in the subpixel of blue light emission when the color conversion part is not formed. Also, when a blue color conversion layer is formed in the subpixel of blue light emission, and when the color conversion part may have one layer, it is favorable for the thickness of the coating of the blue fluorescer to be about equal to the thickness of the light-shielding part 181.

Figure 10D:
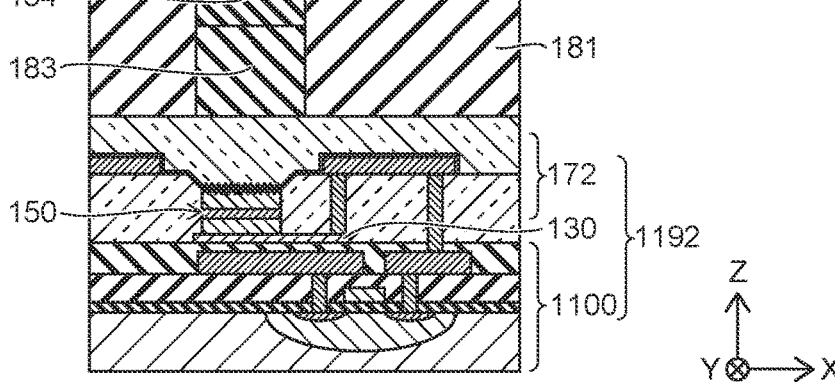
FIG. 10D is a schematic cross-sectional view illustrating the method for manufacturing the image display device of the first embodiment.

As shown in FIG. 10D, the coating for the filter layer 184 is dispensed from the inkjet nozzle. The coating is applied to overlap the coating of the fluorescer. The total thickness of the fluorescer and the coating is set to be about equal to the thickness of the light-shielding part 181. Thus, the color filter 180 is formed.

Instead of a color filter formed by inkjet printing, a process of forming a film-type color filter 180*a* will now be described.

FIG. 11 is a schematic cross-sectional view illustrating a modification of the method for manufacturing the image display device of the embodiment.

In FIG. 11, the drawing above the arrow shows a configuration that includes the color filter 180*a*, and the drawing below the arrow shows the structure body 1192 that includes the wafer 1100, the conductive layer 130, and the light-emitting circuit part 172 formed in the processes described above. The arrow of FIG. 11 indicates the process of bonding, to the structure body 1192, the color filter 180*a* that is formed in a film shape.

To avoid complexity in FIG. 11, the components inside the illustrated wafer 1100 and a portion of the components formed on the wafer 1100 are not illustrated. The components inside the wafer 1100 that are not illustrated are the substrate 102 shown in FIG. 1 and the circuit 101 that includes the element formation region 104, the first wiring layer 110, etc. The components of the light-emitting circuit part 172 that are omitted are the vias 161*d* and 161*k*, the second wiring layer 160, and the light-transmitting electrodes 159*k* and 159*a*.

As shown in FIG. 11, the color filter (the wavelength conversion member) 180*a* includes a light-shielding part 181*a*, color conversion layers 183R, 183G, and 183B, and a filter layer 184*a*. The light-shielding part 181*a* has a function similar to when an inkjet technique is used. The color conversion layers 183R, 183G, and 183B are formed to have functions and materials similar to when an inkjet technique is used. The filter layer 184*a* also has a function similar to when an inkjet technique is used.

The color filter 180*a* is bonded to the structure body 1192 at one surface. The other surface of the color filter 180*a* is bonded to a glass substrate 186. A transparent thin film adhesive layer 188 is located at the one surface of the color filter 180*a*, and the exposed surface of the surface resin layer 170 of the structure body 1192 is bonded to the one surface of the color filter 180*a* via the transparent thin film adhesive layer 188.

In the color filter 180*a* of the example, color conversion parts are arranged in the positive direction of the X-axis in the order of red, green, and blue. For red, a red color conversion layer 183R is located in the first layer; for green, a green color conversion layer 183G is located in the first layer. The filter layer 184*a* is located in the second layer for both red and green. For blue, a single-layer color conversion layer 183B may be provided, and the filter layer 184*a* may be provided. The light-shielding part 181*a* is located between the color conversion parts, and it goes without saying that the frequency characteristics of the filter layer 184 can be modified for each color of the color conversion parts.

The color filter 180*a* is adhered to the structure body 1192 so that the positions of the color conversion layers 183R, 183G, and 183B of each color match the positions of the light-emitting elements 150.

Thus, the color filters 180 and 180*a* are formed in the structure body 1192 including the light-emitting circuit part 172, etc., and the subpixels are formed. An appropriate technique for the color filter is selected among inkjet techniques, film techniques, and other techniques that can form an equivalent color filter. By forming the color filter 180 by inkjet printing, the film adhesion process, etc., can be omitted, and the image display device 1 shown in FIG. 4 can be manufactured more inexpensively.

It is desirable to make the color conversion layer 183 as thick as possible to increase the color conversion efficiency for both the color filter 180 formed by inkjet printing and the film-type color filter 180*a*. On the other hand, when the color conversion layer 183 is too thick, the light emitted by the color conversion approximates Lambertian, but the blue light that is not color-converted has an emission angle limited by the light-shielding part 181. Therefore, a problem undesirably occurs in that the display color of the display image has viewing angle dependence. To match the light distribution of the light of the subpixels in which the color conversion layer 183 is provided with the light distribution of the blue light that is not color-converted, it is desirable to set the thickness of the color conversion layer 183 to be about half of the opening size of the light-shielding part 181.

For example, in the case of a high-definition image display device of about 250 ppi (pitch per inch), the pitch of the subpixels 20 is about 30 μm, and so it is desirable for the thickness of the color conversion layer 183 to be about 15 μm. Here, when the color conversion material is made of spherical fluorescer particles, it is favorable to stack in a close-packed structure to suppress light leakage from the light-emitting element 150. It is therefore necessary to use at least three layers of particles. Accordingly, it is favorable for the particle size of the fluorescer material included in the color conversion layer 183 to be, for example, not more than about 5 μm, and more favorably not more than about 3 μm.

After the color filters 180 and 180*a* are formed, the structure body 1192 shown in FIG. 10A, etc., is diced together with the color filters 180 and 180*a* to form the image display device. The formation process of the color filters 180 and 180*a* may be performed after dicing the structure body 1192.

Figure 12:
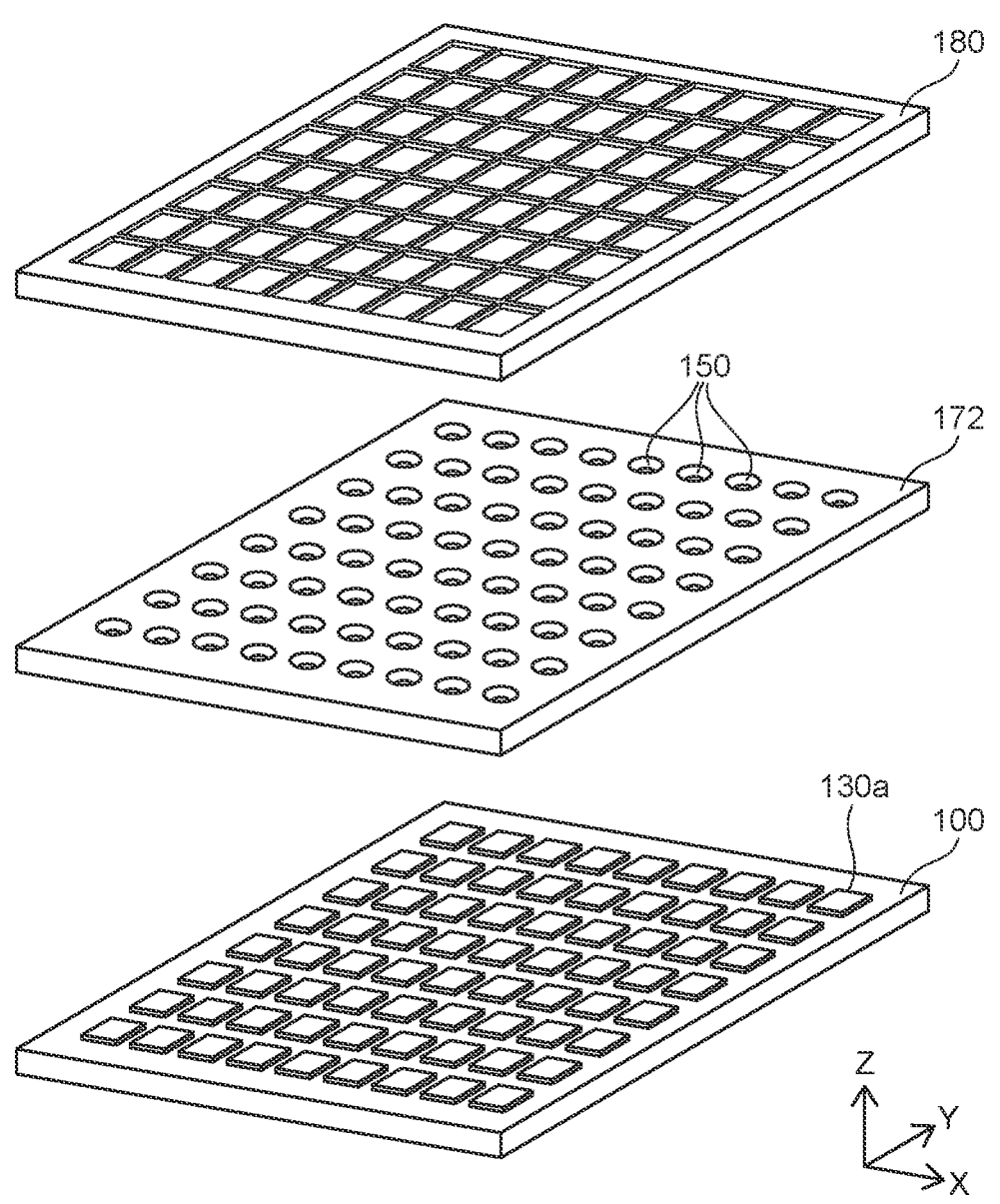
FIG. 12 is a schematic perspective view illustrating the image display device according to the first embodiment.

FIG. 12 is a schematic perspective view illustrating the image display device according to the embodiment.

In the image display device of the embodiment as shown in FIG. 12, the light-emitting circuit part 172 that includes many light-emitting elements 150 is located on the substrate 102. The conductive layer 130 shown in FIGS. 10A to 10D includes the connection plate 130*a*. The connection plates 130*a* are provided on the substrate 102 to correspond respectively to the light-emitting elements 150. The color filter 180 is located on the light-emitting circuit part 172. The other embodiments and modifications described below also have configurations similar to the configuration shown in FIG. 12.

Effects of the image display device 1 of the embodiment will now be described.

According to the method for manufacturing the image display device 1 of the embodiment, the light-emitting element 150 is formed by performing crystal growth of the semiconductor layer 1150 on the wafer 1100 and by etching the semiconductor layer 1150. The circuit 101 that includes the transistor 103 driving the light-emitting element 150, etc., is pre-made in the wafer 1100. Therefore, the manufacturing processes are markedly reduced compared to when singulated light-emitting elements are individually transferred.

According to the method for manufacturing the image display device 1 of the embodiment, the conductive layer 1130a can be formed by monocrystallizing the conductive layer 1130 formed on the planarized surface 112F of the wafer 1100, and can be used as the seed for performing crystal growth of the semiconductor layer 1150. For example, sufficiently high productivity can be realized because the monocrystallization of the conductive layer 1130 can be performed by laser annealing treatment.

For example, in an image display device having 4K image quality, the number of subpixels is greater than 24 million, and in the case of an image display device having 8K image quality, the number of subpixels is greater than 99 million. When individually forming and mounting such a large quantity of light-emitting elements to a circuit board, an enormous amount of time is necessary. It is therefore difficult to realize an image display device that uses micro LEDs at a realistic cost. Also, when individually mounting a large quantity of light-emitting elements, the yield decreases due to connection defects when mounting, etc., and an even higher cost is unavoidable.

In contrast, according to the method for manufacturing the image display device 1 of the embodiment, the transfer process of the light-emitting elements 150 can be reduced because the light-emitting elements 150 are formed after forming the entire semiconductor layer 1150 on the conductive layer 1130 formed on the wafer 1100. Therefore, according to the method for manufacturing the image display device 1 of the embodiment, compared to a conventional manufacturing method, the time of the transfer process can be reduced, and the number of processes can be reduced.

Because the semiconductor layer 1150 that has a uniform crystal structure is grown on the conductive layer 1130a of the single-crystal metal, the light-emitting elements 150 can be self-aligningly provided by appropriately patterning the conductive layer 1130a. This is favorable for a higher-definition display because alignment of the light-emitting elements 150 on the wafer 1100 is unnecessary, and it is easy to reduce the size of the light-emitting element 150.

After the light-emitting element 150 is formed directly on the wafer 1100 by etching, etc., the light-emitting element 150 and the circuit element formed inside the wafer 1100 of the light-emitting element 150 are electrically connected by via formation; therefore, a uniform connection structure can be realized, and the reduction of the yield can be suppressed.

According to the embodiment, low-temperature pulsed laser annealing and low-temperature sputtering technology can be used in the processes of forming the conductive layer 1130 and/or the semiconductor layer 1150 on the wafer 1100 in which the circuit 101 is made. Such film formation technology can be performed in a low-temperature environment of about 500° C.; therefore, the damage to the wafer 1100, the circuit element inside the wafer 1100, etc., can be minimized, and the yield of the product can be increased.

According to the embodiment, the light-emitting element 150 is formed in a higher layer than the transistor 103, etc. The light-emitting element 150 that is formed in a different layer and the circuit 101 including the transistor 103, etc., are connected to each other by the via 161d formed to extend through the second and first inter-layer insulating films 156 and 112. Thus, a uniform connection structure can be easily realized using technically-established multilevel wiring technology, and the yield can be increased. Accordingly, the reduction of the yield due to connection defects of the light-emitting elements, etc., is suppressed.

In the image display device 1 of the embodiment, the light-emitting element 150 is formed on the connection plate 130a and is electrically connected to the connection plate 130a at the bottom surface 151B. The connection plate 130a is a metal material and is highly conductive. Therefore, the n-type semiconductor layer 151 of the light-emitting element 150 can be electrically connected with other circuits with low resistance.

The n-type semiconductor layer 151 of the lower layer is connected at the bottom surface 151B to the connection plate 130a that has a high conductivity; it is therefore unnecessary to form a connection part in a lateral direction, and the thickness of the entire light-emitting element 150 can be reduced. Accordingly, the thickness of the second inter-layer insulating film 156 also can be reduced, and the vias 161d and 161k can have shallower depths and smaller diameters. Therefore, the patterning accuracy of the via holes for forming the vias 161d and 161k can be substantially increased.

The connection plate 130a can be formed of a light-reflective metal material such as Cu, Hf, etc. When projected onto the XY plane, the outer perimeter of the connection plate 130a is formed to include the outer perimeter of the light-emitting element 150 when the light-emitting element 150 is projected. That is, the outer perimeter of the light-emitting element 150 is located within the outer perimeter of the connection plate 130a when projected onto the XY plane. Therefore, the connection plate 130a also can function as a light-reflecting plate, reflect downward-scattered light of the light-emitting element 150, etc., toward the light-emitting surface 153S side, and substantially improve the luminous efficiency of the light-emitting element 150.

Second Embodiment

Figure 13:
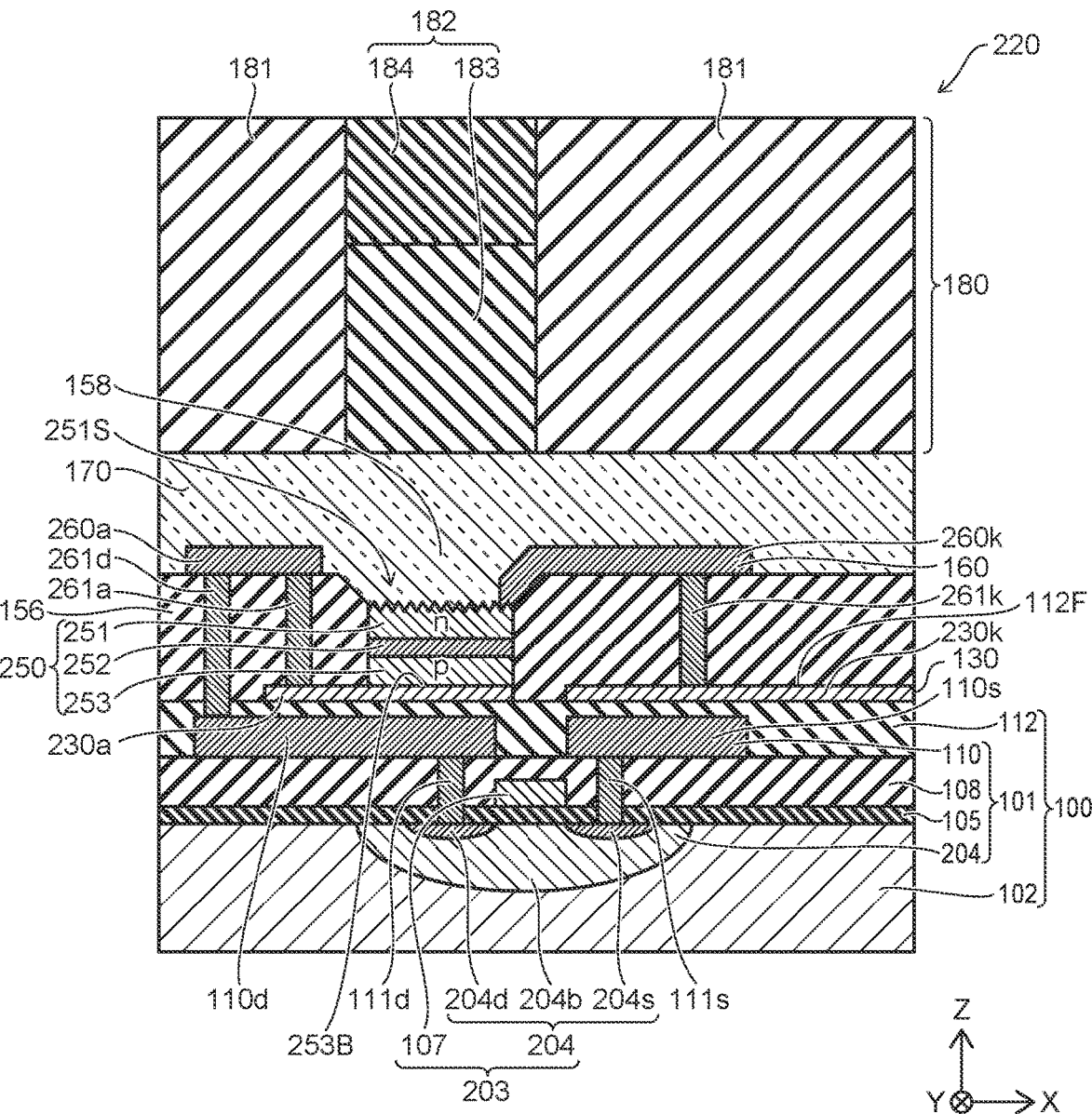
FIG. 13 is a schematic cross-sectional view illustrating a portion of an image display device according to a second embodiment.

FIG. 13 is a schematic cross-sectional view illustrating a portion of an image display device according to the embodiment.

The embodiment differs from the other embodiment described above in that an n-type semiconductor layer 251 provides a light-emitting surface 251S, and the configuration of a transistor 203 is different. The same components as those of the other embodiment are marked with the same reference numerals, and a detailed description is omitted as appropriate.

As shown in FIG. 13, a subpixel 220 of the image display device of the embodiment includes the transistor 203, the first wiring layer 110, the first inter-layer insulating film 112, the conductive layer 130, a light-emitting element 250, the second inter-layer insulating film 156, the second wiring layer 160, and a via (a first via) 261d.

The transistor 203 is formed in the substrate 102. In addition to the transistor 203 for driving the light-emitting element 250, other circuit elements such as transistors, capacitors, etc., are formed in the substrate 102, and the circuit 101 is configured using wiring parts, etc. For example, the transistor 203 corresponds to a drive transistor 226 shown in FIG. 14 below; the drive transistor 226, a select transistor 224, a capacitor 228, etc., are circuit elements. In the following description, the circuit 101 includes an element formation region 204 in which circuit elements are formed, the insulating layer 105, the first wiring layer 110, the vias 111d and 111s, and the insulating film 108. The substrate 102, the insulating layer 105, the first wiring layer 110, the vias 111d and 111s, and the insulating film 108 have the same functions as those of the other embodiment described above, and are formed of the same materials. Similarly to the other embodiment described above, other components such as the substrate 102, the circuit 101, the first inter-layer insulating film 112, etc., are referred to as being included in the circuit board 100.

The transistor 203 includes an n-type semiconductor region 204b, p-type semiconductor regions 204s and 204d, and the gate 107. The gate 107 is located on the n-type semiconductor region 204b with the insulating layer 105 interposed. The insulating layer 105 is provided to insulate the element formation region 204 and the gate 107 and to sufficiently isolate from the other adjacent circuit elements. A channel may be formed in the n-type semiconductor region 204b when a voltage is applied to the gate 107. The transistor 203 is a p-channel transistor, e.g., a p-channel MOSFET.

The element formation region 204 is located in the substrate 102. The element formation region 204 is formed from the surface of the substrate 102 in the depth direction of the substrate 102, i.e., the negative direction of the Z-axis. The element formation region 204 includes the n-type semiconductor region 204b and the p-type semiconductor regions 204s and 204d. The p-type semiconductor regions 204s and 204d are provided to be separated from each other at the surface vicinity of the element formation region 204. The n-type semiconductor region 204b is formed to surround the peripheries of the p-type semiconductor regions 204s and 204d and is located also between the p-type semiconductor regions 204s and 204d when projected onto the XY plane. The n-type semiconductor region 204b also is formed below each of the p-type semiconductor regions 204s and 204d.

In the transistor 203, a channel is formed in the n-type semiconductor region 204b when a voltage lower than that of the p-type semiconductor region 204s is applied to the gate 107. The current that flows between the p-type semiconductor regions 204s and 204d is controlled by the voltage of the gate 107 with respect to the p-type semiconductor region 204s.

The conductive layer 130 is formed on the planarized surface 112F of the first inter-layer insulating film 112. The conductive layer 130 includes a connection plate (the first part) 230a and internal wiring (a third wiring part) 230k. The connection plate 230a and the internal wiring 230k are separated from each other and can be set to different potentials. For example, the internal wiring 230k is connected to the ground line 4 of the circuit of FIG. 14 below. The connection plate 230a is provided for each light-emitting element 250.

The light-emitting element 250 is located on the connection plate 230a. When projected onto the XY plane, the outer perimeter of the connection plate 230a is set to include the outer perimeter of the light-emitting element 250 when the light-emitting element 250 is projected onto the connection plate 230a. That is, the outer perimeter of the light-emitting element 250 is located within the outer perimeter of the connection plate 230a when projected onto the XY plane. Therefore, similarly to the other embodiment described above, the downward-scattered light of the light-emitting element 250, etc., can be reflected toward the light-emitting surface 251S side, and the luminous efficiency of the light-emitting element 250 is substantially improved.

The light-emitting element 250 includes the light-emitting surface 251S. Similarly to the other embodiment described above, the light-emitting element 250 is a prismatic or cylindrical element including a bottom surface 253B on the connection plate 230a. In the light-emitting element 250, the light-emitting surface 251S is the surface at the side opposite to the bottom surface 253B. The bottom surface 253B is connected to the connection plate 230a.

The light-emitting element 250 includes a p-type semiconductor layer 253, a light-emitting layer 252, and the n-type semiconductor layer 251. The p-type semiconductor layer 253, the light-emitting layer 252, and the n-type semiconductor layer 251 are stacked in this order from the bottom surface 253B toward the light-emitting surface 251S. According to the embodiment, the light-emitting surface 251S is provided by the n-type semiconductor layer 251.

The light-emitting element 250 has a shape similar to the light-emitting element 150 shown in FIG. 1 when projected onto the XY plane. In the light-emitting element 250, an appropriate shape is selected according to the layout of the circuit elements, etc.

The light-emitting element 250 is a light-emitting diode similar to the light-emitting element 150 of the other embodiment described above.

The second wiring layer 160 is located on the second inter-layer insulating film 156. The second wiring layer 160 includes wiring parts 260a and 260k. In the example, a portion of the wiring part 260a is located above the connection plate 230a. Another part of the wiring part 260a is located further outward than the outer perimeter of the connection plate 230a when projected onto the XY plane. In the example, a portion of the wiring part 260k is located on the light-emitting surface 251S, and one end of the wiring part 260k is connected to the light-emitting surface 251S. Another part of the wiring part 260k is located above the internal wiring 230k.

The via (the first via) 261d is provided to extend through the second and first inter-layer insulating films 156 and 112 and reach the wiring part 110d. The via 261d is located between the wiring part 260a and the connection plate (the first part) 230a and electrically connects the wiring part 260a and the connection plate 230a.

A via (a second via) 261a is provided to extend through the second inter-layer insulating film 156 and reach the connection plate 230a. The via 261a is located between the wiring part (the first wiring part) 260a and the connection plate 230a and electrically connects the wiring part 260a and the connection plate 230a.

The p-type semiconductor layer 253 is electrically connected to the wiring part 110d via the connection plate 230a, the via 261a, the wiring part 260a, and the via 261d. The wiring part 110d is electrically connected to the p-type semiconductor region 204d, i.e., the drain electrode of the transistor 203, by the via 111d.

A via (a third via) 261k is provided to extend through the second inter-layer insulating film 156 and reach the internal wiring (the third wiring part) 230k. The via 261k is located between the wiring part (a second wiring part) 260k and the internal wiring 230k and electrically connects the wiring part 260k and the internal wiring 230k.

Figure 14:
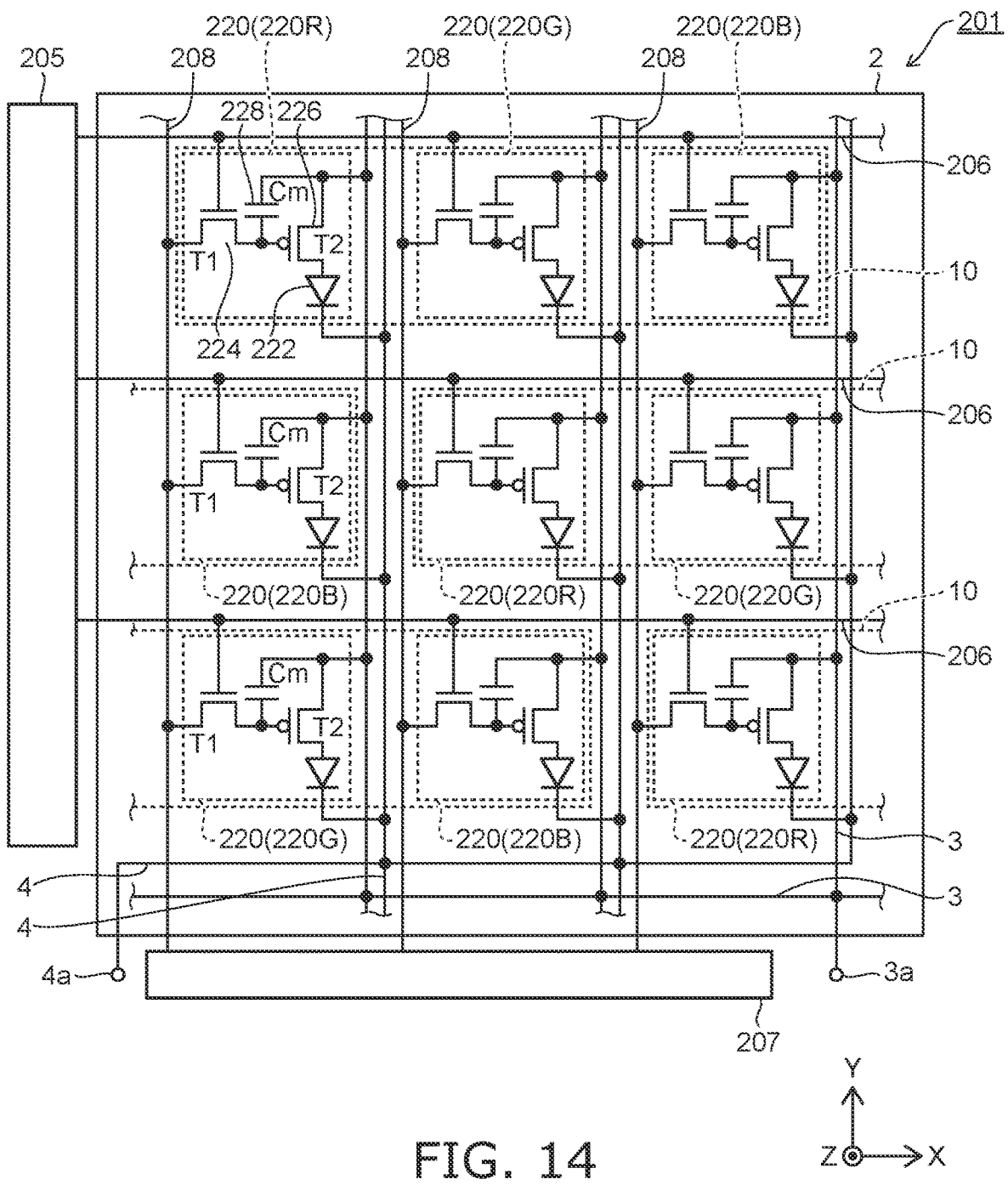
FIG. 14 is a schematic block diagram illustrating the image display device of the second embodiment.

For example, the n-type semiconductor layer 251 is electrically connected to the ground line 4 of the circuit shown in FIG. 14 via the wiring part 260k, the via 261k, and the internal wiring 230k.

Similarly to the other embodiment described above, the second wiring layer 160 and the light-emitting surface 251S may be connected by a light-transmitting electrode. As in the modification of the other embodiment, the light-transmitting second inter-layer insulating film 156a shown in FIG. 3B may be used instead of the second inter-layer insulating film 156.

In the subpixel 220, the surface resin layer 170 is located on the second inter-layer insulating film 156 and the second wiring layer 160, and the color filter 180 is located on the surface resin layer 170.

FIG. 14 is a schematic block diagram illustrating the image display device according to the embodiment.

As shown in FIG. 14, the image display device 201 of the embodiment includes the display region 2, a row selection circuit 205, and a signal voltage output circuit 207. In the display region 2, similarly to the other embodiment described above, for example, the subpixels 220 are arranged in a lattice shape in the XY plane.

Similarly to the other embodiment described above, the pixel 10 includes multiple subpixels 220 that emit light of different colors. A subpixel 220R emits red light. A subpixel 220G emits green light. A subpixel 220B emits blue light. The light emission color and luminance of one pixel 10 are determined by the three types of the subpixels 220R, 220G, and 220B emitting light of the desired luminances.

One pixel 10 includes three subpixels 220R, 220G, and 220B; for example, the subpixels 220R, 220G, and 220B are arranged in a straight line along the X-axis as in the example. In the pixels 10, subpixels of the same color may be arranged in the same column, or subpixels of different colors may be arranged in each column as in the example.

The subpixel 220 includes a light-emitting element 222, the select transistor 224, the drive transistor 226, and the capacitor 228. In FIG. 14, the select transistor 224 may be displayed as T1, the drive transistor 226 may be displayed as T2, and the capacitor 228 may be displayed as Cm.

According to the embodiment, the light-emitting element 222 is located at the ground line 4 side, and the drive transistor 226 that is connected in series to the light-emitting element 222 is located at the power supply line 3 side. That is, the drive transistor 226 is connected to a higher potential side than the light-emitting element 222. The drive transistor 226 is a p-channel transistor.

The select transistor 224 is connected between a signal line 208 and the gate electrode of the drive transistor 226. The capacitor 228 is connected between the power supply line 3 and the gate electrode of the drive transistor 226.

To drive the drive transistor 226 that is a p-channel transistor, the signal voltage output circuit 207 supplies, to the signal line 208, a signal voltage that has a different polarity from that of the other embodiment described above.

According to the embodiment, because the polarity of the drive transistor 226 is a p-channel, the polarity of the signal voltage and the like are different from those of the other embodiment described above. Specifically, the row selection circuit 205 supplies a select signal to a scanning line 206 to sequentially select one row from the arrangement of the m rows of the subpixels 220. The signal voltage output circuit 207 supplies a signal voltage having an analog voltage value necessary for each subpixel 220 of the selected row. The drive transistors 226 of the subpixels 220 of the selected row allow currents corresponding to the signal voltages to flow in the light-emitting elements 222. The light-emitting elements 222 emit light of luminances corresponding to the currents flowing in the light-emitting elements 222.

A method for manufacturing the image display device of the embodiment will now be described.

FIGS. 15A to 16B are schematic cross-sectional views illustrating the method for manufacturing the image display device of the embodiment.

The wafer 1100 of the other embodiment described above with reference to FIG. 6A can be used in the example. However, according to the embodiment, the circuit 101 that is formed inside the wafer 1100 includes the element formation region 204 and the transistor 203. In the following description, the process of FIG. 15A and subsequent processes are applied after the process of FIG. 6A.

Figure 15A:
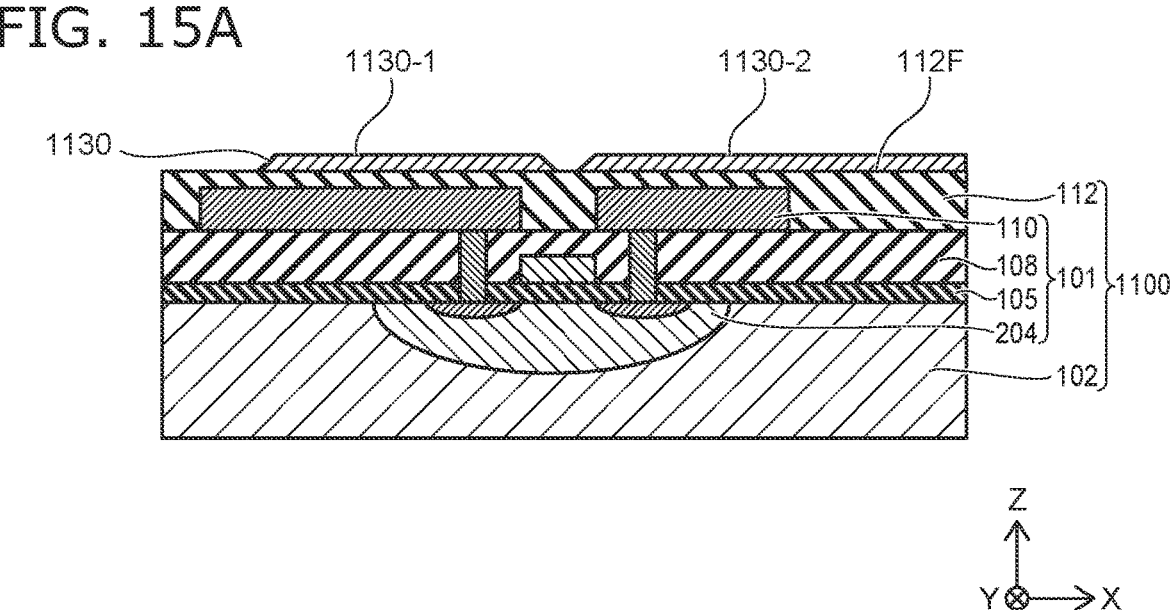
FIG. 15A is a schematic cross-sectional view illustrating a method for manufacturing the image display device of the second embodiment.

According to the method for manufacturing the image display device of the embodiment as shown in FIG. 15A, the conductive layer 1130 is formed on the planarized surface 112F of the wafer 1100. The conductive layer 1130 is patterned and includes conductive parts 1130-1 and 1130-2. The conductive parts 1130-1 and 1130-2 are separated from each other.

Figure 15B:
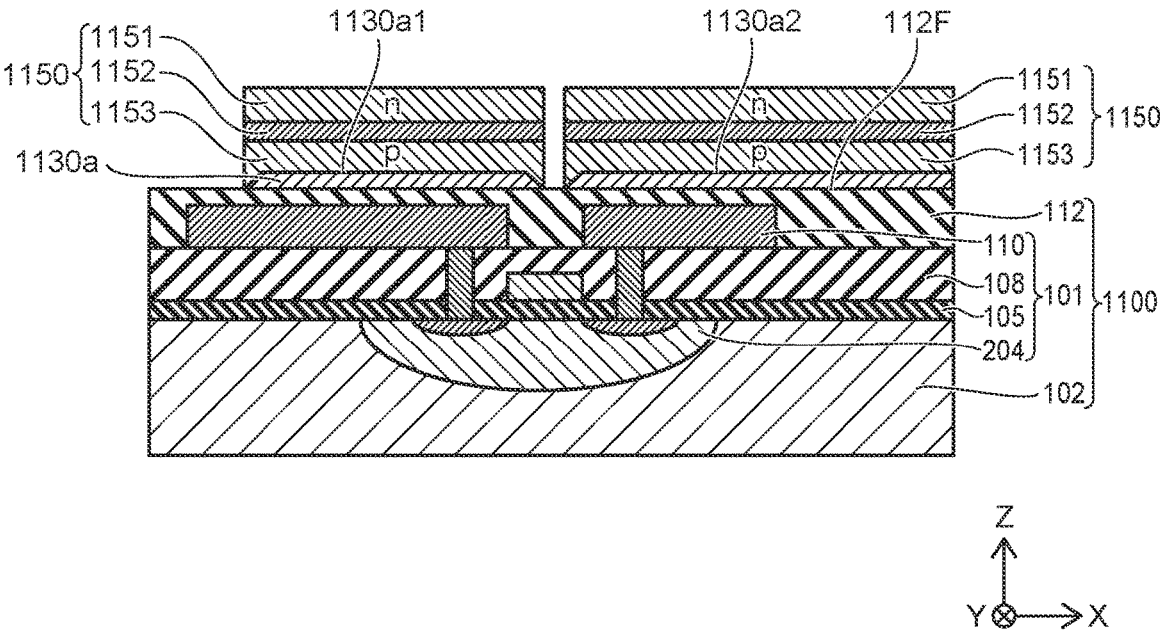
FIG. 15B is a schematic cross-sectional view illustrating the method for manufacturing the image display device of the second embodiment.

As shown in FIG. 15B, monocrystallization treatment of the conductive parts 1130-1 and 1130-2 shown in FIG. 15A is performed to form the monocrystallized conductive layer 1130a on the planarized surface 112F. The monocrystallized conductive layer 1130a includes conductive parts 1130a1 and 1130a2 that are separated from each other. The conductive part 1130a1 is the monocrystallized conductive part 1130-1, and the conductive part 1130a2 is the monocrystallized conductive part 1130-2.

The semiconductor layer 1150 is formed on each of the conductive parts 1130a1 and 1130a2. According to the embodiment, the semiconductor layer 1150 includes the p-type semiconductor layer 1153, the light-emitting layer 1152, and the n-type semiconductor layer 1151 formed in this order from the conductive layer 1130a in the positive direction of the Z-axis. The semiconductor layer 1150 is formed using film formation technology similar to that of the other embodiment described above. In other words, to form the semiconductor layer 1150, physical vapor deposition such as vapor deposition, ion beam deposition, MBE, or the like is used, and it is favorable to use low-temperature sputtering.

Similarly to the other embodiment described above, there are cases where deposits that include materials of the growth species are deposited on the planarized surface 112F at which the conductive layer 1130a does not exist.

Figure 16A:
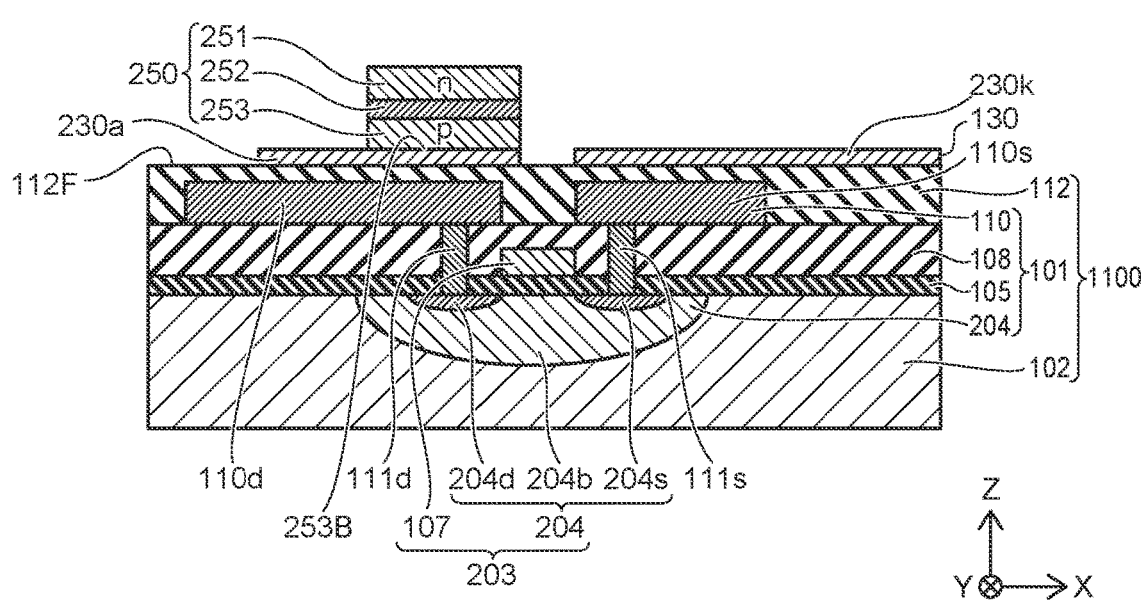
FIG. 16A is a schematic cross-sectional view illustrating the method for manufacturing the image display device of the second embodiment.

As shown in FIG. 16A, the semiconductor layer 1150 on the conductive part 1130a1 shown in FIG. 15B is patterned into the desired shape by etching to form the light-emitting element 250. The entire semiconductor layer 1150 on the conductive part 1130a2 shown in FIG. 15B is removed. The conductive part 1130a1 shown in FIG. 15B is patterned by etching to form the connection plate 230a. The conductive part 1130a2 shown in FIG. 15B is patterned by etching to form the internal wiring 230k.

Figure 16B:
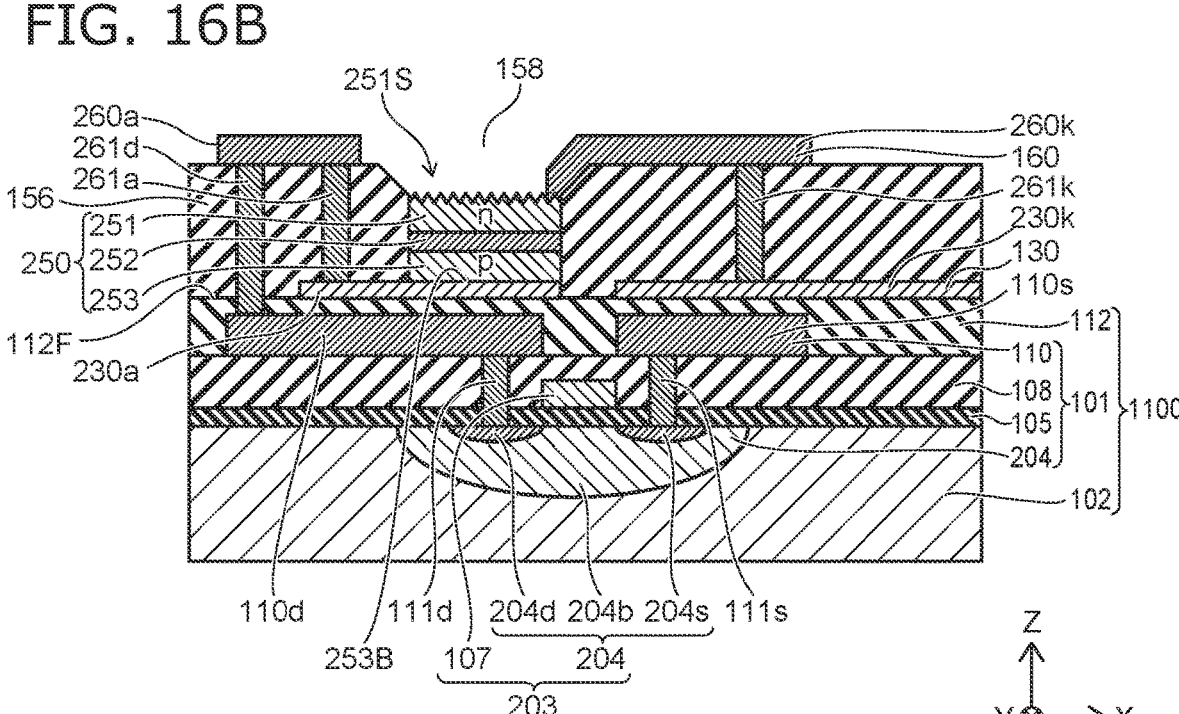
FIG. 16B is a schematic cross-sectional view illustrating the method for manufacturing the image display device of the second embodiment.

As shown in FIG. 16B, the second inter-layer insulating film 156 is formed to cover the planarized surface 112F, the connection plate 230a, the internal wiring 230k, and the light-emitting element 250. The other parts of the conductive layer 130 also are covered with the second inter-layer insulating film 156.

The opening 158 is formed by removing a portion of the second inter-layer insulating film 156. The light-emitting surface 251S is exposed from under the second inter-layer insulating film 156 via the opening 158. Similarly to the other embodiment described above, it is favorable to roughen the light-emitting surface 251S.

The via 261*d* is formed to extend through the second and first inter-layer insulating films 156 and 112 and reach the wiring part 110*d*. The via 261*a* is formed to extend through the second inter-layer insulating film 156 and reach the connection plate 230*a*. The via 261*k* is formed to extend through the second inter-layer insulating film 156 and reach the internal wiring 230*k*.

The second wiring layer 160 that includes the wiring parts 260*a* and 260*k* is formed on the second inter-layer insulating film 156. The wiring part 260*a* is connected to the vias 261*d* and 261*a*. The wiring part 260*k* is connected to the via 261*k*.

Thereafter, the subpixel 220 of the image display device 201 of the embodiment is formed by providing the color filter 180, etc.

Effects of the image display device of the embodiment will now be described.

The image display device of the embodiment has effects similar to those of the other embodiment described above. Specifically, in the image display device of the embodiment, the manufacturing processes can be markedly reduced compared to when singulated light-emitting elements are individually transferred. In the image display device of the embodiment, the circuit that drives the light-emitting element 250 having the n-type semiconductor layer 251 as the light-emitting surface 251S can be configured by setting the polarity of the transistor 203 to be a p-channel. A portion of the conductive layer 130 can be used as the internal wiring 230*k*. Accordingly, the image display device of the embodiment is advantageous in that the degree of freedom of the circuit element arrangement and circuit design is increased, etc.

Third Embodiment

Figure 17:
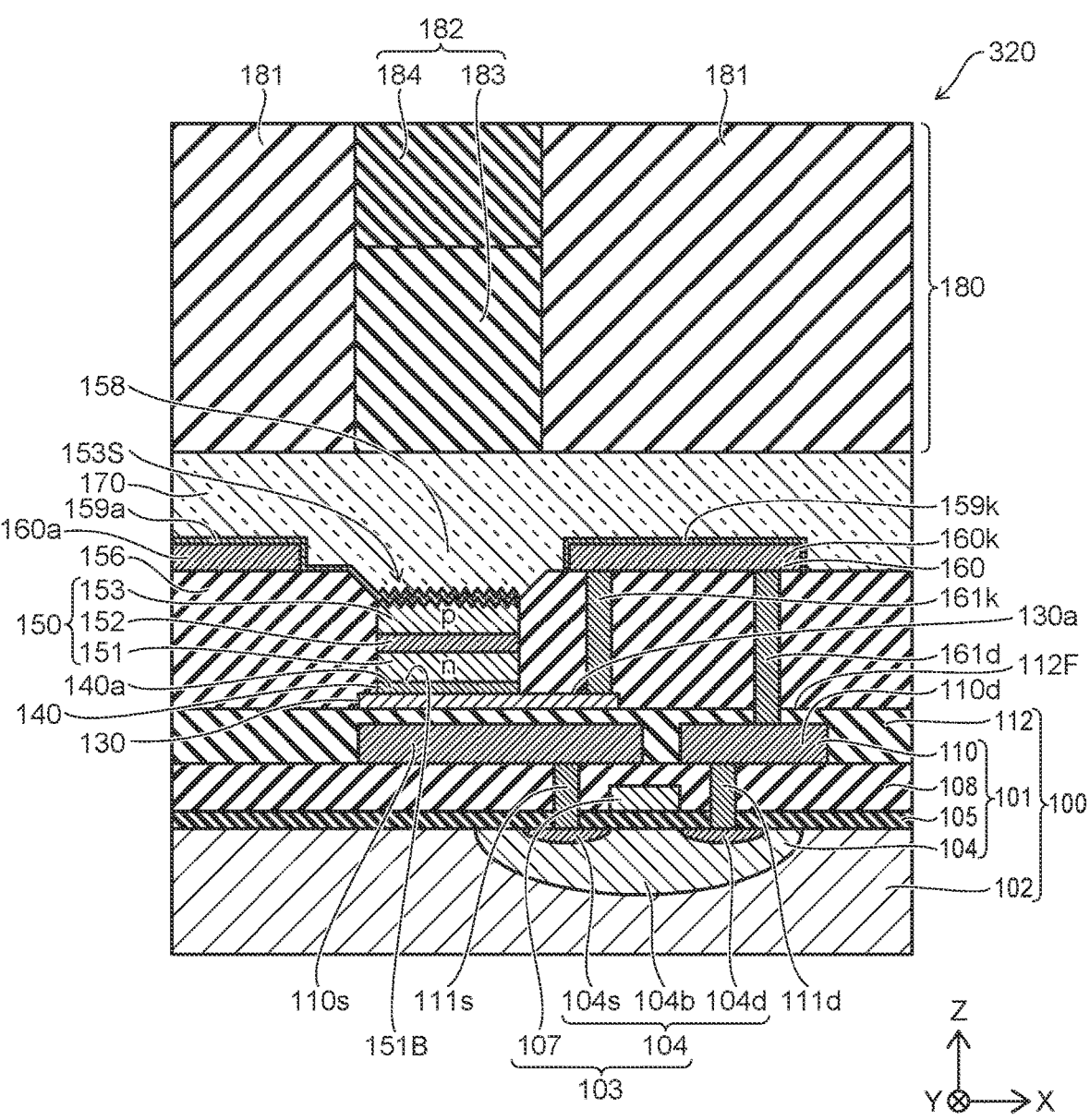
FIG. 17 is a schematic cross-sectional view illustrating a portion of an image display device according to a third embodiment.

FIG. 17 is a schematic cross-sectional view illustrating a portion of an image display device according to the embodiment.

The embodiment differs from the other embodiments described above in that a graphene layer 140 is located on the conductive layer 130, and a graphene sheet 140*a* is located between the connection plate 130*a* and the light-emitting element 150. The same components as those of the other embodiments described above are marked with the same reference numerals, and a detailed description is omitted as appropriate.

As shown in FIG. 17, a subpixel 320 of the image display device of the embodiment includes the graphene layer 140. The graphene layer 140 is located on the conductive layer 130. The graphene layer 140 includes the graphene sheet (a graphene-including layer) 140*a*. The graphene sheet 140*a* is located between the connection plate 130*a* and the light-emitting element 150. The graphene sheet 140*a* is conductive, and therefore electrically connects the light-emitting element 150 and the connection plate 130*a*. The graphene layer 140 and the graphene sheet 140*a* are layered bodies in which several layers to about 10 layers of single-layer graphene are stacked.

The outer perimeter of the graphene sheet 140*a* substantially matches the outer perimeter of the light-emitting element 150 when projected onto the XY plane.

According to the embodiment, the light-emitting element 150 is configured similarly to that of the first embodiment. Namely, the n-type semiconductor layer 151, the light-emitting layer 152, and the p-type semiconductor layer 153 are stacked in this order from the bottom surface 151B toward the light-emitting surface 153S.

The bottom surface 151B is the n-type semiconductor layer 151, and the n-type semiconductor layer 151 is electrically connected to the connection plate 130*a* via the graphene sheet 140*a*. Although the light-emitting surface 153S is roughened in the example, the roughening also can be omitted.

The configurations of the circuit board 100 including the transistor 103 and the like, the second inter-layer insulating film 156, the vias 161*d* and 161*k*, the second wiring layer 160, and the color filter 180 are similar to those of the first embodiment, and a detailed description is omitted as appropriate.

A method for manufacturing the image display device of the embodiment will now be described.

FIGS. 18A to 19B are schematic cross-sectional views illustrating the method for manufacturing the image display device of the embodiment.

Figure 18A:
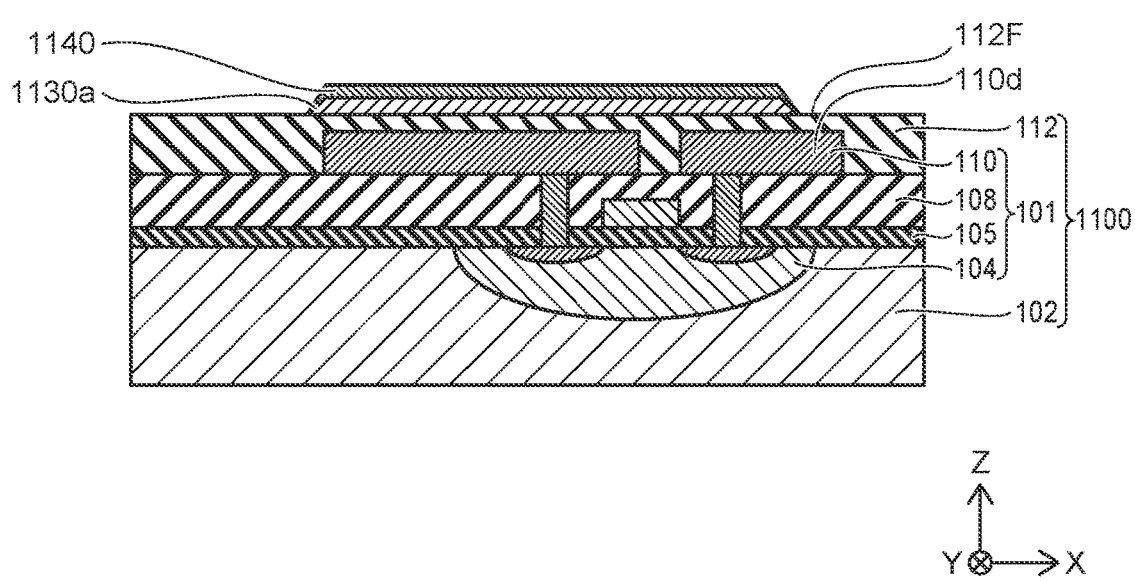
FIG. 18A is a schematic cross-sectional view illustrating a method for manufacturing the image display device of the third embodiment.

In the description of the embodiment, the process shown in FIG. 18A is performed after the process described with reference to FIG. 6B.

As shown in FIG. 18A, a graphene layer (a graphene-including layer) 1140 is patterned to be formed over the conductive layer 1130*a*. The conductive layer 1130*a* is formed by monocrystallizing the conductive layer 1130 shown in FIG. 6B by annealing treatment. For example, the graphene layer 1140 is formed by a low-temperature process technique such as pulse sputtering, etc.

Figure 18B:
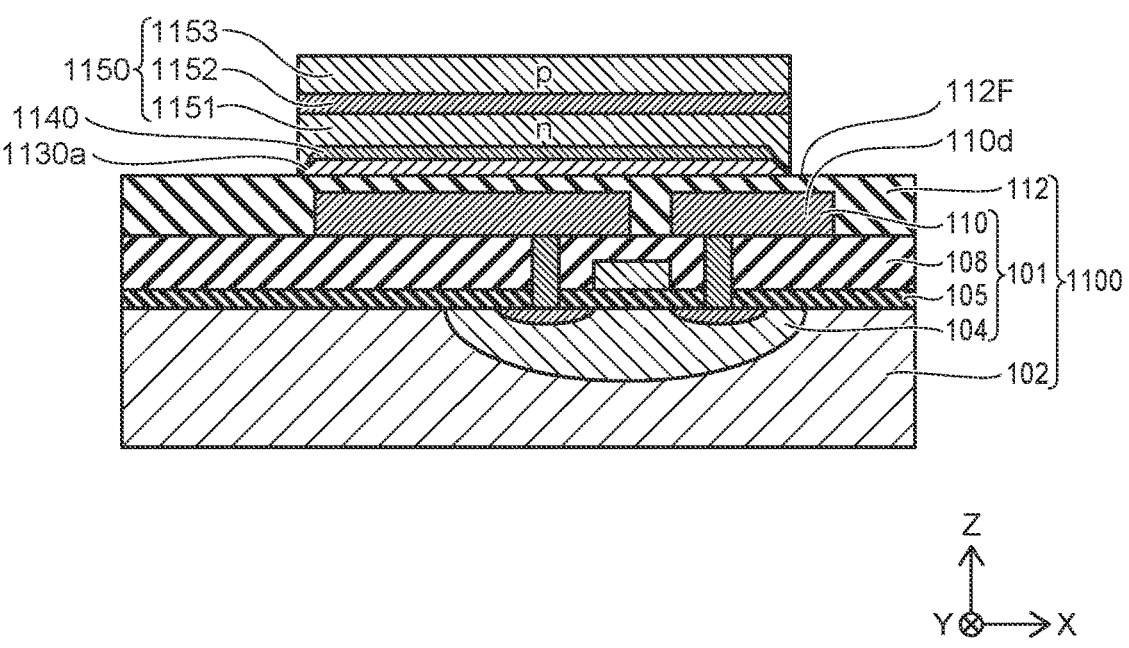
FIG. 18B is a schematic cross-sectional view illustrating the method for manufacturing the image display device of the third embodiment.

As shown in FIG. 18B, the semiconductor layer 1150 is formed over the graphene layer 1140. According to the embodiment, the semiconductor layer 1150 includes the n-type semiconductor layer 1151, the light-emitting layer 1152, and the p-type semiconductor layer 1153 formed in this order from the conductive layer 1130*a* and graphene layer 1140 side in the positive direction of the Z-axis.

To form the semiconductor layer 1150, similarly to the other embodiments, physical vapor deposition such as vapor deposition, ion beam deposition, MBE, sputtering, or the like is used, and it is favorable to use low-temperature sputtering. By growing the GaN semiconductor layer 1150 on the graphene layer 1140, the monocrystallized semiconductor layer 1150 including the light-emitting layer 1152 is formed over the graphene layer 1140 (see Non-Patent Literature 1 and 2, etc.).

It is known that crystal growth of GaN on a layer of graphene is promoted when using pulse sputtering to perform crystal growth of GaN. According to the embodiment, the semiconductor layer 1150 is formed so that the graphene layer 1140 grown over the conductive layer 1130*a* which is a single-crystal metal layer is interposed; therefore, the semiconductor layer 1150 that includes a high-quality GaN crystal can be more stably formed.

Also, according to the embodiment, the conductive layer 130 and the connection plate 130*a* are formed of single-crystal metal layers, and therefore can be electrically connected with the semiconductor layer 1150 with low resistance.

Figure 19A:
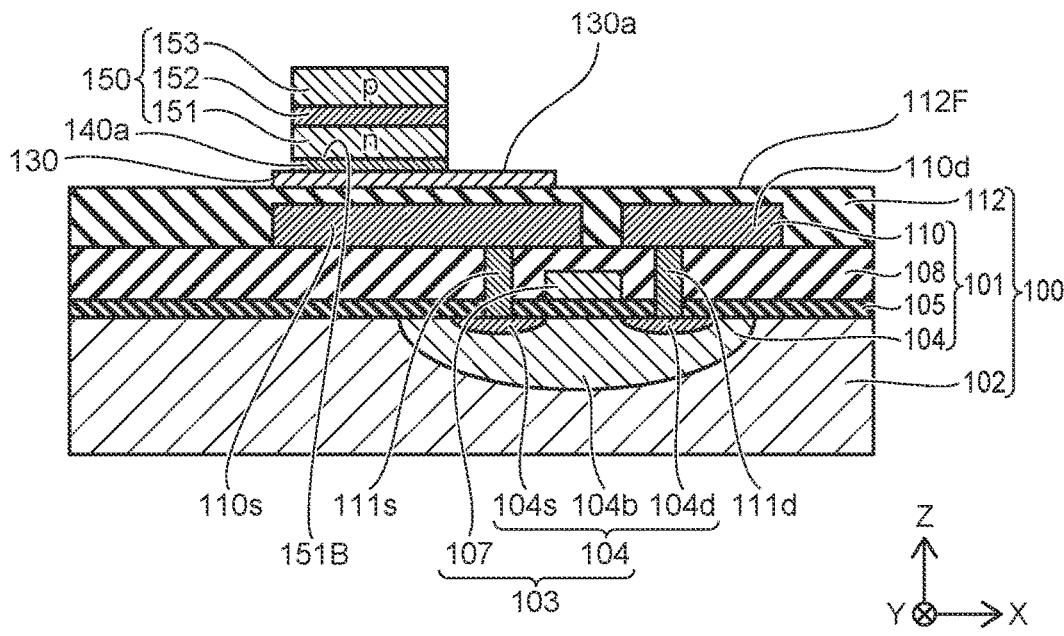
FIG. 19A is a schematic cross-sectional view illustrating the method for manufacturing the image display device of the third embodiment.

As shown in FIG. 19A, the connection plate 130*a* that has the desired shape is formed by shaping the conductive layer 1130*a* shown in FIG. 18B into the conductive layer 130 by etching. The light-emitting element 150 is formed by shaping the semiconductor layer 1150 into the necessary shape by RIE, etc. At this time, the graphene layer 1140 shown in FIG. 18B is over-etched to be shaped into the graphene sheet 140*a* having an outer perimeter shape corresponding to the outer perimeter shape of the light-emitting element 150.

Figure 19B:
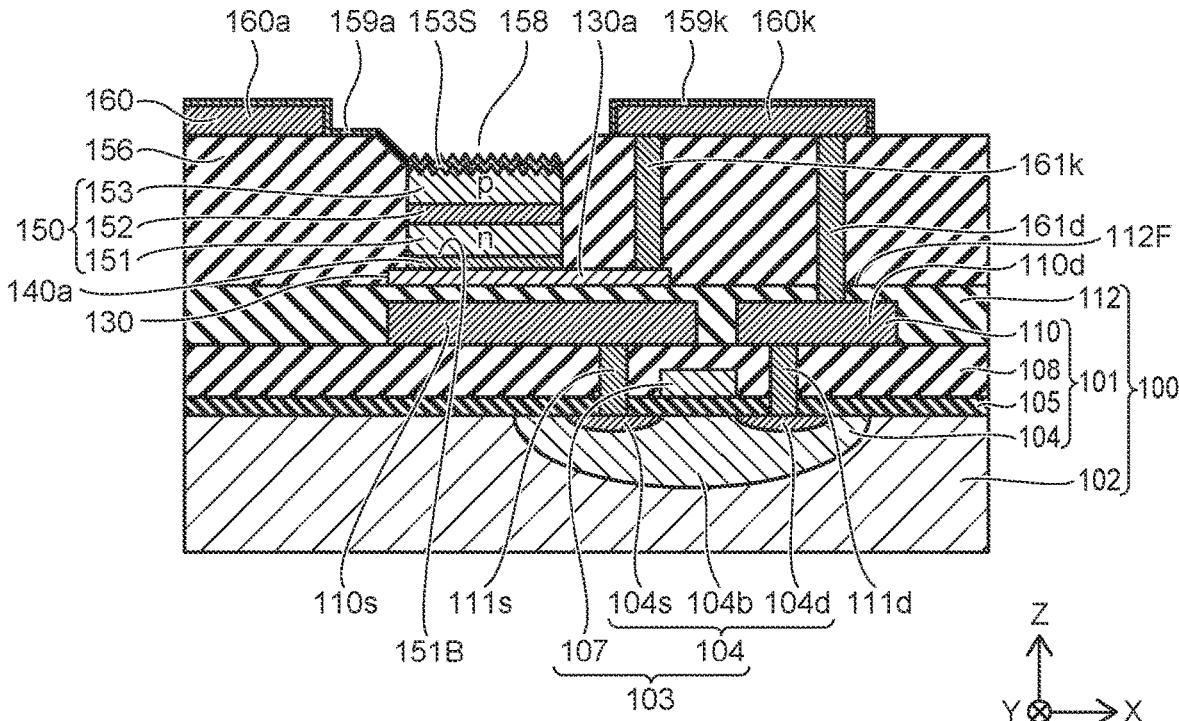
FIG. 19B is a schematic cross-sectional view illustrating the method for manufacturing the image display device of the third embodiment.

As shown in FIG. 19B, the second inter-layer insulating film 156 is formed to cover the planarized surface 112F, the conductive layer 130 including the connection plate 130*a*, the graphene sheet 140*a*, and the light-emitting element 150. Subsequently, similarly to the first embodiment, the opening 158, the vias 161*k* and 161*d*, the second wiring layer 160, and the light-transmitting electrodes 159*k* and 159*a* are formed.

Thereafter, the color filter is formed similarly to the other embodiments.

Effects of the image display device of the embodiment will now be described.

The embodiment has effects similar to those of the other embodiments described above. Namely, in the image display device of the embodiment, the manufacturing processes can be markedly reduced compared to when singulated light-emitting elements are individually transferred. The embodiment also has effects such as the following. Namely, according to the embodiment, the light-emitting element 150 is formed with the graphene sheet 140*a* formed on the connection plate 130*a* of the single-crystal metal interposed. Therefore, in the image display device of the embodiment, the light-emitting element 150 that has a higher-quality crystal structure can be obtained. Accordingly, the yield of the image display device can be increased.

Aspects in which the graphene layer 140 including the graphene sheet 140*a* is added are not limited to the embodiment and are applicable to the modifications of the first and second embodiments described above as well as other embodiments described below.

Fourth Embodiment

Figure 20:
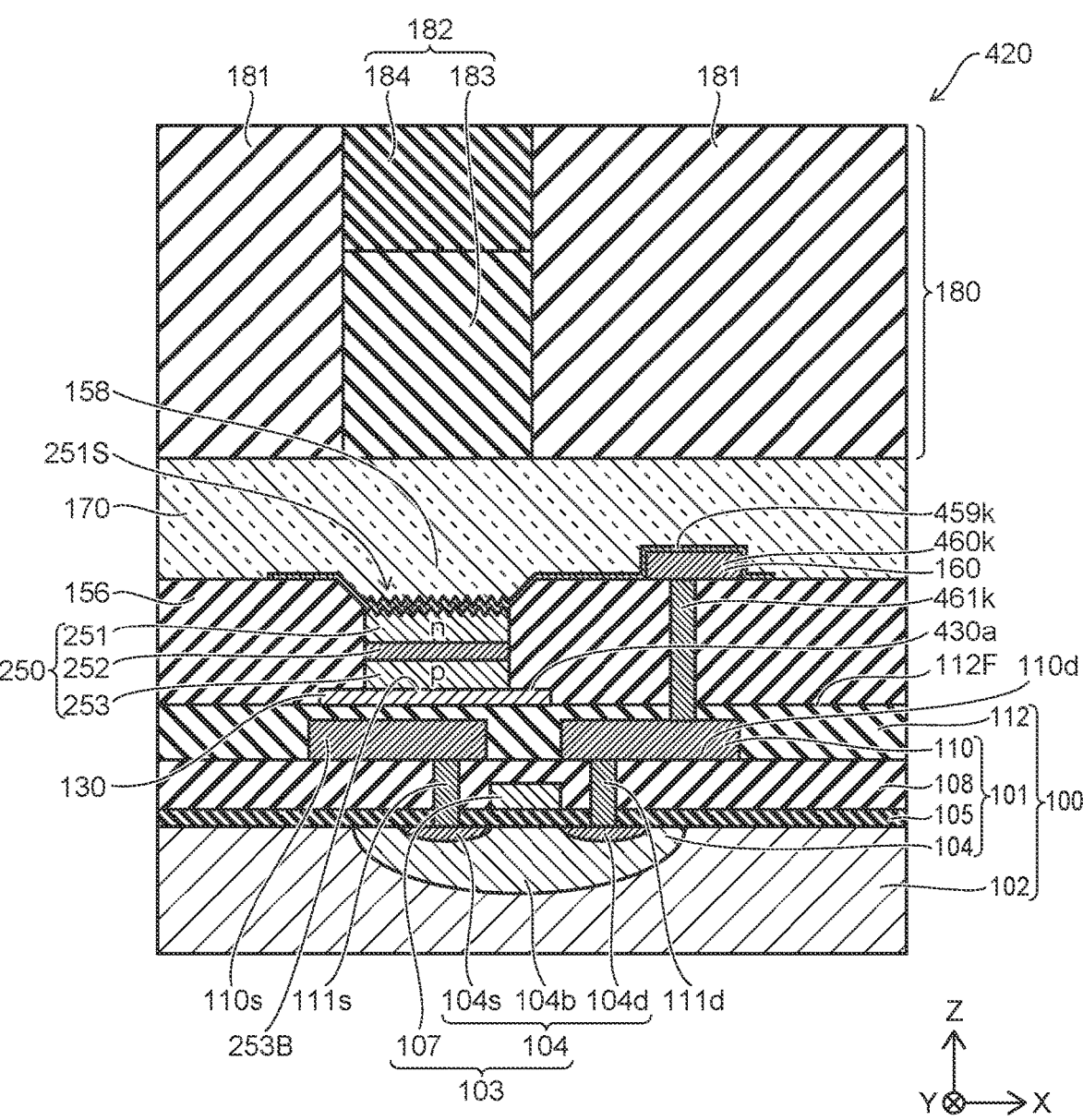
FIG. 20 is a schematic cross-sectional view illustrating a portion of an image display device according to a fourth embodiment.

FIG. 20 is a schematic cross-sectional view illustrating a portion of an image display device according to the embodiment.

The embodiment differs from the other embodiments described above in that a connection plate 430*a* is used as internal wiring. The embodiment differs from the other embodiments described above in that the light-emitting element 250 in which the n-type semiconductor layer 251 is used as the light-emitting surface 251S is driven by the n-type transistor 103. The same components as those of the other embodiments described above are marked with the same reference numerals, and a detailed description is omitted as appropriate.

As shown in FIG. 20, a subpixel 420 of the image display device of the embodiment includes the transistor 103, the first wiring layer 110, the first inter-layer insulating film 112, the conductive layer 130, the light-emitting element 250, the second inter-layer insulating film 156, the second wiring layer 160, and a via 461*k*. The transistor 103 is an n-channel transistor. In the light-emitting element 250, the light-emitting surface 251S is provided by the n-type semiconductor layer 251. The bottom surface 253B of the light-emitting element 250 is located on the connection plate 430*a*, and the p-type semiconductor layer 253 is electrically connected to the connection plate 430*a*.

The connection plate 430*a* is provided similarly to the first embodiment. Specifically, the connection plate 430*a* is located directly under the light-emitting element 250, and when projected onto the XY plane, the outer perimeter of the connection plate 430*a* is set to include the outer perimeter of the light-emitting element 250 when the light-emitting element 250 is projected onto the connection plate 430*a*. That is, the outer perimeter of the light-emitting element 250 is located within the outer perimeter of the connection plate 430*a* when projected onto the XY plane. Therefore, the connection plate 430*a* also functions as a light-reflecting plate, and the substantial luminous efficiency of the light-emitting element 250 is increased.

The embodiment has a circuit configuration in which the light-emitting element 250 is driven by the n-channel transistor 103; for example, the circuit shown in FIG. 4 is applied. The connection plate 430*a* is utilized as internal wiring and is electrically connected to the power supply line 3 of this circuit example.

The second inter-layer insulating film 156 can be similar to that of the other embodiments described above. The via 461*k* is provided to extend through the second and first inter-layer insulating films 156 and 112 and reach the wiring part 110*d*. The second wiring layer 160 includes a wiring part 460*k*, and the via 461*k* is located between the wiring part 460*k* and the wiring part 110*d* and electrically connects the wiring part 460*k* and the wiring part 110*d*. A light-transmitting electrode 459*k* is provided over the wiring part 460*k* and provided over the light-emitting surface 251S. The light-transmitting electrode 459*k* is also located between the wiring part 460*k* and the light-emitting surface 251S and electrically connects the wiring part 460*k* and the light-emitting surface 251S.

Similarly to the other embodiments described above, the color filter 180, etc., also are provided.

In the image display device of the embodiment, the patterned conductive layer 130 includes the connection plate 430*a*; other than allowing the connection plate 430*a* to be connected with the external circuit, the image display device of the embodiment can be manufactured using a manufacturing method similar to that of the other embodiments described above. Accordingly, a detailed description of the details of the manufacturing method is omitted.

Effects of the image display device of the embodiment will now be described.

The image display device of the embodiment has effects similar to those of the other embodiments described above. According to the embodiment, by using the connection plate 430*a* as internal wiring, it is possible to realize a circuit configuration in which the light-emitting element 250 is driven by the n-channel transistor 103, variations of the circuit layout and the like, and flexible circuit design.

Fifth Embodiment

Figure 21:
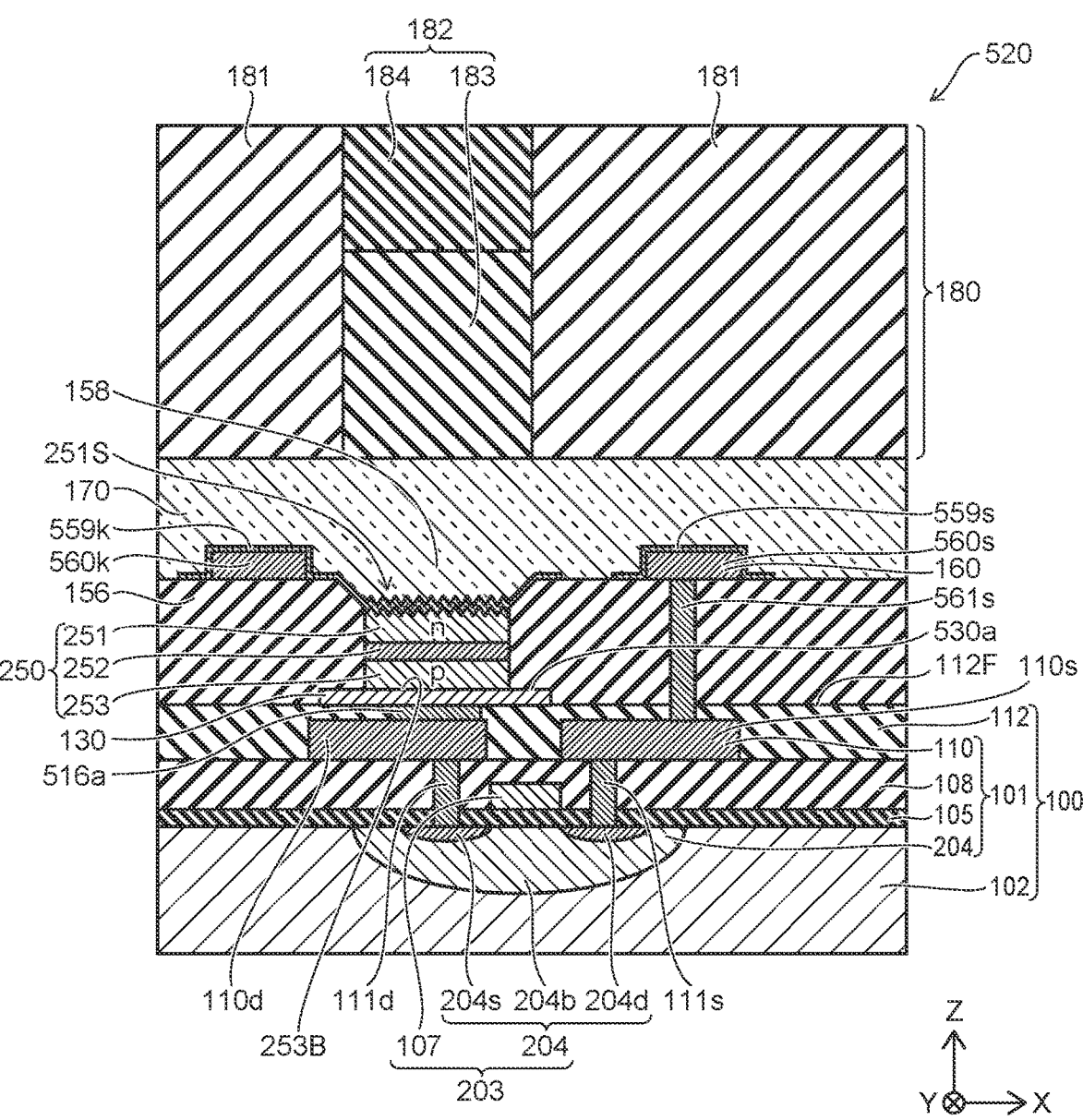
FIG. 21 is a schematic cross-sectional view illustrating a portion of an image display device according to a fifth embodiment.

FIG. 21 is a schematic cross-sectional view illustrating a portion of an image display device according to the embodiment.

The image display device of the embodiment differs from the other embodiments described above in that the first wiring layer 110 and a connection plate 530*a* are connected by a plug 516*a* instead of a via. In the example, the light-emitting element 250 in which the light-emitting surface 251S is the n-type semiconductor layer 251 is driven by the p-channel transistor 203. The same components as those of the other embodiments described above are marked with the same reference numerals, and a detailed description is omitted as appropriate.

As shown in FIG. 21, the image display device of the embodiment includes a subpixel 520. The subpixel 520 includes the transistor 203, the first wiring layer 110, the first inter-layer insulating film 112, the plug 516*a*, the conductive layer 130 including the connection plate 530*a*, the light-emitting element 250, the second inter-layer insulating film 156, a via 561*s*, and the second wiring layer 160.

The plug 516*a* is located between the wiring part (a fourth wiring part) 110*d* and the connection plate (the first part) 530*a* and electrically connects the wiring part 110*d* and the connection plate 530*a*. The side surface of the plug 516*a* is covered with the first inter-layer insulating film 112. The surface of the plug 516*a* connecting the connection plate 530*a* is in substantially the same plane as the planarized surface 112F. That is, the plug 516*a* is embedded in the first inter-layer insulating film 112 and is connected to the connection plate 530*a* in substantially the same plane as the planarized surface 112F.

The conductive layer 130 includes the connection plate 530*a*. The light-emitting element 250 is located on the connection plate 530*a*. The connection plate 530*a* is provided for each light-emitting element 250. The connection plate 530*a* may be connected to or separated from the adjacent connection plates. When projected onto the XY plane, the outer perimeter of the connection plate 530*a* is set to include the outer perimeter of the light-emitting element 250 when the light-emitting element 250 is projected onto the connection plate 530*a*. That is, the outer perimeter of the light-emitting element 250 is located within the outer perimeter of the connection plate 530*a* when projected onto the XY plane.

The p-type semiconductor layer 253 of the light-emitting element 250 is connected to the connection plate 530*a* at the bottom surface 253B. That is, the p-type semiconductor layer 253 is electrically connected to the p-type semiconductor region 204*d* corresponding to the drain electrode of the transistor 203 via the connection plate 530*a*, the plug 516*a*, the wiring part 110*d*, and the via 111*d*.

The second inter-layer insulating film 156 is provided to cover the planarized surface 112F, the conductive layer 130 including the connection plate 530*a*, and the light-emitting element 250.

The second wiring layer 160 that is located on the second inter-layer insulating film 156 includes wiring parts 560*k* and 560*s*. For example, the wiring part 560*k* is connected to the ground line 4 of the circuit of FIG. 14. For example, the wiring part 560*s* is connected to the power supply line 3 of the circuit of FIG. 14.

The via (the first via) 561*s* is provided to extend through the second and first inter-layer insulating films 156 and 112 and reach the wiring part 110*s*. The via 561*s* is located between the wiring part 560*s* and the wiring part 110*s* and electrically connects the wiring part 560*s* and the wiring part 110*s*.

The light-emitting surface 251S is exposed from under the second inter-layer insulating film 156 via the opening 158 formed by removing a portion of the second inter-layer insulating film 156, and a light-transmitting electrode 559*k* is provided over the light-emitting surface 251S. The light-transmitting electrode 559*k* is provided over the wiring part 560*k* and between the light-emitting surface 251S and the wiring part 560*k*. The light-transmitting electrode 559*k* electrically connects the light-emitting surface 251S and the wiring part 560*k*.

A light-transmitting electrode 559*s* is provided over the wiring part 560*s*. For example, together with the wiring part 560*s*, the light-transmitting electrode 559*s* is connected to the power supply line 3 of the circuit of FIG. 14.

Instead of the light-transmitting electrode 559*k*, one end of a wiring part may be directly connected to the light-emitting surface 251S. Light-transmitting conductive films that include the light-transmitting electrodes 559*k* and 559*s* may be used instead of the second wiring layer 160, and the connections to the power supply line 3 and the ground line 4 of the circuit of FIG. 14 may be performed by the light-transmitting electrodes 559*k* and 559*s*.

A method for manufacturing the image display device of the embodiment will now be described.

FIGS. 22A to 24B are schematic cross-sectional views illustrating the method for manufacturing the image display device of the embodiment.

The wafer 1100 of the other embodiment described above described with reference to FIG. 6A can be used in the example. In the following description, the process of FIG. 22A and subsequent processes are applied after the process of FIG. 6A.

Figure 22A:
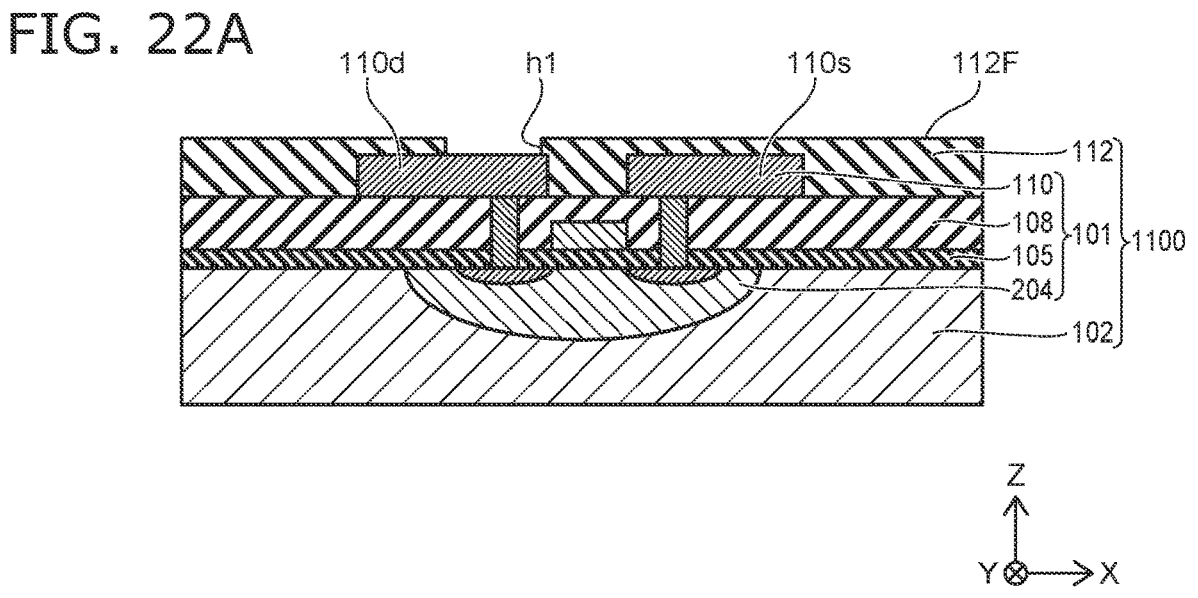
FIG. 22A is a schematic cross-sectional view illustrating a method for manufacturing the image display device of the fifth embodiment.

As shown in FIG. 22A, a contact hole h1 is formed in the first inter-layer insulating film 112 of the prepared wafer 1100. The contact hole h1 is formed at the position at which the wiring part 110*d* will be located when projected onto the XY plane. The contact hole h1 is formed to reach the wiring part 110*d*. The contact hole h1 may be formed to be deeper than the surface of the wiring part 110*d* in the thickness direction of the wiring part 110*d*.

Figure 22B:
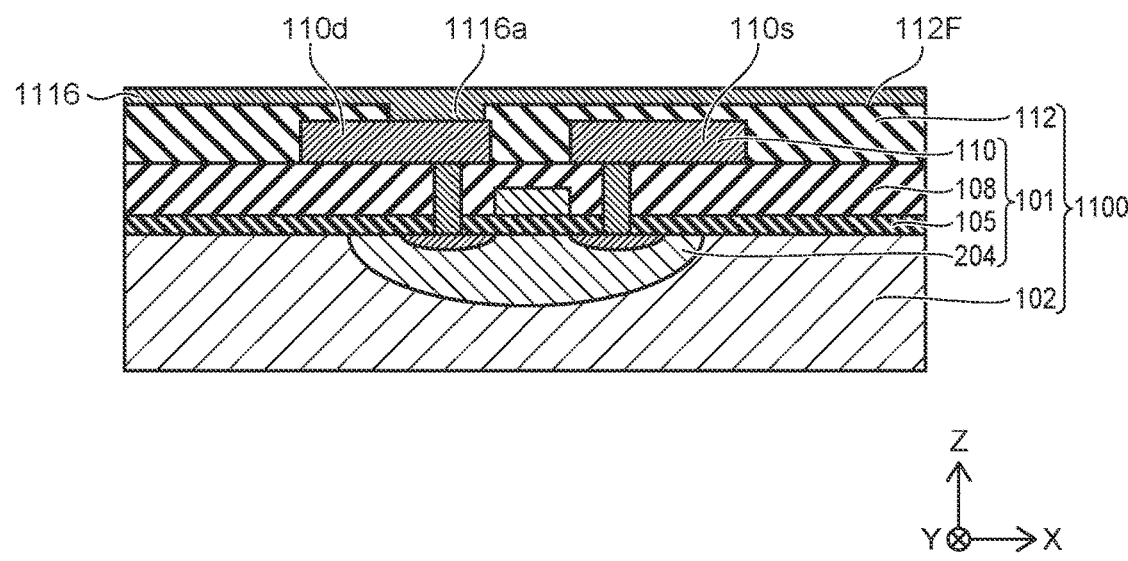
FIG. 22B is a schematic cross-sectional view illustrating the method for manufacturing the image display device of the fifth embodiment.

As shown in FIG. 22B, a metal layer 1116 is formed over the planarized surface 112F of the first inter-layer insulating film 112, the contact hole h1, and the wiring part 110*d* exposed from under the first inter-layer insulating film 112 via the contact hole h1. The material with which the metal layer 1116 is formed also is filled into the contact hole h1 shown in FIG. 22A to form a plug 1116*a*.

Figure 23A:
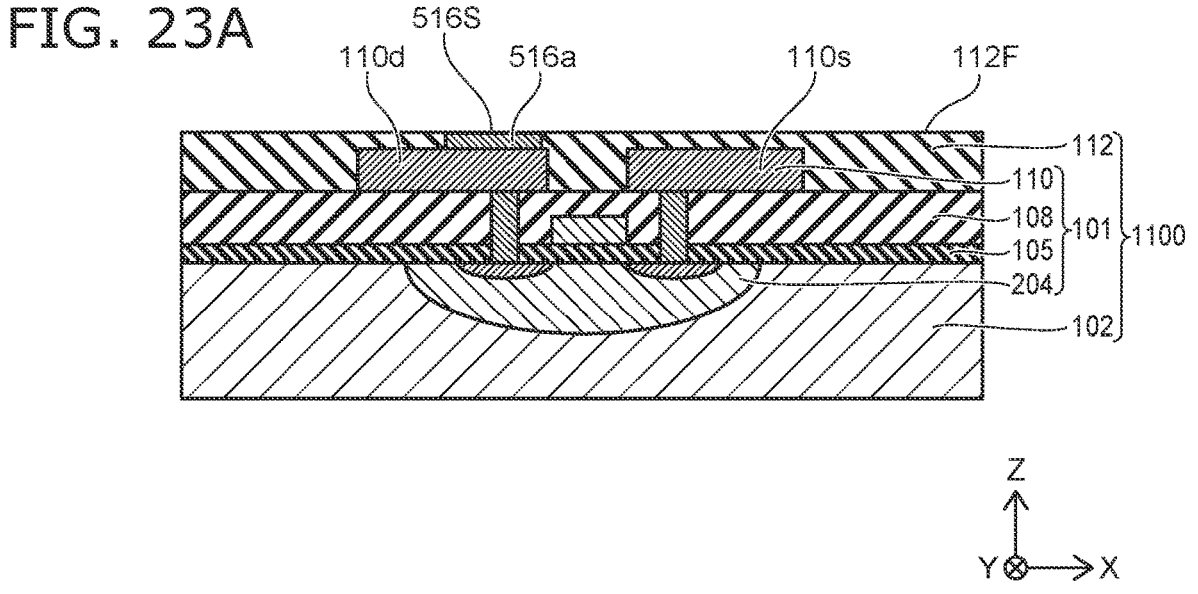
FIG. 23A is a schematic cross-sectional view illustrating the method for manufacturing the image display device of the fifth embodiment.

As shown in FIG. 23A, the metal layer 1116 is polished by, for example, chemical mechanical polishing (CMP), etc., until the planarized surface 112F is exposed from under the metal layer 1116. Although it is unnecessary for the planarized surface 112F to match the initial planarized surface 112F shown in FIG. 22A, the initial planarized surface 112F is exposed in the following description.

In FIG. 23A, a surface 516S of the plug 516*a* exposed from under the metal layer 1116 removed by polishing is in substantially the same plane as the planarized surface 112F without protruding in the positive direction of the Z-axis with respect to the planarized surface 112F and without forming a recess in the negative direction of the Z-axis.

Figure 23B:
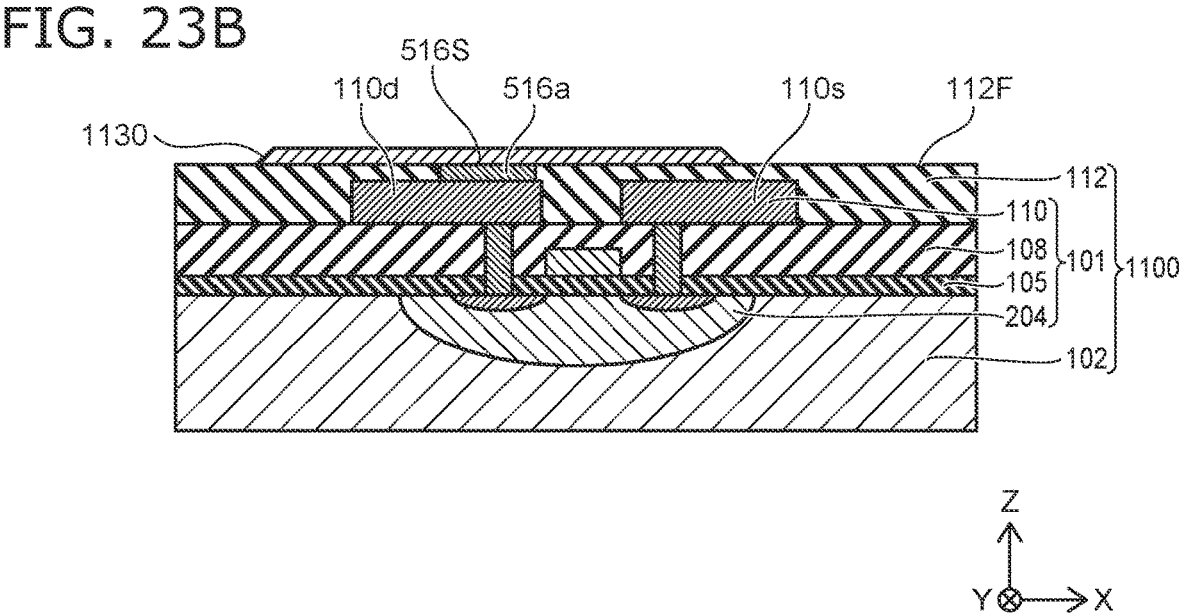
FIG. 23B is a schematic cross-sectional view illustrating the method for manufacturing the image display device of the fifth embodiment.

As shown in FIG. 23B, the patterned conductive layer 1130 is formed over the planarized surface 112F and the surface 516S of the plug 516*a*. At this time, the conductive layer 1130 is electrically connected with the plug 516*a*.

Figure 24A:
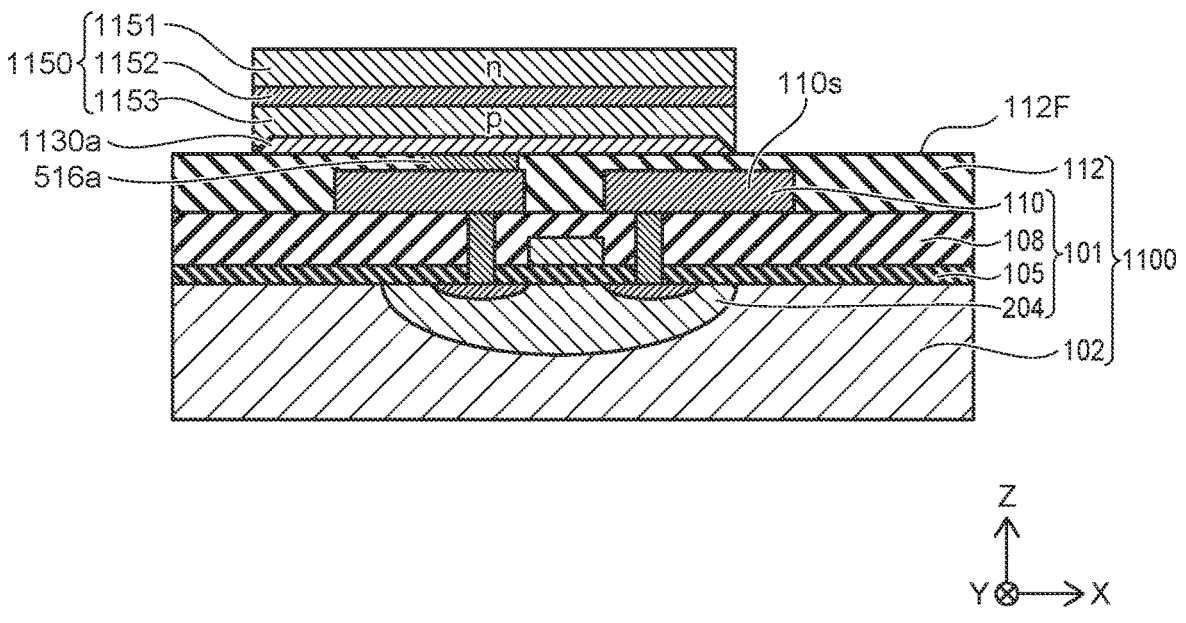
FIG. 24A is a schematic cross-sectional view illustrating the method for manufacturing the image display device of the fifth embodiment.

As shown in FIG. 24A, the monocrystallized conductive layer 1130*a* is formed by performing laser annealing of the conductive layer 1130 shown in FIG. 23B. The semiconductor layer 1150 is formed on the monocrystallized conductive layer 1130*a*. In the example, the semiconductor layer 1150 includes the p-type semiconductor layer 1153, the light-emitting layer 1152, and the n-type semiconductor layer 1151 formed in this order from the conductive layer 1130*a* side.

Figure 24B:
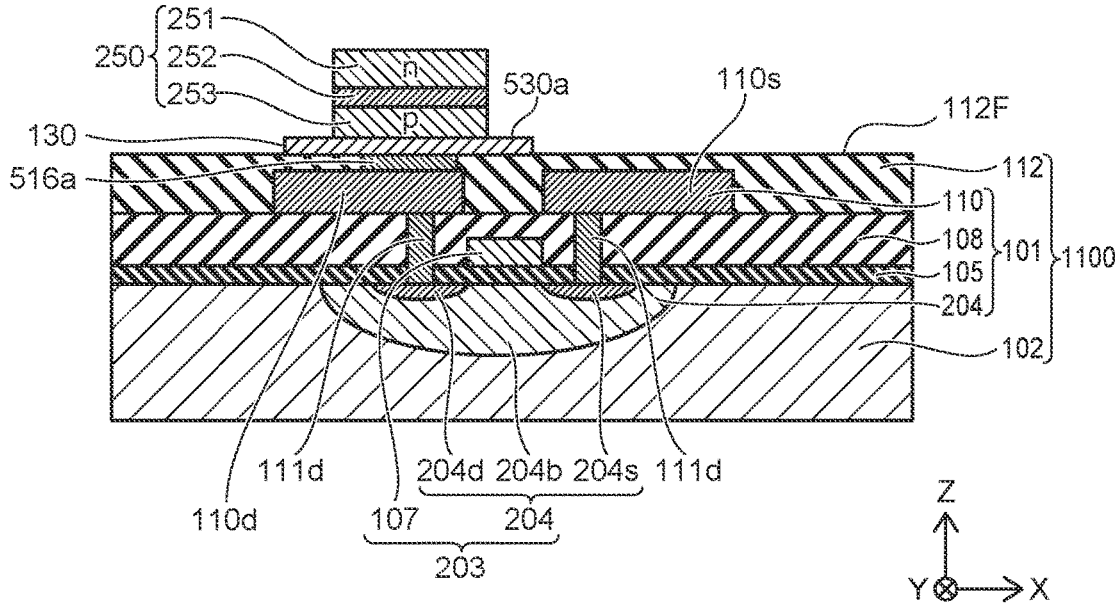
FIG. 24B is a schematic cross-sectional view illustrating the method for manufacturing the image display device of the fifth embodiment.

As shown in FIG. 24B, the semiconductor layer 1150 shown in FIG. 24A is patterned by etching to form the light-emitting element 250 having the desired shape. The conductive layer 1130*a* shown in FIG. 24A is etched to form the conductive layer 130 including the connection plate 530*a*. Thereafter, similarly to the other embodiments, the second inter-layer insulating film 156, the opening 158, the via 561*s*, the second wiring layer 160, the light-transmitting electrodes 559*k* and 559*s*, and the color filter 180 shown in FIG. 21 are formed, and the subpixel 520 is formed.

Effects of the image display device of the embodiment will now be described.

The image display device of the embodiment has effects similar to those of the other embodiments described above. Specifically, in the image display device of the embodiment, the manufacturing processes can be markedly reduced compared to when singulated light-emitting elements are individually transferred. In the configuration of the subpixel 520 in the image display device of the embodiment, the electrical connection to the circuit elements such as the transistor 203 and the like formed in the layers lower than the light-emitting element 250 is performed by the plug 516*a* instead of a via. Accordingly, the structure of the subpixel 520 can be simpler. the manufacturing processes can be simpler, and a yield increase can be expected.

Sixth Embodiment

Figure 25:
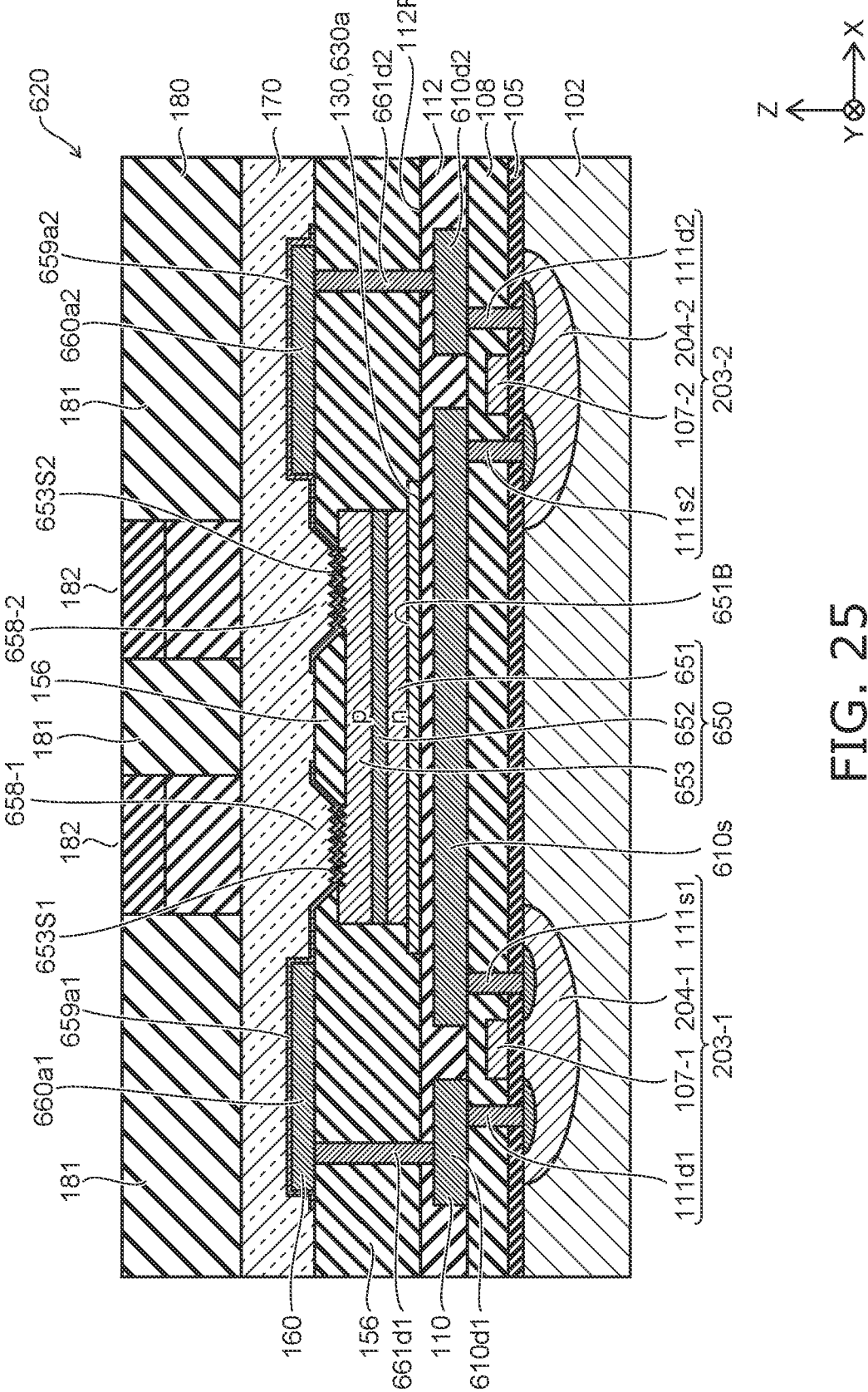
FIG. 25 is a schematic cross-sectional view illustrating a portion of an image display device according to a sixth embodiment.

FIG. 25 is a schematic cross-sectional view illustrating a portion of an image display device according to the embodiment.

According to the embodiment, an image display device that has a higher luminous efficiency is realized by forming multiple light-emitting surfaces 653S1 and 653S2 in a single semiconductor layer 650 that includes a light-emitting layer 652. In the following description, the same components as those of the other embodiments described above are marked with the same reference numerals, and a detailed description is omitted as appropriate.

As shown in FIG. 25, the image display device of the embodiment includes a subpixel group 620. The subpixel group 620 includes transistors (multiple transistors) 203-1 and 203-2, the first wiring layer 110, the first inter-layer insulating film 112, the conductive layer 130, the semiconductor layer 650, the second inter-layer insulating film 156, the second wiring layer 160, and vias 661*d*1 and 661*d*2. The conductive layer 130 includes a connection plate 630*a*. The connection plate (a second part) 630*a* is located on the planarized surface 112F. The semiconductor layer 650 is located on the connection plate 630*a*. To avoid complexity of illustration in the cross-sectional views of the embodiments and modifications described below, the reference numeral of the conductive layer 130 is labeled next to the reference numeral of the connection plate 630*a*.

According to the embodiment, for example, the conductive layer 130 and the connection plate 630*a* are connected to the ground line 4 of the circuit of FIG. 14. By switching the p-channel transistors 203-1 and 203-2 on, electrons are injected through one side of the semiconductor layer 650 via the conductive layer 130 and the connection plate 630*a*. By switching the p-channel transistors 203-1 and 203-2 on, holes are injected through the other side of the semiconductor layer 650 via the first and second wiring layers 110 and 160. The holes and the electrons are injected into the semiconductor layer 650, and the light-emitting layer 652 emits light due to the combination of the holes and electrons.

For example, the circuit configuration shown in FIG. 14 is applied to the drive circuit for driving the light-emitting layer 652. A configuration also can be used in which the semiconductor layer is driven by an n-channel transistor by vertically interchanging the n-type semiconductor layer and p-type semiconductor layer of the semiconductor layer. In such a case, for example, the circuit configuration of FIG. 4 is applied to the drive circuit.

The configuration of the subpixel group 620 will now be described in detail.

The transistors 203-1 and 203-2 are formed in the substrate 102. The transistor 203-1 includes an element formation region 204-1, a gate 107-1, and vias 111*s*1 and 111*d*1. The transistor 203-2 includes an element formation region 204-2, a gate 107-2, and vias 111*s*2 and 111*d*2.

In the example, the element formation regions 204-1 and 204-2 are n-type semiconductor regions. The element formation regions 204-1 and 204-2 are formed to be separated from each other in the X-axis direction inside the substrate 102. The n-type semiconductor regions of the element formation regions 204-1 and 204-2 each include channel regions. Two p-type semiconductor regions are formed to be separated from each other in the element formation region 204-1. The two p-type semiconductor regions that are formed inside the element formation region 204-1 include the source region and drain region of the transistor 203-1. Two p-type semiconductor regions are formed to be separated from each other in the element formation region 204-2. The two p-type semiconductor regions that are formed inside the element formation region 204-2 include the source region and drain region of the transistor 203-2.

The insulating layer 105 is located on the element formation regions 204-1 and 204-2 and the substrate 102, and the gates 107-1 and 107-2 are located respectively on the element formation regions 204-1 and 204-2 with the insulating layer 105 interposed. The transistors 203-1 and 203-2 are p-channel MOSFETs. The transistors 203-1 and 203-2 have configurations similar to the transistor 203 of the second and fifth embodiments described above, and a detailed description is therefore omitted.

The insulating film 108 is located on the insulating layer 105 and the gates 107-1 and 107-2. The first wiring layer 110 is located on the insulating film 108.

The vias 111*s*1 and 111*d*1 are located respectively between the first wiring layer 110 and the two p-type semiconductor regions of the transistor 203-1. The vias 111*s*2 and 111*d*2 are located respectively between the first wiring layer 110 and the two p-type semiconductor regions of the transistor 203-2.

The first wiring layer 110 includes wiring parts 610*s*, 610*d*1, and 610*d*2. The via 111*s*1 is located between the wiring part 610*s* and the p-type semiconductor region corresponding to the source region of the transistor 203-1, and electrically connects the p-type semiconductor region and the wiring part 610*s*. The via 111*s*2 is located between the wiring part 610*s* and the p-type semiconductor region corresponding to the source region of the transistor 203-2, and electrically connects the p-type semiconductor region and the wiring part 610*s*. For example, the wiring part 610*s* is connected to the power supply line 3 of the circuit of FIG. 14.

The via 111*d*1 is located between the wiring part 610*d*1 and the p-type semiconductor region corresponding to the drain region of the transistor 203-1, and electrically connects the p-type semiconductor region and the wiring part 610*d*1. The via 111*d*2 is located between the wiring part 610*d*2 and the p-type semiconductor region corresponding to the drain region of the transistor 203-2, and electrically connects the p-type semiconductor region and the wiring part 610*d*2.

The first inter-layer insulating film (the first insulating film) 112 covers the insulating film 108 and the first wiring layer 110. The conductive layer 130 is located on the planarized surface 112F of the first inter-layer insulating film 112.

The conductive layer 130 includes the connection plate 630*a*. The semiconductor layer 650 is located on the connection plate 630*a*. The semiconductor layer 650 includes a surface including the light-emitting surfaces 653S1 and 653S2, includes a bottom surface 651B at the side opposite to the surface including the light-emitting surfaces 653S1 and 653S2, and is connected to the connection plate 630*a* at the bottom surface 651B. For example, the connection plate 630*a* is connected to the ground line 4 of the circuit of FIG.

14. A single semiconductor layer 650 is located between two drive transistors 203-1 and 203-2 located along the X-axis direction.

The semiconductor layer 650 includes an n-type semiconductor layer 651, a light-emitting layer 652, and a p-type semiconductor layer 653. The semiconductor layer 650 includes the n-type semiconductor layer 651, the light-emitting layer 652, and the p-type semiconductor layer 653 stacked in this order from the planarized surface 112F toward the light-emitting surfaces 653S1 and 653S2. The bottom surface 651B is a surface of the n-type semiconductor layer 651, and the connection plate 630a is electrically connected with the n-type semiconductor layer 651.

When projected onto the XY plane, the outer perimeter of the connection plate (the second part) 630a is set to include the outer perimeter of the semiconductor layer 650 when the semiconductor layer 650 is projected onto the connection plate 630a. That is, the outer perimeter of the semiconductor layer 650 is located within the outer perimeter of the connection plate 630a when projected onto the XY plane. The connection plate 630a reflects the downward-scattered light of the semiconductor layer 650 toward the light-emitting surfaces 653S1 and 653S2 and increases the substantial luminous efficiency of the semiconductor layer 650. Also, the connection plate 630a reflects the downward-scattered light to prevent malfunction of the circuit elements including the transistors 203-1 and 203-2 by preventing the light from reaching the circuit elements.

The second inter-layer insulating film (the second insulating film) 156 covers the planarized surface 112F, the conductive layer 130 including the connection plate 630a, and the semiconductor layer 650. The light-emitting surface 653S1 is exposed from under the second inter-layer insulating film 156 via an opening 658-1. The light-emitting surface 653S2 is exposed from under the second inter-layer insulating film 156 via an opening 658-2. Similarly to the other embodiments described above, it is favorable for the second inter-layer insulating film 156 to be formed of a white resin.

The via 661d1 is provided to extend through the second and first inter-layer insulating films 156 and 112 and reach the wiring part 610d1. The via 661d2 is provided to extend through the second and first inter-layer insulating films 156 and 112 and reach the wiring part 610d2.

The second wiring layer 160 is located on the second inter-layer insulating film 156. The second wiring layer 160 includes wiring parts 660a1 and 660a2.

The via 661d1 is located between the wiring part 660a1 and the wiring part 610d1 and electrically connects the wiring part 660a1 and the wiring part 610d1. The via 661d2 is located between the wiring part 660a2 and the wiring part 610d2 and electrically connects the wiring part 660a2 and the wiring part 610d2.

A light-transmitting electrode 659a1 is provided over the light-emitting surface 653S1. The light-transmitting electrode 659a1 is provided over the wiring part 660a1. The light-transmitting electrode 659a1 is located between the light-emitting surface 653S1 and the wiring part 660a1 and electrically connects the light-emitting surface 653S1 and the wiring part 660a1. A light-transmitting electrode 659a2 is provided over the light-emitting surface 653S2. The light-transmitting electrode 659a2 is provided over the wiring part 660a2. The light-transmitting electrode 659a2 is located between the light-emitting surface 653S2 and the wiring part 660a2 and electrically connects the light-emitting surface 653S2 and the wiring part 660a2.

The openings 658-1 and 658-2 are formed at positions corresponding respectively to the light-emitting surfaces 653S1 and 653S2. The light-emitting surfaces 653S1 and 653S2 are formed at positions separated from each other on the p-type semiconductor layer 653. The light-emitting surface 653S1 is located at a position more proximate to the transistor 203-1. The light-emitting surface 653S2 is located at a position more proximate to the transistor 203-2.

For example, the openings 658-1 and 658-2 are square or rectangular when projected onto the XY plane. The openings 658-1 and 658-2 are not limited to quadrangular and may be circular, elliptical, or polygonal such as hexagonal, etc. The light-emitting surfaces 653S1 and 653S2 also may be squares, rectangles, other polygons, circles, etc., when projected onto the XY plane. The shapes of the light-emitting surfaces 653S1 and 653S2 may be similar to or different from the shapes of the openings 658-1 and 658-2.

As described above, the light-transmitting electrode 659a1 is connected to the light-emitting surface 653S1 exposed from under the second inter-layer insulating film 156 via the opening 658-1. The light-transmitting electrode 659a2 is connected to the light-emitting surface 653S2 exposed from under the second inter-layer insulating film 156 via the opening 658-2. Therefore, the holes that are supplied from the light-transmitting electrodes 659a1 and 659a2 are injected into the p-type semiconductor layer 653 through the light-emitting surfaces 653S1 and 653S2. On the other hand, electrons are injected into the n-type semiconductor layer 651 via the connection plate 630a connected to the ground line 4 shown in FIG. 14.

The transistors 203-1 and 203-2 are drive transistors of adjacent subpixels and are sequentially driven. Accordingly, the light-emitting layer 652 is caused to emit light by the holes injected from one of the two transistors 203-1 and 203-2 being injected into the light-emitting layer 652 and by the electrons injected from the connection plate 630a being injected into the light-emitting layer 652.

According to the embodiment, the component of the drift current in a direction parallel to the XY plane is suppressed by the resistance of the n-type semiconductor layer 651 and the p-type semiconductor layer 653. Therefore, the holes that are injected through the light-emitting surfaces 653S1 and 653S2 and the electrons that are injected from the connection plate 630a both travel along the stacking direction of the semiconductor layer 650. Because a light emission source substantially does not operate further outward of the light-emitting surfaces 653S1 and 653S2, the multiple light-emitting surfaces 653S1 and 653S2 that are located in one semiconductor layer 650 can be selectively caused to emit light respectively by the transistors 203-1 and 203-2.

Thus, the light emission source of the semiconductor layer 650 is substantially determined by the arrangement of the light-emitting surfaces 653S1 and 653S2.

A method for manufacturing the image display device of the embodiment will now be described.

FIGS. 26A to 27B are schematic cross-sectional views illustrating the method for manufacturing the image display device of the embodiment.

Figure 26A:
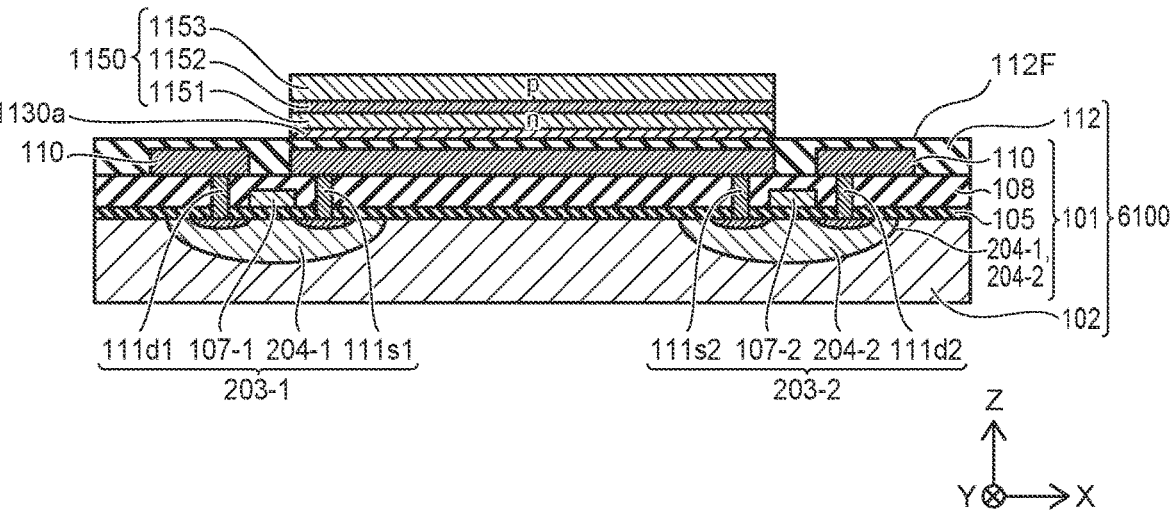
FIG. 26A is a schematic cross-sectional view illustrating a method for manufacturing the image display device of the sixth embodiment.

A wafer 6100 is prepared as shown in FIG. 26A. The wafer 6100 includes the substrate 102, the circuit 101, and the first inter-layer insulating film 112. In the example, the circuit 101 includes the multiple element formation regions 204-1 and 204-2 are the circuit 101 is covered with the first inter-layer insulating film 112. The conductive layer 1130 is formed on the planarized surface 112F.

Figure 26B:
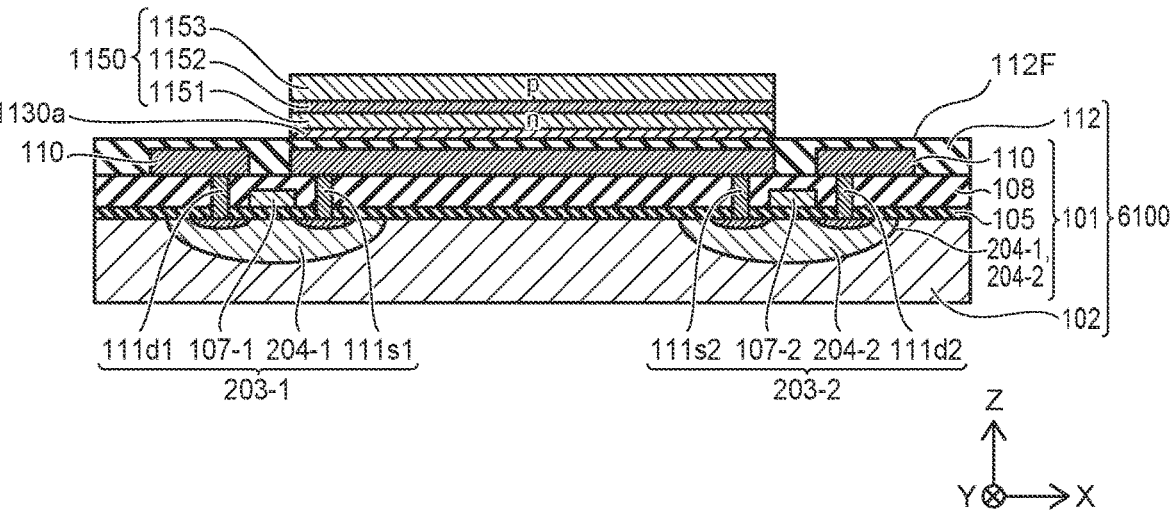
FIG. 26B is a schematic cross-sectional view illustrating the method for manufacturing the image display device of the sixth embodiment.

As shown in FIG. 26B, the monocrystallized conductive layer 1130a is formed by performing laser annealing of the conductive layer 1130 shown in FIG. 26A. The semiconductor layer 1150 is formed on the monocrystallized conductive layer 1130*a*. Technology similar to that of the other embodiments described above is applicable to form the conductive layer 1130*a* and the semiconductor layer 1150.

Figure 27A:
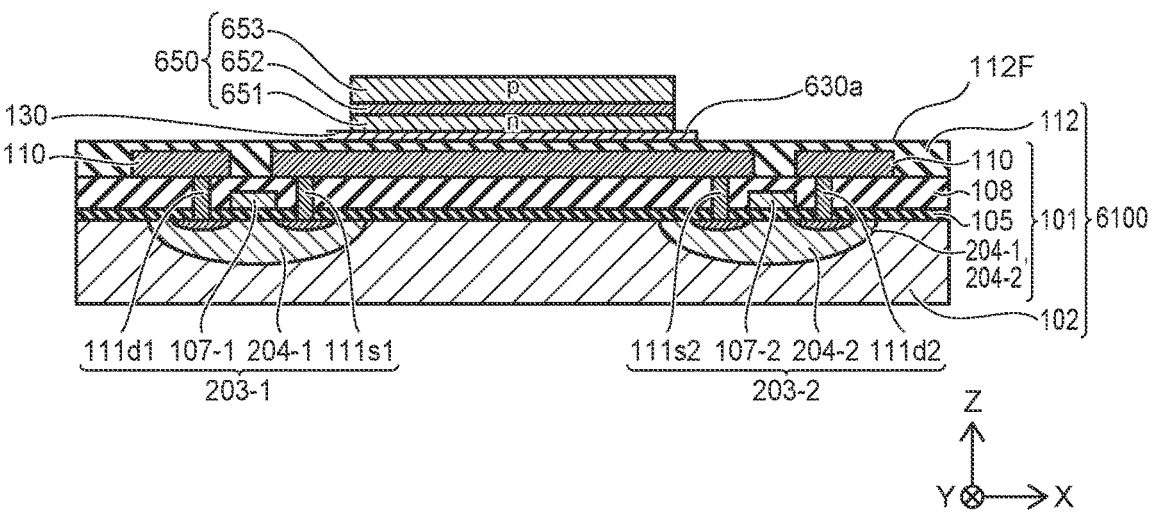
FIG. 27A is a schematic cross-sectional view illustrating the method for manufacturing the image display device of the sixth embodiment.

As shown in FIG. 27A, the semiconductor layer 1150 shown in FIG. 26B is patterned by etching to form the semiconductor layer 650. The monocrystallized conductive layer 1130*a* shown in FIG. 26B is patterned by etching to form the conductive layer 130 including the connection plate 630*a*. The outer perimeter of the connection plate 630*a*, patterned to be set to include the outer perimeter of the semiconductor layer 650 when the semiconductor layer 650 is projected onto the connection plate 630*a*. That is, the connection plate 630*a* is patterned so that the outer perimeter of the semiconductor layer 650 is located within the outer perimeter of the connection plate 630*a* when projected onto the XY plane.

Figure 27B:
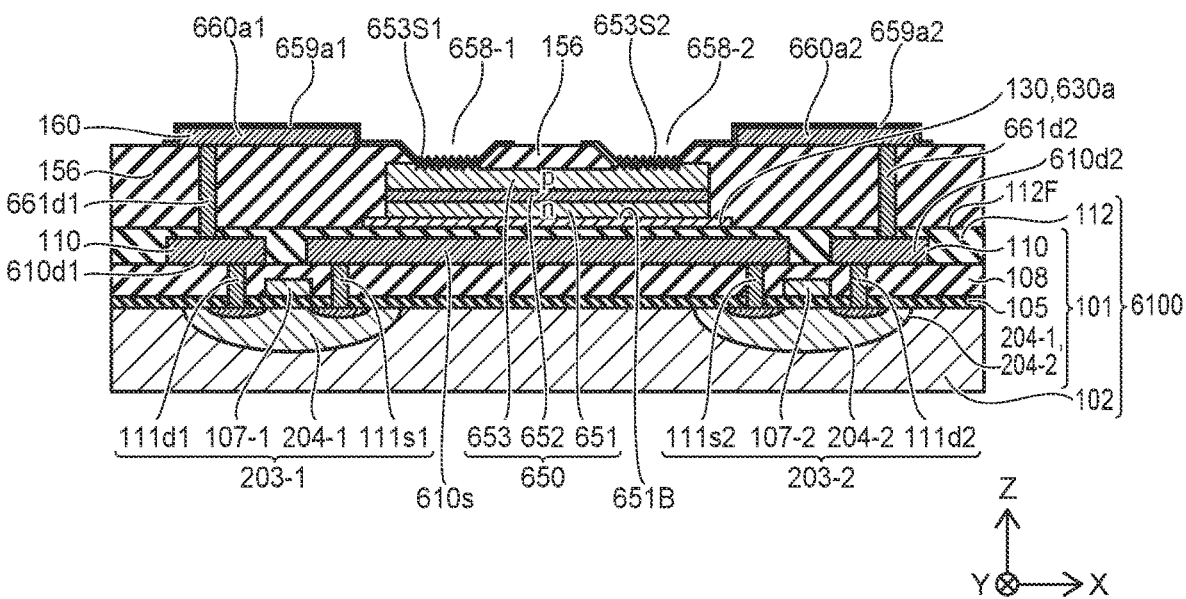
FIG. 27B is a schematic cross-sectional view illustrating the method for manufacturing the image display device of the sixth embodiment.

As shown in FIG. 27B, the second inter-layer insulating film 156 is formed to cover the planarized surface 112F, the conductive layer 130 including the connection plate 630*a*, and the semiconductor layer 650. The via 661*d*1 is formed to extend through the second and first inter-layer insulating films 156 and 112 and reach the wiring part 610*d*1. The via 661*d*2 is formed to extend through the second and first inter-layer insulating films 156 and 112 and reach the wiring part 610*d*2. The openings 658-1 and 658-2 are formed by removing a portion of the second inter-layer insulating film 156, and the light-emitting surfaces 653S1 and 653S2 are exposed from under the second inter-layer insulating film 156 respectively via the openings 658-1 and 658-2.

The second wiring layer 160 that includes the wiring parts 660*a*1 and 660*a*2 is formed on the second inter-layer insulating film 156, and the wiring parts 660*a*1 and 660*a*2 are connected respectively to the vias 661*d*1 and 661*d*2. The light-transmitting electrode 659*a*1 is formed over the light-emitting surface 653S1 and over the wiring part 660*a*1, and connects the light-emitting surface 653S1 and the wiring part 660*a*1 between the light-emitting surface 653S1 and the wiring part 660*a*1. The light-transmitting electrode 659*a*2 is formed over the light-emitting surface 653S2 and over the wiring part 660*a*2, and connects the light-emitting surface 653S2 and the wiring part 660*a*2 between the light-emitting surface 653S2 and the wiring part 660*a*2.

Thereafter, the subpixel group 620 of the image display device of the embodiment is formed by providing the color filter 180.

Although two light-emitting surfaces 653S1 and 653S2 are provided in one semiconductor layer 650 according to the example, the number of light-emitting surfaces is not limited to two; three or more light-emitting surfaces can be provided in one semiconductor layer 650. As an example, one column or two columns of subpixels may be realized by a single semiconductor layer 650. As described below, the recombination current that does not contribute to the light emission per light-emitting surface can be reduced thereby, and the effect of realizing a finer light-emitting element can be increased.

First Modification

Figure 28:
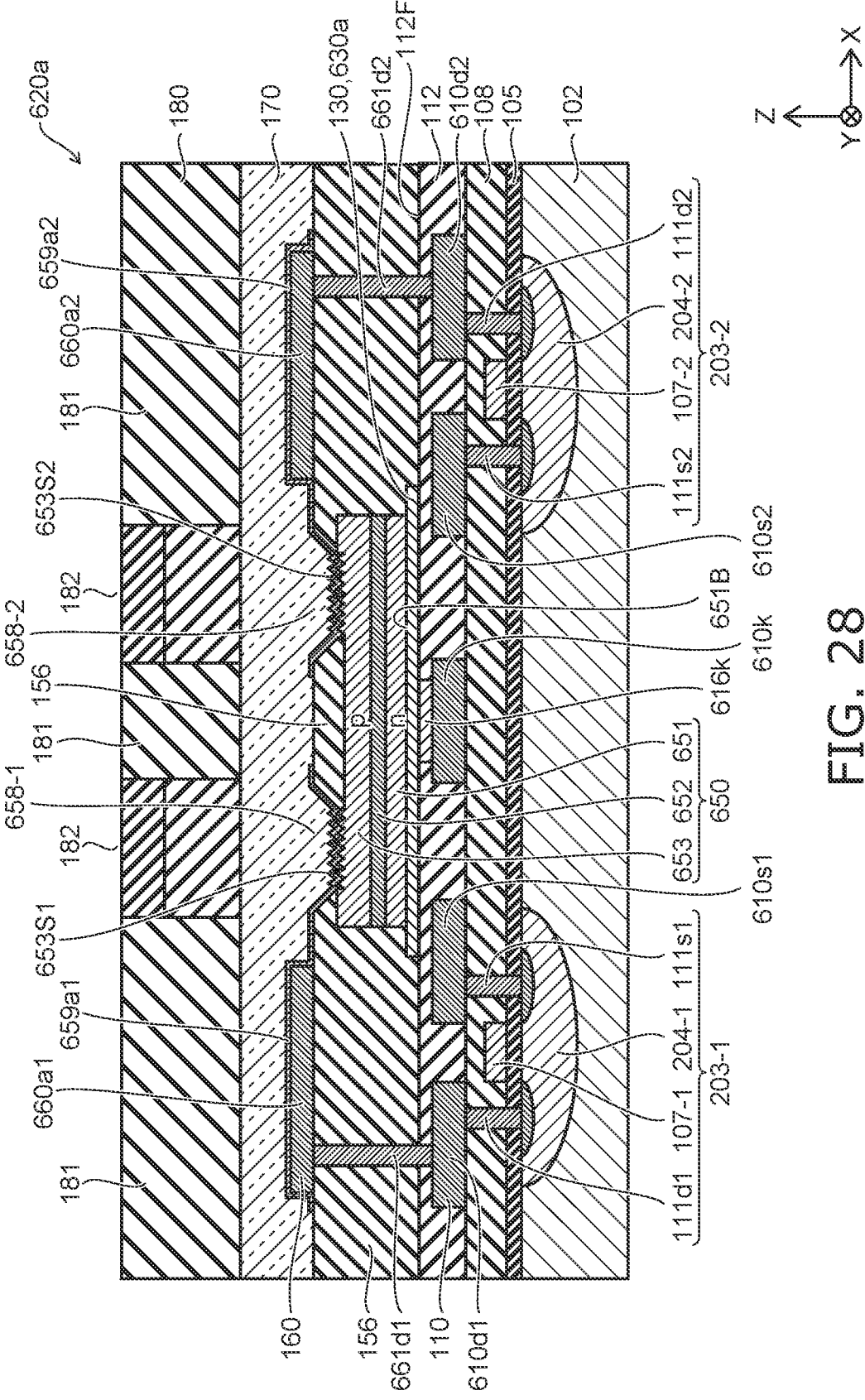
FIG. 28 is a schematic cross-sectional view illustrating a portion of an image display device according to a first modification of the sixth embodiment.

FIG. 28 is a schematic cross-sectional view illustrating a portion of an image display device according to the modification.

The modification differs from the sixth embodiment in that the connection plate 630*a* and a wiring part 610*k* of the first wiring layer 110 are connected by a plug 616*k*. Otherwise, the modification is similar to the sixth embodiment. The same components are marked with the same reference numerals, and a detailed description is omitted as appropriate.

As shown in FIG. 28, the image display device of the modification includes a subpixel group 620*a*. In the subpixel group 620*a* of the image display device of the modification, the first wiring layer 110 includes wiring parts 610*s*1, 610*s*2, and 610*k*. The wiring part 610*k* is located between the wiring parts 610*s*1 and 610*s*2. For example, the wiring parts 610*s*1 and 610*s*2 are connected to the power supply line 3 of the circuit of FIG. 14. For example, the wiring part 610*k* is connected to the ground line 4 of the circuit of FIG. 14.

The plug 616*k* is located between the wiring part 610*k* and the connection plate 630*a*. The plug 616*k* electrically connects the wiring part 610*k* and the connection plate 630*a*. Accordingly, the semiconductor layer 650 is connected to the ground line of the circuit of FIG. 14 via the connection plate 630*a*, the plug 616*k*, and the wiring part 610*k*. The connection plate 630*a* is provided for each semiconductor layer 650 and may be connected with the other connection plates; however, in the example, the connection plates 630*a* are separated from each other.

The modification is advantageous in that the n-type semiconductor layer 651 is connected to the wiring part 610*k* via the connection plate 630*a* and the plug 616*k*, and therefore can be electrically connected with a low resistance.

According to the modification, the formation of the plug 616*k* and the connection with the connection plate 630*a* can be performed by applying the manufacturing method of the fifth embodiment described using FIGS. 22A to 23B.

Second Modification

Figure 29:
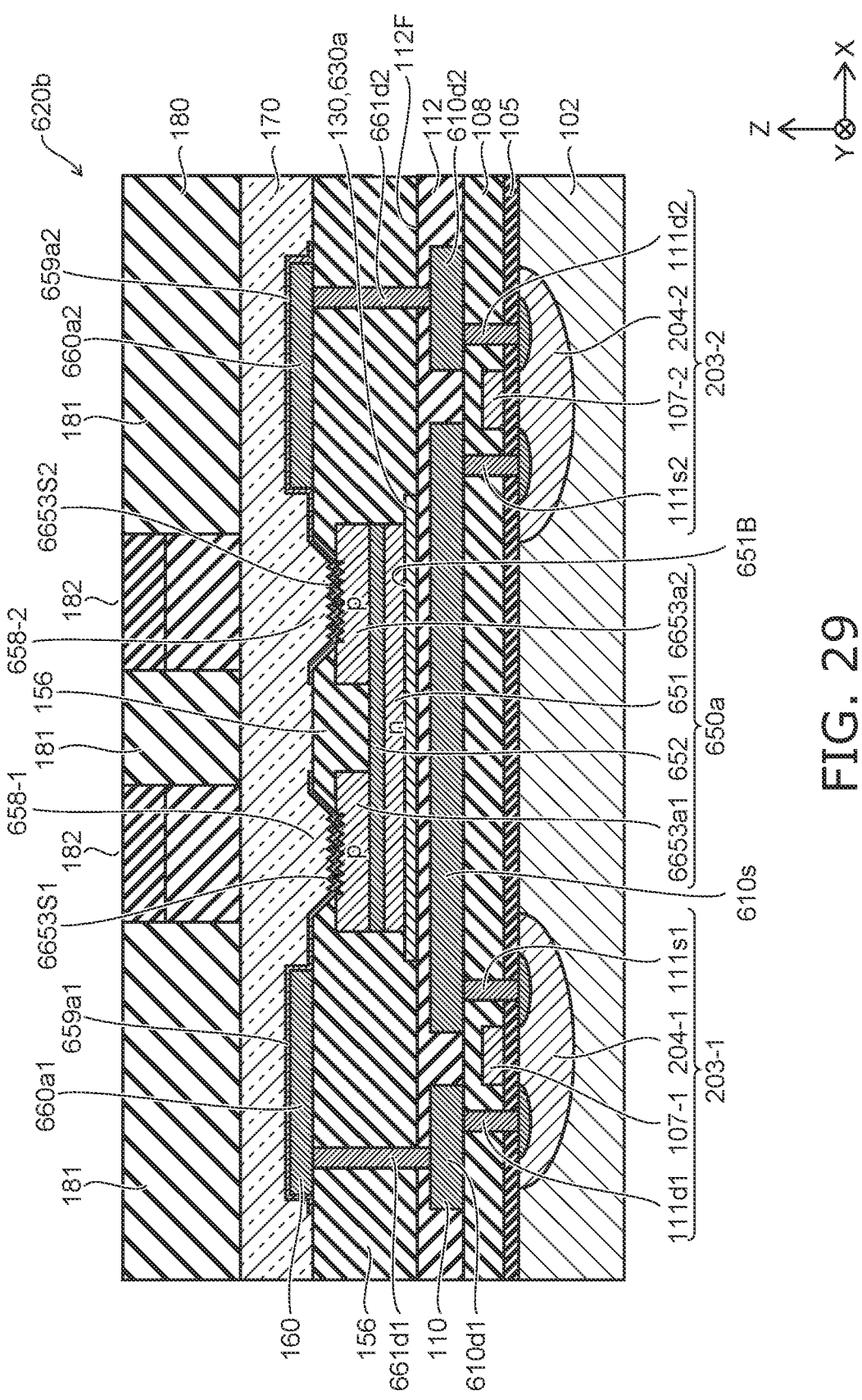
FIG. 29 is a schematic cross-sectional view illustrating a portion of an image display device according to a second modification of the sixth embodiment.

FIG. 29 is a schematic cross-sectional view illustrating a portion of an image display device according to the modification.

The modification differs from the sixth embodiment described above in that two p-type semiconductor layers 6653*a*1 and 6653*a*2 are located on the light-emitting layer 652. Otherwise, the modification is the same as the sixth embodiment. The same components are marked with the same reference numerals, and a detailed description is omitted as appropriate.

As shown in FIG. 29, the image display device of the modification includes a subpixel group 620*b*. The subpixel group 620*b* includes a semiconductor layer 650*a*. The semiconductor layer 650*a* includes the n-type semiconductor layer 651, the light-emitting layer 652, and the p-type semiconductor layers 6653*a*1 and 6653*a*2. The light-emitting layer 652 is stacked on the n-type semiconductor layer 651. The p-type semiconductor layers 6653*a*1 and 6653*a*2 each are stacked on the light-emitting layer 652.

The p-type semiconductor layers 6653*a*1 and 6653*a*2 are formed in an island configuration on the light-emitting layer 652, and in the example, are provided to be separated along the X-axis direction. The second inter-layer insulating film 156 is located between the p-type semiconductor layers 6653*a*1 and 6653*a*2, and the p-type semiconductor layers 6653*a*1 and 6653*a*2 are separated by the second inter-layer insulating film 156.

In the example, the p-type semiconductor layers 6653*a*1 and 6653*a*2 have substantially the same shape when projected onto the XY plane, and the shape may be substantially a square, rectangle, other polygon, circle, etc.

The p-type semiconductor layer 6653*a*1 includes a light-emitting surface 6653S1. The p-type semiconductor layer 6653*a*2 includes a light-emitting surface 6653S2. The light-emitting surface 6653S1 is a surface of the p-type semiconductor layer 6653*a*1 exposed from under the second inter-layer insulating film 156 via the opening 658-1. The light-emitting surface 6653S2 is a surface of the p-type semiconductor layer 6653*a*2 exposed from under the second inter-layer insulating film 156 via the opening 658-2.

Similarly to the shapes of the light-emitting surfaces according to the sixth embodiment, the shapes of the light-emitting surfaces 6653S1 and 6653S2 when projected onto the XY plane are substantially the same shape and are substantially square, etc. The shapes of the light-emitting surfaces 6653S1 and 6653S2 are not limited to quadrangular such as that of the embodiment and may be circular, elliptical, polygonal such as hexagonal, etc. The shapes of the light-emitting surfaces 6653S1 and 6653S2 may be similar to or different from the shapes of the openings 658-1 and 658-2.

The light-transmitting electrode 659*a*1 is provided over the light-emitting surface 6653S1 and provided over the wiring part 660*a*1. The light-transmitting electrode 659*a*1 is located between the light-emitting surface 6653S1 and a wiring part 610*a*1 and electrically connects the light-emitting surface 6653S1 and the wiring part 660*a*1. The light-transmitting electrode 659*a*2 is provided over the light-emitting surface 6653S2 and provided over the wiring part 660*a*2. The light-transmitting electrode 659*a*2 is located between the light-emitting surface 6653S2 and the wiring part 660*a*2 and electrically connects the light-emitting surface 6653S2 and the wiring part 660*a*2.

A manufacturing method of the modification will now be described.

Figures 30A, 30B:
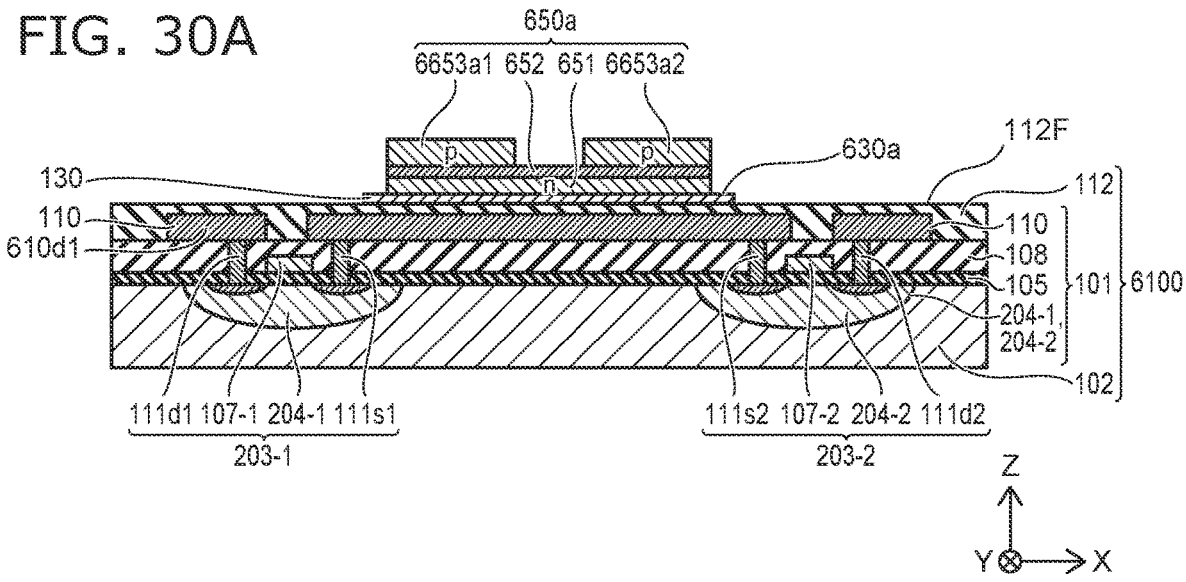
FIG. 30A is a schematic cross-sectional view illustrating a method for manufacturing the image display device of the second modification of the sixth embodiment.
FIG. 30B is a schematic cross-sectional view illustrating the method for manufacturing the image display device of the second modification of the sixth embodiment.

FIGS. 30A and 30B are schematic cross-sectional views illustrating the method for manufacturing the image display device of the modification.

In the description of the modification, the processes up to the process shown in FIG. 26B are similar to those of the sixth embodiment, and the process of FIG. 30A and subsequent processes are applied after the process shown in FIG. 26B.

As shown in FIG. 30A, the semiconductor layer 1150 shown in FIG. 26B is etched to form the light-emitting layer 652 and the n-type semiconductor layer 651. The p-type semiconductor layers 6653*a*1 and 6653*a*2 are formed by further etching. The conductive layer 1130*a* shown in FIG. 26B is etched to form the conductive layer 130 including the connection plate 630*a*.

The etching may be deeper when forming the p-type semiconductor layers 6653*a*1 and 6653*a*2. For example, the etching for forming the p-type semiconductor layers 6653*a*1 and 6653*a*2 may be performed to exceed a depth that reaches the light-emitting layer 652 and the n-type semiconductor layer 651. Thus, when the p-type semiconductor layers are formed by performing deep etching, it is desirable to etch outward of the outer perimeters of the light-emitting surfaces 6653S1 and 6653S2 shown in FIG. 29 by not less than 1 μm. The recombination current can be suppressed by separating the etching position outward from the outer perimeters of the light-emitting surfaces 6653S1 and 6653S2.

As shown in FIG. 30B, the second inter-layer insulating film 156 is formed to cover the planarized surface 112F, the conductive layer 130 including the connection plate 630*a*, and the semiconductor layer 650*a*. Subsequently, the openings 658-1 and 658-2, the vias 661*d*1 and 661*d*2, the second wiring layer 160, and the light-transmitting electrodes 659*a*1 and 659*a*2 are formed similarly to those of the sixth embodiment.

The upper structure such as a color filter, etc., are formed similarly to those of the sixth embodiment.

Thus, the subpixel group 620*a* that includes the two light-emitting surfaces 6653S1 and 6653S2 is formed.

According to the modification as well, similarly to the sixth embodiment, the number of light-emitting surfaces is not limited to two; three or more light-emitting surfaces may be provided in one semiconductor layer 650*a*.

Third Modification

Figure 31:
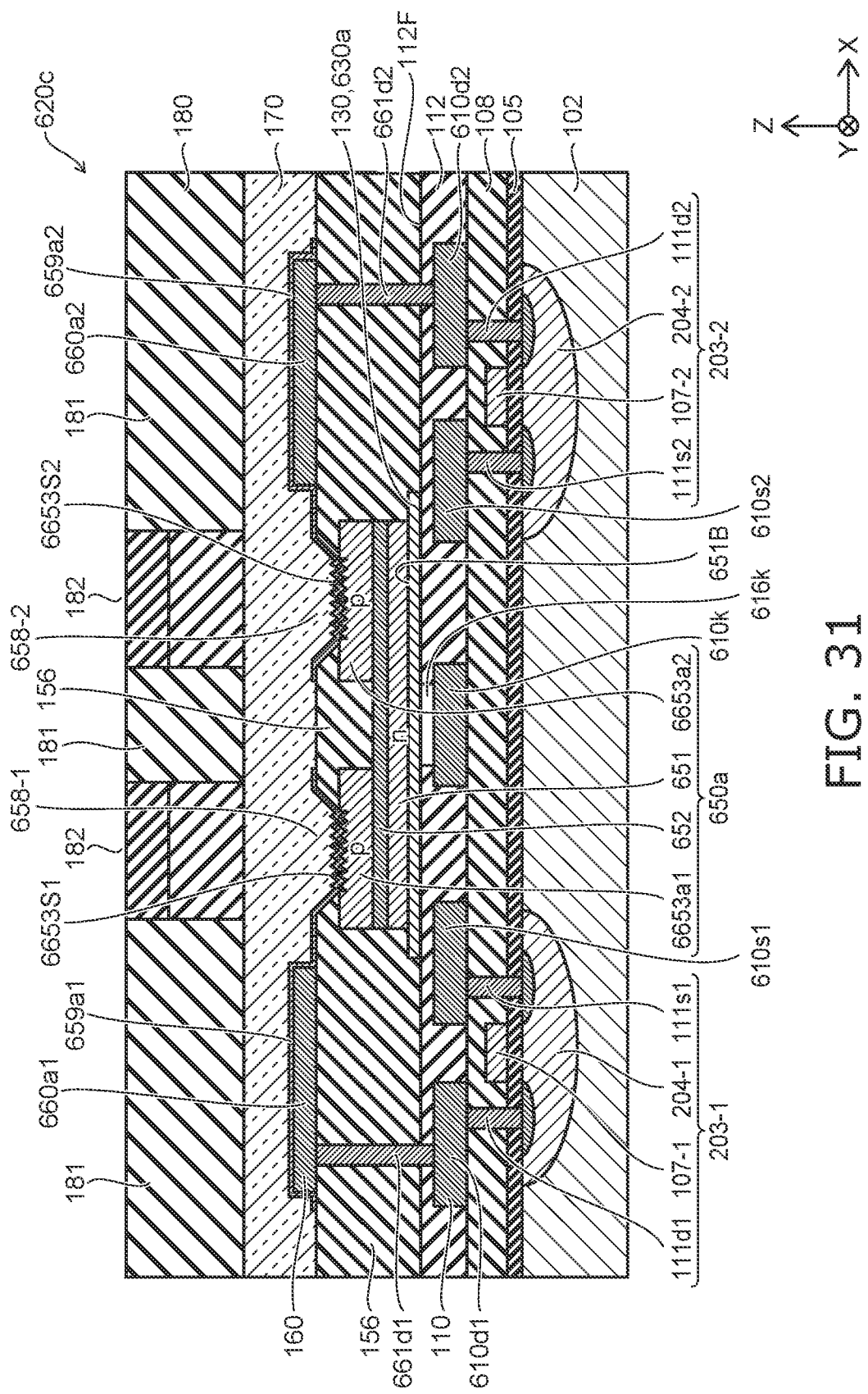
FIG. 31 is a schematic cross-sectional view illustrating a method for manufacturing an image display device of a third modification of the sixth embodiment.

FIG. 31 is a schematic cross-sectional view illustrating a portion of an image display device according to the modification.

According to the modification, the connection plate 630*a* that connects the semiconductor layer 650*a* is connected to the wiring part 610*k* via the plug 616*k* similarly to that of the first modification.

As shown in FIG. 31, the image display device of the modification includes a subpixel group 620*c*. The subpixel group 620*c* of the image display device of the modification includes the first wiring layer 110 including the wiring parts 610*s*1, 610*s*2, and 610*k*, the plug 616*k*, and the semiconductor layer 650*a*.

The semiconductor layer 650*a* is the same as the semiconductor layer 650*a* according to the second modification. The semiconductor layer 650*a* is located on the connection plate 630*a*. The plug 616*k* is located between the wiring part 610*k* and the connection plate 630*a* and electrically connects the wiring part 610*k* and the connection plate 630*a*. For example, the wiring part 610*k* is connected to the ground line 4 of the circuit of FIG. 14. For example, the wiring parts 610*s*1 and 610*s*2 are connected to the power supply line 3 of the circuit of FIG. 14.

According to the modification, the plug 616*k* can be formed similarly to that of the second modification.

Effects of the image display device of the embodiments and the modifications will now be described.

Figure 32:
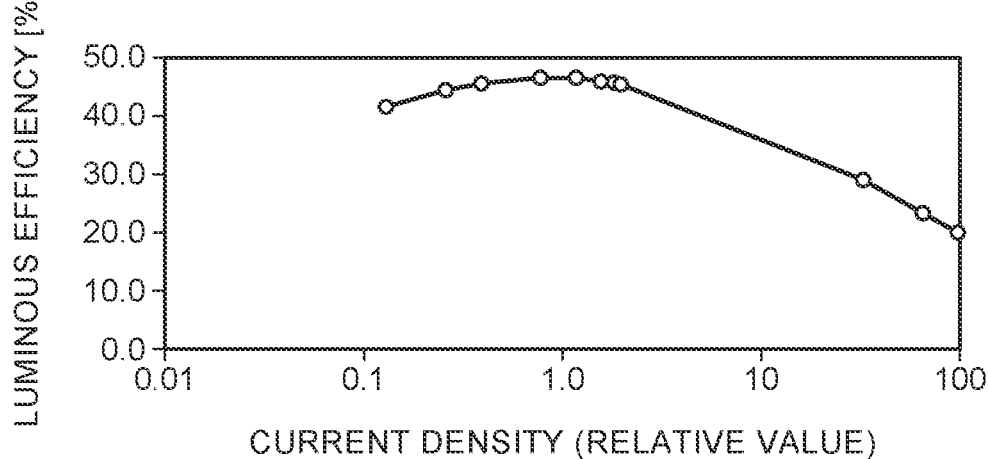
FIG. 32 is a graph illustrating a characteristic of a pixel LED element.

FIG. 32 is a graph illustrating a characteristic of a pixel LED element.

The vertical axis of FIG. 32 is the luminous efficiency (%) of the pixel LED element. The horizontal axis is the current density of the current flowing in the pixel LED element shown as a relative value.

As shown in FIG. 32, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency has a maximum exists in the pixel LED element.

It may be expected that a highly efficient image display device is realized by suppressing the current density so that a sufficient luminance is obtained from the light-emitting element. However, it is shown by FIG. 32 that there is a tendency for the current density to decrease and for the luminous efficiency to decrease for a low current density.

As described in the first to fifth embodiments, the light-emitting element is formed by individually singulating by etching or the like of all of the layers of the semiconductor layer 1150 that includes the light-emitting layer. At this time, the bonding surface between the light-emitting layer and the p-type semiconductor layer is exposed at the end portion of the light-emitting element. Similarly, the bonding surface between the light-emitting layer and the n-type semiconductor layer is exposed at the end portion.

When such end portions exist, electrons and holes recombine at the end portions. On the other hand, such recombination does not contribute to the light emission. The recombination at the end portions occurs substantially regardless of the current caused to flow in the light-emitting element. It is considered that the recombination occurs according to the lengths of the bonding surfaces that contribute to the light emission at the end portions.

When two light-emitting elements that have cubic shapes of the same dimension emit light, end portions are formed at four side surfaces for each light-emitting element; therefore, the two light-emitting elements have a total of eight end portions, and recombination may occur at eight end portions.

In contrast, according to the embodiment, the semiconductor layers 650 and 650a include four side surfaces, and there are four end portions of the two light-emitting surfaces. However, the region between the opening 658-1 and the opening 658-2 substantially does not contribute to the light emission because few electrons and holes are injected; therefore, the end portions that contribute to the light emission can be considered to be six. Thus, according to the embodiment, by substantially reducing the number of end portions of the semiconductor layer, the recombination that does not contribute to the light emission is reduced. By reducing the recombination that does not contribute to the light emission, the drive current per light-emitting surface is reduced.

When reducing the distance between the subpixels for higher definition of the image display device or the like, when the current density is relatively high, etc., the distance between the light-emitting surface 653S1 and the light-emitting surface 653S2 becomes substantially short in the subpixel groups 620 and 620a of the sixth embodiment and the first modification of the sixth embodiment. In such a case, when the p-type semiconductor layer 653 is shared as in the sixth embodiment and the first modification of the sixth embodiment, there is a risk that a portion of the holes injected into the light-emitting surface being driven may shunt, and the light-emitting surface that is not being driven may have a micro light emission. In contrast, in the subpixel groups 620b and 620c of the second and third modifications, the p-type semiconductor layers 6653a1 and 6653a2 are divided into two, and the p-type semiconductor layers 6653a1 and 6653a2 respectively include the light-emitting surfaces 6653S1 and 6653S2; therefore, the micro light emission of the light-emitting surface at the side that is not driven can be reduced.

According to the embodiment, the semiconductor layers 650 and 650a that include the light-emitting layer 652 are formed by crystal growth from the n-type semiconductor layer on the connection plate 630a, and are favorable from the perspective of reducing the manufacturing cost. Similarly to the other embodiments, the p-type semiconductor layer, the light-emitting layer, and the n-type semiconductor layer may be stacked in this order from the connection plate 630a side as described above instead of the stacking order of the n-type semiconductor layer and the p-type semiconductor layer.

According to the embodiment and the second modification of the embodiment, by using the connection plate 630a as a wiring part, the semiconductor layers of the lower layers of the semiconductor layers 650 and 650a can be electrically connected with the external circuit without vias for each light-emitting surface. It is therefore unnecessary to ensure a region on the connection plate 630a for via connection; therefore, a high density arrangement of the circuit elements is possible. Also, a yield increase is expected because the draw-out structure of the wiring parts for connecting with the external wiring is simplified.

In the first and third modifications of the embodiment, the connection plate 630a can be electrically connected with the external circuit by the plug 616k. Therefore, even when the thickness of the connection plate 630a is thin or the conductivity of the metal material that is employed is low, the n-type semiconductor layer 651 can be electrically connected to the external circuit with a low resistance.

Specific examples of the subpixels and subpixel groups of the image display devices of the embodiments are described above. Each specific example is an example, and other configuration examples are possible by appropriately combining the configurations and procedures of processes of these embodiments. For example, a connection plate may be used to connect to a power supply line or a ground line without using a via according to the first to fifth embodiments, and the electrical connection of the light-emitting element may be performed using a via according to the sixth embodiment.

Seventh Embodiment

The image display devices described above can be used as an image display module having the appropriate number of pixels in, for example, a computer display, a television, a portable terminal such as a smartphone, car navigation, etc.

Figure 33:
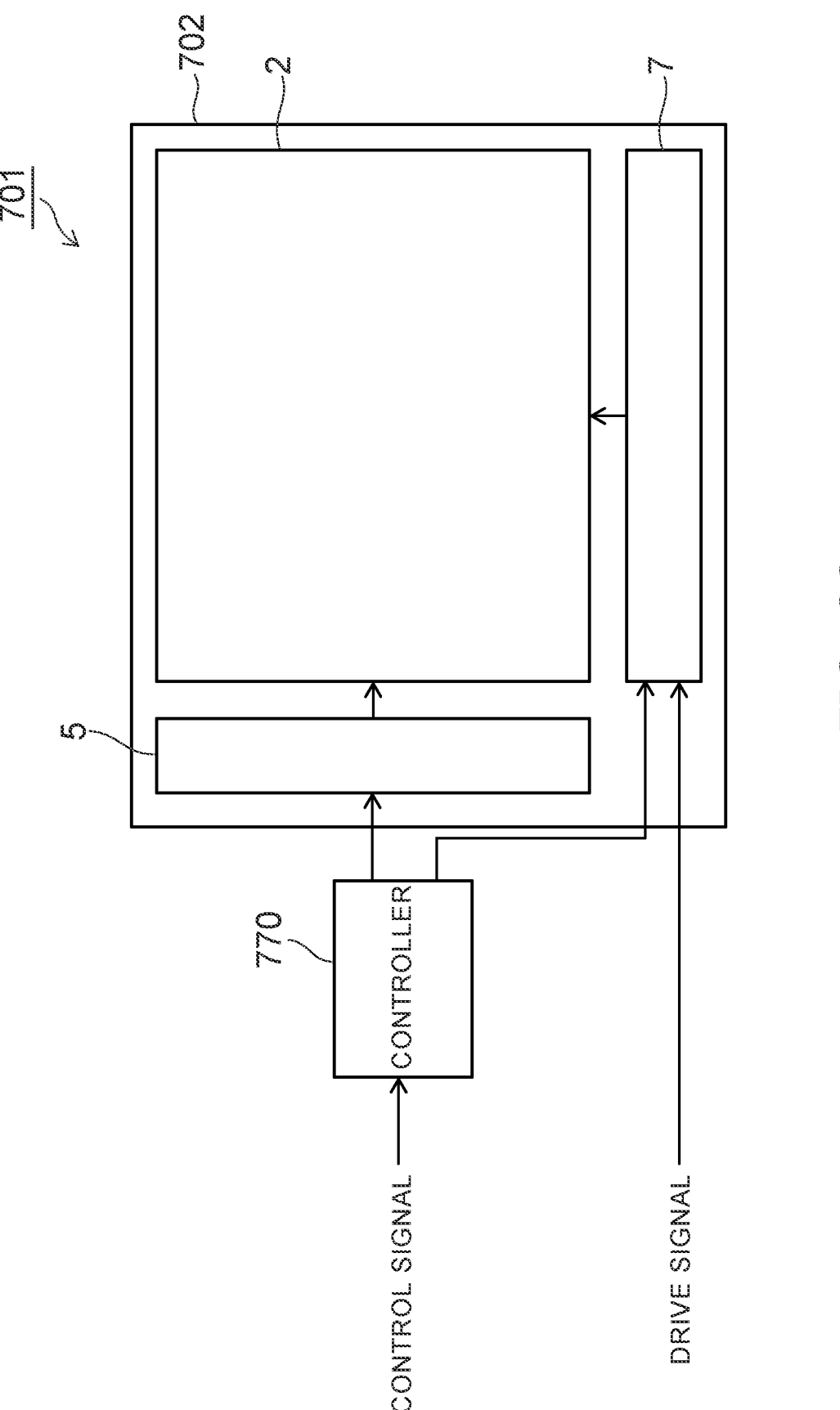
FIG. 33 is a block diagram illustrating an image display device according to a seventh embodiment.

FIG. 33 is a block diagram illustrating an image display device according to the embodiment.

FIG. 33 shows the major parts of the configuration of a computer display.

As shown in FIG. 33, the image display device 701 includes an image display module 702. The image display module 702 is, for example, an image display device that includes the configuration according to the first embodiment described above. The image display module 702 includes the display region 2 in which the multiple subpixels including the subpixels 20 are arranged, the row selection circuit 5, and the signal voltage output circuit 7.

The image display device 701 further includes a controller 770. The controller 770 receives input of control signals to be separated and generated by not-illustrated interface circuitry, and controls the driving and the drive sequence of the subpixels in the row selection circuit 5 and the signal voltage output circuit 7.

Modification

Figure 34:
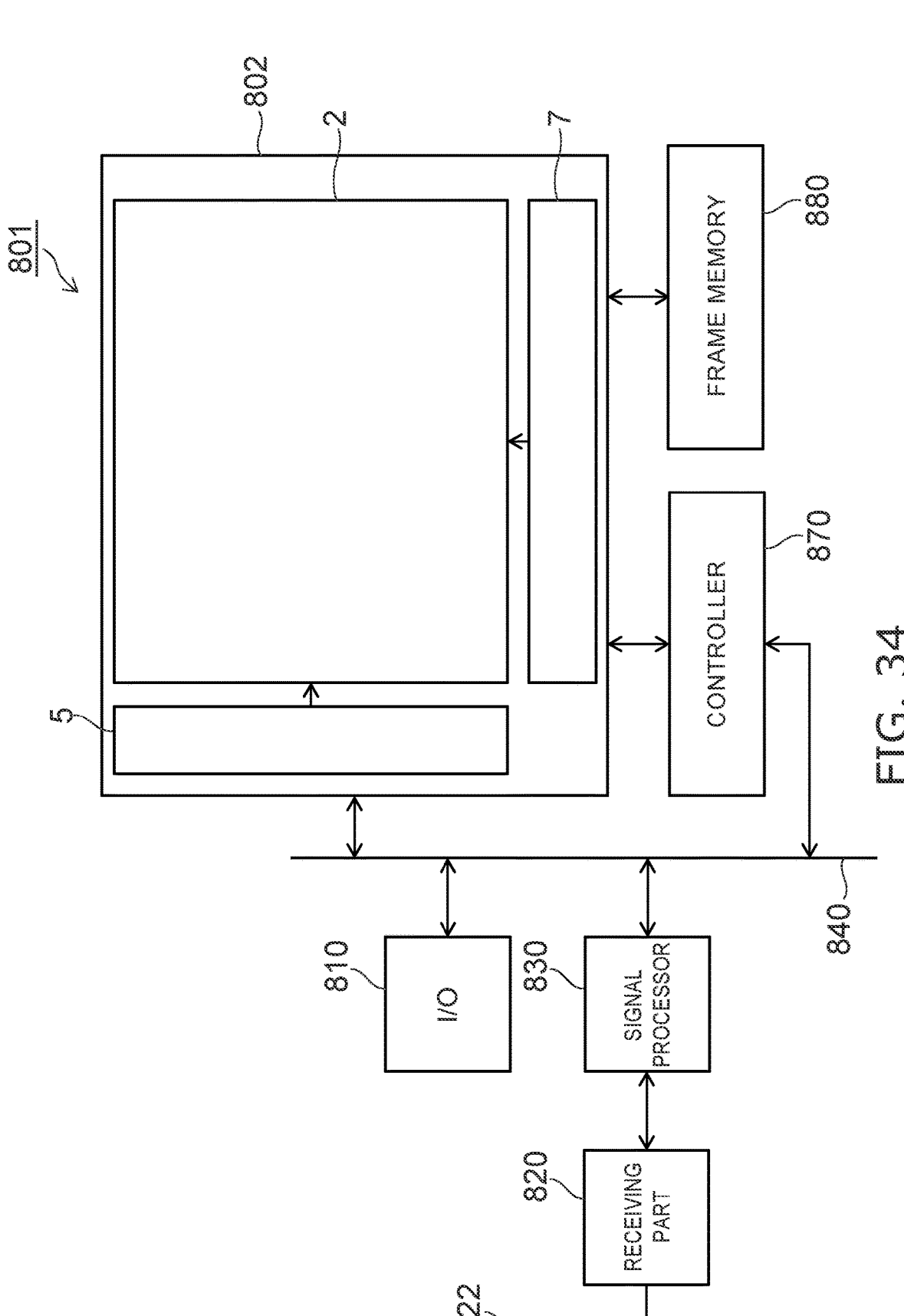
FIG. 34 is a block diagram illustrating an image display device according to a modification of the seventh embodiment.

FIG. 34 is a block diagram illustrating an image display device according to a modification of the embodiment.

FIG. 34 shows the configuration of a high-definition thin television.

As shown in FIG. 34, the image display device 801 includes an image display module 802. The image display module 802 is, for example, the image display device 1 that includes the configuration according to the first embodiment described above. The image display device 801 includes a controller 870 and a frame memory 880. The controller 870 controls the drive sequence of the subpixels of the display region 2 based on a control signal supplied by a bus 840. The frame memory 880 stores one frame of display data and is used for smooth processing such as video image reproduction, etc.

The image display device 801 includes an I/O circuit 810. The I/O circuit 810 is labeled as simply "I/O" in FIG. 34. The I/O circuit 810 provides interface circuitry for connecting with an external terminal, a device, etc. The I/O circuit 810 includes, for example, an audio interface, a USB interface that connects an external hard disk device, etc.

The image display device 801 includes a receiving part 820 and a signal processor 830. An antenna 822 is connected to the receiving part 820, and the necessary signal is separated and generated from the radio wave received by the antenna 822. The signal processor 830 includes a DSP (Digital Signal Processor), a CPU (Central Processing Unit), etc., and the signal that is separated and generated by the receiving part 820 is separated and generated into image data, voice data, etc., by the signal processor 830.

Other image display devices also can be made by using the receiving part 820 and the signal processor 830 as a high-frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment, the second to fifth embodiments, or modifications of the second to fifth embodiments may be used. Also, it goes without saying that the configurations of the image display module according to the embodiments and modifications include many subpixels as shown in FIG. 12.

According to the embodiments described above, a method for manufacturing an image display device and an image display device can be realized in which a transfer process of a light-emitting element is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions described in the claims and their equivalents. Also, the embodiments described above can be implemented in combination with each other.

What is claimed is:

1. A method for manufacturing an image display device, the method comprising:
preparing a substrate, the substrate comprising a circuit and a first insulating film covering the circuit;
forming a conductive layer on the first insulating film, the conductive layer comprising a single-crystal metal;
forming a semiconductor layer on the conductive layer, the semiconductor layer comprising a light-emitting layer;
forming a light-emitting element by etching the semiconductor layer, the light-emitting element including a bottom surface on the conductive layer, and a light-emitting surface at a side opposite to the bottom surface;
forming a second insulating film covering the conductive layer, the light-emitting element, and the first insulating film;

forming a first via extending through the first and second insulating films; and
forming a wiring layer on the second insulating film; wherein:
the first via is located between the wiring layer and the circuit and electrically connects the wiring layer and the circuit,
the light-emitting element is electrically connected to the circuit via the wiring layer.

2. The method according to claim 1, wherein:
the forming of the conductive layer includes:
forming a metal layer on the first insulating film, and performing annealing treatment of the metal layer.

3. The method according to claim 2, wherein:
the forming of the conductive layer includes, after the forming of the metal layer and before the annealing treatment of the metal layer, patterning the metal layer.

4. The method according to claim 1, further comprising:
forming a second via extending through the second insulating film, the second via being located between the conductive layer and the wiring layer and electrically connecting the conductive layer and the wiring layer, wherein:
the light-emitting element is connected to the circuit via the conductive layer, the second via, the wiring layer, and the first via.

5. The method according to claim 1, wherein:
the substrate comprises a plug electrically connected to the circuit, and
the conductive layer is formed on the plug and the first insulating film in the forming of the conductive layer.

6. The method according to claim 1, further comprising:
before the forming of the semiconductor layer, forming, on the conductive layer, a layer comprising graphene.

7. The method according to claim 1, further comprising:
exposing the light-emitting surface; and
forming a light-transmitting electrode on the exposed light-emitting surface.

8. The method according to claim 1, wherein:
the semiconductor layer comprises a gallium nitride compound semiconductor.

9. The method according to claim 1, further comprising:
forming a wavelength conversion member on the light-emitting element.

10. An image display device comprising:
a circuit element;
a first wiring layer electrically connected to the circuit element;
a first insulating film covering the circuit element and the first wiring layer;
a conductive layer located on the first insulating film, the conductive layer comprising a single-crystal metal;
a light-emitting element located on the conductive layer and electrically connected to the conductive layer, the light-emitting element including a bottom surface on the conductive layer, and a light-emitting surface at a side opposite to the bottom surface;
a second insulating film covering the conductive layer, the first insulating film, and a side surface of the light-emitting element;
a second wiring layer located on the second insulating film; and
a first via extending through the first and second insulating films, the first via being located between the first wiring layer and the second wiring layer and electrically connecting the first wiring layer and the second wiring layer, wherein:

the light-emitting element is electrically connected to the circuit element via the first and second wiring layers.

11. The image according to claim 10, wherein:
the conductive layer includes a first part including the single-crystal metal,
the light-emitting element is located on the first part, and
an outer perimeter of the light-emitting element is located within an outer perimeter of the first part when viewed in a plan view.

12. The image according to claim 11, further comprising:
a second via provided to extend through the second insulating film, the second via being located between the first part and the second wiring layer and electrically connecting the first part and the second wiring layer, wherein:
the light-emitting element is electrically connected to the circuit element via the first part, the second via, the second wiring layer, the first via, and the first wiring layer.

13. The image according to claim 12, further comprising:
a third via extending through the second insulating film, wherein:
the light-emitting element comprises:
    a first semiconductor layer of a first conductivity type,
    a light-emitting layer located on the first semiconductor layer, and
    a second semiconductor layer located on the light-emitting layer, the second semiconductor layer being of a second conductivity type, the second conductivity type being different from the first conductivity type,
the first semiconductor layer, the light-emitting layer, and the second semiconductor layer are stacked in this order from the first part toward the light-emitting surface,
the first semiconductor layer is located on the first part and electrically connected to the first part,
the second wiring layer comprises:
    a first wiring part connected to the first and second vias, and
    a second wiring part connected to the light-emitting surface,
the conductive layer comprises a third wiring part insulated from the first part,
the third via is located between the third wiring part and the second wiring part and electrically connects the third wiring part and the second wiring part,
the first semiconductor layer is connected to the circuit element via the first part, the second via, the first wiring part, the first via, and the first wiring layer,
the second semiconductor layer is connected to the third wiring part via the second wiring part and the third via.

14. The image according to claim 13, wherein:
the first conductivity type is a p-type, and
the second conductivity type is an n-type.

15. The image according to claim 11, wherein:
the first wiring layer comprises a fourth wiring part insulated from the first via,
the image display device further comprises a plug located between the first part and the fourth wiring part, and
the light-emitting element is electrically connected to the fourth wiring part via the first part and the plug.

16. The image according to claim 10, further comprising:
a layer comprising graphene, located between the conductive layer and the light-emitting element.

17. The image according to claim 10, wherein:
the second insulating film has an opening in which the light-emitting surface is exposed, and
the image display device further comprises a light-transmitting electrode located on the light-emitting surface.

18. The image according to claim 10, wherein:
the light-emitting element comprises a gallium nitride compound semiconductor.

19. The image according to claim 10, further comprising:
a wavelength conversion member on the light-emitting element.

20. An image display device comprising:
a plurality of transistors;
a first wiring layer electrically connected to the plurality of transistors;
a first insulating film covering the plurality of transistors and the first wiring layer;
a conductive layer located on the first insulating film, the conductive layer comprising a single-crystal metal;
a semiconductor layer located on the conductive layer and electrically connected to the conductive layer, the semiconductor layer including a bottom surface on the conductive layer, and a plurality of light-emitting surfaces at a side opposite to the bottom surface;
a second insulating film covering the first insulating film, the conductive layer, and a side surface of the semiconductor layer;
a second wiring layer located on the second insulating film; and
a via extending through the first and second insulating films, the via being located between the first wiring layer and the second wiring layer and electrically connecting the first wiring layer and the second wiring layer, wherein:
the semiconductor layer is electrically connected to the plurality of transistors via the first and second wiring layers.

21. The image according to claim 20, wherein:
the conductive layer comprises a second part comprising the single-crystal metal,
the semiconductor layer is located on the second part, and
an outer perimeter of the semiconductor layer is located within an outer perimeter of the second part when viewed in a plan view.

22. The image according to claim 20, further comprising:
a plug located between the conductive layer and the first wiring layer and connected to the first wiring layer, wherein:
the semiconductor layer is electrically connected to the first wiring layer via the conductive layer and the plug.

23. The image according to claim 20, wherein:
the semiconductor layer comprises:
    a first semiconductor layer of a first conductivity type,
    a light-emitting layer located on the first semiconductor layer, and
    a second semiconductor layer located on the light-emitting layer, the second semiconductor layer being of a second conductivity type different from the first conductivity type,
the first semiconductor layer, the light-emitting layer, and the second semiconductor layer are stacked in this order from the conductive layer toward the plurality of light-emitting surfaces,
the second semiconductor layer is separated into a plurality of portions by the second insulating film.

24. An image display device comprising:

a plurality of circuit elements;

a first wiring layer electrically connected to the plurality of circuit elements;

a first insulating film covering the plurality of circuit elements and the first wiring layer;

a conductive layer located on the first insulating film, the conductive layer comprising a single-crystal metal;

a plurality of light-emitting elements located on the conductive layer and electrically connected to the conductive layer, each of the plurality of light-emitting elements including a bottom surface on the conductive layer, and a light-emitting surface at a side opposite to the bottom surface;

a second insulating film covering the conductive layer, the first insulating film, and side surfaces of the plurality of light-emitting elements;

a second wiring layer located on the second insulating film; and a first via extending through the first and second insulating films, the first via being located between the first wiring layer and the second wiring layer and electrically connecting the first wiring layer and the second wiring layer, wherein:

the plurality of light-emitting elements are electrically connected respectively to the plurality of circuit elements via the first and second wiring layers.

\* \* \* \* \*